(12) United States Patent
Hoff

(10) Patent No.: US 11,238,193 B2
(45) Date of Patent: Feb. 1, 2022

(54) SYSTEM AND METHOD FOR PHOTOVOLTAIC SYSTEM CONFIGURATION SPECIFICATION INFERRENCE WITH THE AID OF A DIGITAL COMPUTER

(71) Applicant: Clean Power Research, L.L.C., Napa, CA (US)

(72) Inventor: Thomas E. Hoff, Napa, CA (US)

(73) Assignee: Clean Power Research, L.L.C., Napa, CA (US)

( * ) Notice: Subject to any disclaimer, the term of this patent is extended or adjusted under 35 U.S.C. 154(b) by 0 days.

(21) Appl. No.: 17/063,579

(22) Filed: Oct. 5, 2020

(65) Prior Publication Data

US 2021/0019458 A1    Jan. 21, 2021

Related U.S. Application Data

(63) Continuation of application No. 16/198,671, filed on Nov. 21, 2018, now Pat. No. 10,803,212, which is a
(Continued)

(51) Int. Cl.
*H02S 50/00* (2014.01)
*G01W 1/12* (2006.01)
(Continued)

(52) U.S. Cl.
CPC ............... *G06F 30/20* (2020.01); *G01J 1/42* (2013.01); *G01W 1/12* (2013.01); *H02S 50/00* (2013.01);
(Continued)

(58) Field of Classification Search
CPC .......... G01W 1/12; G01W 1/10; G06Q 10/04; G06Q 50/04; H02J 3/383; G06F 17/18; G06N 7/005
See application file for complete search history.

(56) References Cited

U.S. PATENT DOCUMENTS 3,923,038 A    12/1975  Cutchaw
4,089,143 A     5/1978  La Pietra
(Continued)

FOREIGN PATENT DOCUMENTS

CN    102155358 A  *  8/2011
JP      4799838 B2  * 10/2011
(Continued)

OTHER PUBLICATIONS

Brinkman et al., "Toward a Solar-Powered Grid." IEEE Power & Energy, vol. 9, No. 3, May/Jun. 2011.
(Continued)

*Primary Examiner* — Stephanie E Bloss
(74) *Attorney, Agent, or Firm* — Patrick J. S. Inouye; Leonid Kisselev

(57) ABSTRACT

A photovoltaic system's configuration specification can be inferred by an evaluative process that searches through a space of candidate values for the variables in the specification. Each variable is selected in a specific ordering that narrows the field of candidate values. A constant horizon is assumed to account for diffuse irradiance insensitive to specific obstruction locations relative to the photovoltaic system's geographic location. Initial values for the azimuth angle, constant horizon obstruction elevation angle, and tilt angle are determined, followed by final values for these variables. The effects of direct obstructions that block direct irradiance in the areas where the actual horizon and the range of sun path values overlap relative to the geographic location are evaluated to find the exact obstruction elevation angle over a range of azimuth bins or directions. The photovoltaic temperature response coefficient and the inverter rating or power curve of the photovoltaic system are determined.

20 Claims, 41 Drawing Sheets

Related U.S. Application Data continuation-in-part of application No. 15/588,550, filed on May 5, 2017, now Pat. No. 10,140,401, which is a continuation-in-part of application No. 14/223,926, filed on Mar. 24, 2014, now Pat. No. 9,740,803, which is a continuation of application No. 13/784,560, filed on Mar. 4, 2013, now Pat. No. 8,682,585, which is a continuation-in-part of application No. 13/462,505, filed on May 2, 2012, now Pat. No. 8,437,959, which is a continuation of application No. 13/453,956, filed on Apr. 23, 2012, now Pat. No. 8,335,649, which is a continuation of application No. 13/190,442, filed on Jul. 25, 2011, now Pat. No. 8,165,812.

(51) Int. Cl.
  *G06F 30/20*   (2020.01)
  *G01J 1/42*    (2006.01)
  *G06F 30/13*   (2020.01)

(52) U.S. Cl.
  CPC ....... *G01J 2001/4266* (2013.01); *G06F 30/13* (2020.01)

(56) References Cited

U.S. PATENT DOCUMENTS

| | | |
|---|---|---|
| 4,992,942 A | 2/1991 | Bauerle et al. |
| 5,001,650 A | 3/1991 | Francis et al. |
| 5,177,972 A | 1/1993 | Sillato et al. |
| 5,602,760 A | 2/1997 | Chacon et al. |
| 5,803,804 A | 9/1998 | Meier et al. |
| 6,134,511 A | 10/2000 | Subbarao |
| 6,148,623 A | 11/2000 | Park et al. |
| 6,366,889 B1 | 4/2002 | Zaloom |
| 6,748,327 B1 | 6/2004 | Watson |
| 7,451,017 B2 | 11/2008 | McNally |
| 7,742,897 B2 | 6/2010 | Herzig |
| 7,920,997 B2 | 4/2011 | Domijan et al. |
| 8,155,900 B1 | 4/2012 | Adams |
| 8,369,994 B1 | 2/2013 | Rosen |
| 9,007,460 B2 | 1/2015 | Schmidt et al. |
| 9,020,650 B2 | 4/2015 | Lutze |
| 9,086,585 B2 | 7/2015 | Hamada et al. |
| 9,098,876 B2 | 8/2015 | Steven et al. |
| 9,103,719 B1 | 8/2015 | Ho et al. |
| 9,171,276 B2 | 10/2015 | Steven et al. |
| 9,286,464 B2 | 3/2016 | Choi |
| 9,524,529 B2 | 12/2016 | Sons et al. |
| 10,140,401 B1* | 11/2018 | Hoff .................. H02S 50/00 |
| 10,797,639 B1* | 10/2020 | Hoff .................. H02S 50/00 |
| 2002/0055358 A1 | 5/2002 | Hebert |
| 2005/0055137 A1 | 3/2005 | Andren et al. |
| 2005/0222715 A1 | 10/2005 | Ruhnke et al. |
| 2007/0084502 A1* | 4/2007 | Kelly .................. G01S 3/7861 136/246 |
| 2007/0119718 A1 | 5/2007 | Gibson et al. |
| 2008/0258051 A1 | 10/2008 | Heredia et al. |
| 2009/0125275 A1 | 5/2009 | Woro |
| 2009/0154384 A1 | 6/2009 | Todd et al. |
| 2009/0217965 A1 | 9/2009 | Dougal et al. |
| 2009/0302681 A1 | 12/2009 | Yamada et al. |
| 2010/0161502 A1 | 6/2010 | Kumazawa et al. |
| 2010/0188413 A1 | 7/2010 | Hao et al. |
| 2010/0198420 A1 | 8/2010 | Rettger et al. |
| 2010/0211222 A1 | 8/2010 | Ghosn |
| 2010/0219983 A1 | 9/2010 | Peleg et al. |
| 2010/0309330 A1 | 12/2010 | Beck |
| 2011/0137591 A1 | 6/2011 | Ishibashi |
| 2011/0137763 A1 | 6/2011 | Aguilar |
| 2011/0272117 A1 | 11/2011 | Hamstra et al. |
| 2011/0276269 A1* | 11/2011 | Hummel .................. H02J 3/383 702/3 |
| 2011/0282504 A1 | 11/2011 | Besore et al. |
| 2011/0307109 A1 | 12/2011 | Sri-Jayantha |
| 2012/0078685 A1 | 3/2012 | Krebs et al. |
| 2012/0130556 A1 | 5/2012 | Marhoefer |
| 2012/0143383 A1 | 6/2012 | Cooperrider et al. |
| 2012/0158350 A1 | 6/2012 | Steinberg et al. |
| 2012/0191439 A1 | 7/2012 | Meagher et al. |
| 2012/0278051 A1 | 11/2012 | Jiang et al. |
| 2012/0310416 A1 | 12/2012 | Tepper et al. |
| 2012/0310427 A1 | 12/2012 | Williams et al. |
| 2012/0330626 A1 | 12/2012 | An et al. |
| 2013/0008224 A1 | 1/2013 | Stormbom |
| 2013/0030590 A1 | 1/2013 | Prosser |
| 2013/0054662 A1 | 2/2013 | Coimbra |
| 2013/0060471 A1 | 3/2013 | Aschheim et al. |
| 2013/0152998 A1 | 6/2013 | Herzig |
| 2013/0166266 A1 | 6/2013 | Herzig et al. |
| 2013/0204439 A1 | 8/2013 | Scelzi |
| 2013/0245847 A1 | 9/2013 | Steven et al. |
| 2013/0262049 A1 | 10/2013 | Zhang et al. |
| 2013/0268129 A1 | 10/2013 | Fadell et al. |
| 2013/0274937 A1 | 10/2013 | Ahn et al. |
| 2013/0289774 A1 | 10/2013 | Day et al. |
| 2013/0314699 A1 | 11/2013 | Jungerman et al. |
| 2014/0039709 A1 | 2/2014 | Steven et al. |
| 2014/0039965 A1 | 2/2014 | Steven et al. |
| 2014/0107851 A1 | 4/2014 | Yoon et al. |
| 2014/0129197 A1 | 5/2014 | Sons et al. |
| 2014/0142862 A1 | 5/2014 | Umeno et al. |
| 2014/0214222 A1 | 7/2014 | Rouse et al. |
| 2014/0222241 A1 | 8/2014 | Ols |
| 2014/0278108 A1* | 9/2014 | Kerrigan .................. G01W 1/10 702/3 |
| 2015/0019034 A1* | 1/2015 | Gonatas .................. H02S 40/38 700/291 |
| 2015/0057820 A1 | 2/2015 | Kefayati et al. |
| 2015/0088576 A1 | 3/2015 | Steven et al. |
| 2015/0094968 A1 | 4/2015 | Jia et al. |
| 2015/0112497 A1 | 4/2015 | Steven et al. |
| 2015/0134251 A1* | 5/2015 | Bixel .................. G01W 1/10 702/3 |
| 2015/0177415 A1 | 6/2015 | Bing |
| 2015/0188415 A1* | 7/2015 | Abido .................. H02J 1/04 307/103 |
| 2015/0269664 A1 | 9/2015 | Davidson |
| 2015/0278968 A1 | 10/2015 | Steven et al. |
| 2015/0323423 A1 | 11/2015 | Alsaleem |
| 2015/0326015 A1 | 11/2015 | Steven et al. |
| 2015/0330923 A1 | 11/2015 | Smullin |
| 2015/0332294 A1 | 11/2015 | Albert et al. |
| 2016/0049606 A1 | 2/2016 | Bartoli et al. |
| 2016/0140283 A1* | 5/2016 | Morse .................. G06F 30/20 716/135 |
| 2016/0187911 A1 | 6/2016 | Carty et al. |
| 2016/0226253 A1* | 8/2016 | Abido .................. H02J 3/381 |
| 2016/0266594 A1 | 9/2016 | Kauffman et al. |
| 2016/0306906 A1 | 10/2016 | McBrearty et al. |
| 2016/0348936 A1 | 12/2016 | Johnson et al. |
| 2017/0104451 A1 | 4/2017 | Gostein |
| 2018/0010818 A1 | 1/2018 | Maruyama et al. |

FOREIGN PATENT DOCUMENTS

| | | |
|---|---|---|
| WO | 2007124059 | 1/2007 |
| WO | 2007142693 | 12/2007 |
| WO | 2013181408 | 12/2013 |
| WO | 2014081967 | 5/2014 |

OTHER PUBLICATIONS

California ISO. Summary of Preliminary Results of 33% Renewable Integration Study—2010 CPUC LTPP. Docket No. R. 10-05-006, May 10, 2011.

Ellis et al., "Model Makers." IEEE Power & Energy, vol. 9, No. 3, May/Jun. 2011.

(56) References Cited

OTHER PUBLICATIONS

Danny H.W. Li et al., "Analysis of solar heat gain factors using sky clearness index and energy implications." Energy Conversions and Management, Aug. 2000.
Hoff et al., "Quantifying PV Power Output Variability." Solar Energy 84 (2010) 1782-1793, Oct. 2010.
Hoff et al., "PV Power Output Variability: Calculation of Correlation Coefficients Using Satellite Insolation Data." American Solar Energy Society Annual Conference Proceedings, Raleigh, NC, May 18, 2011.
Kuszamaul et al., "Lanai High-Density Irradiance Sensor Network for Characterizing Solar Resource Variability of MW-Scale PV System." 35th Photovoltaic Specialists Conference, Honolulu, HI. Jun. 20-25, 2010.
Serban C. "Estimating Clear Sky Solar Global Radiation Using Clearness Index, for Brasov Urban Area". Proceedings of the 3rd International Conference on Maritime and Naval Science and Engineering. ISSN: 1792-4707, ISBN: 978-960-474-222-6.
Mills et al., "Dark Shadows." IEEE Power & Energy, vol. 9, No. 3, May/Jun. 2011.
Mills et al., "Implications of Wide-Area Geographic Diversity for Sort-Term Variability of Solar Power." Lawrence Berkeley National Laboratory Technical Report LBNL-3884E. Sep. 2010.
Perez et al., "Parameterization of site-specific short-term irradiance variability." Solar Energy, 85 (2011) 1343-1345, Nov. 2010.
Perez et al., "Short-term irradiance variability correlation as a function of distance." Solar Energy, Mar. 2011.
Philip, J., "The Probability Distribution of the Distance Between Two Random Points in a Box." www.math.kth.se/~johanph/habc.pdf. Dec. 2007.
Stein, J., "Simulation of 1-Minute Power Output from Utility-Scale Photovoltaic Generation Systems." American Solar Energy Society Annual Conference Proceedings, Raleigh, NC, May 18, 2011.
Solar Anywhere, 2011. Web-Based Service that Provides Hourly, Satellite-Derived Solar Irradiance Data Forecasted 7 days Ahead and Archival Data back to Jan. 1, 1998. www SolarAnywhere.com.
Stokes et al., "The atmospheric radiance measurement (ARM) program: programmatic background and design of the cloud and radiation test bed." Bulletin of American Meteorological Society vol. 75, No. 7, pp. 1201-1221, Jul. 1994.
Hoff et al., "Modeling PV Fleet Output Variability," Solar Energy, May 2010.
Olopade et al., "Solar Radiation Characteristics and the performance of Photovoltaic (PV) Modules in a Tropical Station." Journal Sci. Res. Dev. vol. 11, 100-109, 2008/2009.
Li et al., "Analysis of solar heat gain factors using sky clearness index and energy implications." 2000.
Shahab Poshtkouhi et al., "A General Approach for Quantifying the Benefit of Distributed Power Electronics for Fine Grained MPPT in Photovoltaic Applications Using 3-D Modeling," Nov. 20, 2012, IEE Transactions on Poweer Electronics, vol. 27, No. 11, p. 4656-4666, 2012.
Pathomthat Chiradeja et al., "An Approaching to Quantify the Technical Benefits of Distributed Generation," Dec. 2004, IEEE Transactions on Energy Conversation, vol. 19, No. 4, p. 764-773, 2004.
Mudathir Funsho Akorede et al., "Distributed Energy Resources and Benefits to the Environment," 2010, Renewable and Sustainable Energy Reviews 14, p. 724-734.
V.H. Mendez, et al., "Impact of Distributed Generation on Distribution Investment Deferral," Electrical Power and Energy Systems 28, p. 244-252, 2006.
Francisco M. Gonzalez-Longatt et al., "Impact of Distributed Generation Over Power Losses on Distribution System," Oct. 2007, Electrical Power Quality and Utilization, 9th International Conference.
M. Begovic et al., "Impact of Renewable Distributed Generation on Power Systems," 2001, Proceedings of the 34th Hawaii International Conference on System Sciences, p. 1-10.
M. Thomson et al., "Impact of Widespread Photovoltaics Generation on Distribution Systems," Mar. 2007, IET Renew. Power Gener., vol. 1, No. 1 p. 33-40.
Varun et al., "LCA of Renewable Energy for Electricity Generation Systems—A Review," 2009, Renewable and Sustainable Energy Reviews 13, p. 1067-1073.
Andreas Schroeder, "Modeling Storage and Demand Management in Power Distribution Grids," 2011, Applied Energy 88, p. 4700-4712.
Daniel S. Shugar, "Photovoltaics in the Utility Distribution System: The Evaluation of System and Distributed Benefits," 1990, Pacific Gas and Electric Company Department of Research and Development, p. 836-843.
Nguyen et al., "Estimating Potential Photovoltaic Yield With r.sun and the Open Source Geographical Resources Analysis Support System," Mar. 17, 2010, pp. 831-843.
Pless et al., "Procedure For Measuring and Reporting The Performance of Photovoltaic Systems in Buildings," 62 pages, Oct. 2005.
Emery et al., "Solar Cell Efficiency Measurements," Solar Cells, 17 (1986) 253-274.
Santamouris, "Energy Performance of Residential Buildings," James & James/Earchscan, Sterling, VA 2005.
Al-Homoud, "Computer-Aided Building Energy Analysis Techniques," Building & Environment 36 (2001) pp. 421-433.
Thomas Huld, "Estimating Solar Radiation and Photovoltaic System Performance," The PVGIS Approach, 2011 (printed Dec. 13, 2017).
Anderson et al., "Modelling The Heat Dynamics of a Building Using Stochastic Differential Equations," Energy and Building, vol. 31, 2000, pp. 13-24.
J. Kleissl & Y. Agarwal, "Cyber-Physical Energy Systems: Focus on Smart Buildings," Design Automation Conference, Anaheim, CA, 2010, pp. 749-754, doi: 10.1145/1837274.1837464. (2010).

* cited by examiner

Napa, CA

Combine with Fleet Configuration

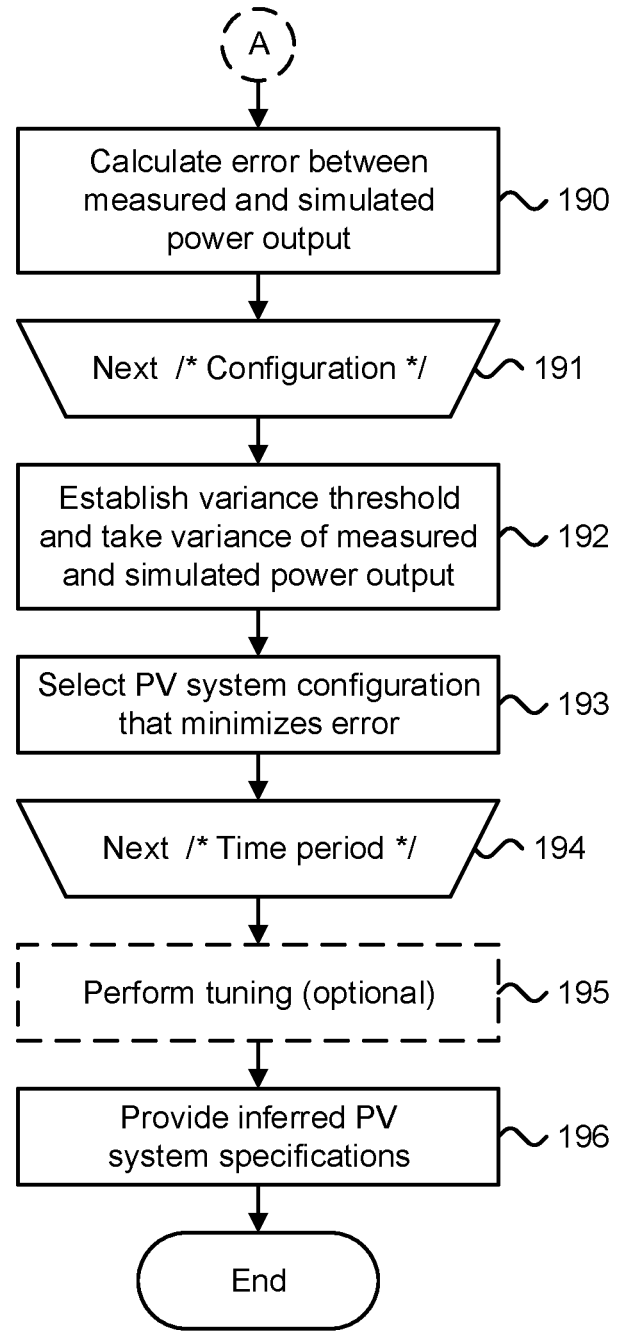
Fig. 19 (con'd).

220

Actual Obstructions

221

Step 1:
Create Constant Horizon

222

Step 2:
Modify Direct Obstructions

Sky View Factor Parameters.

Order of steps to assess obstruction elevation angles.

Fig. 25. Optimal azimuth, constant horizon, and tilt angles.

Fig. 26. Obstruction elevation angles by azimuth direction and optimized profile.

Fig. 27. Hourly simulated vs. measured data for full year.

Fig. 29. Hourly simulated vs. measured data for sample day (October 9, 2015).
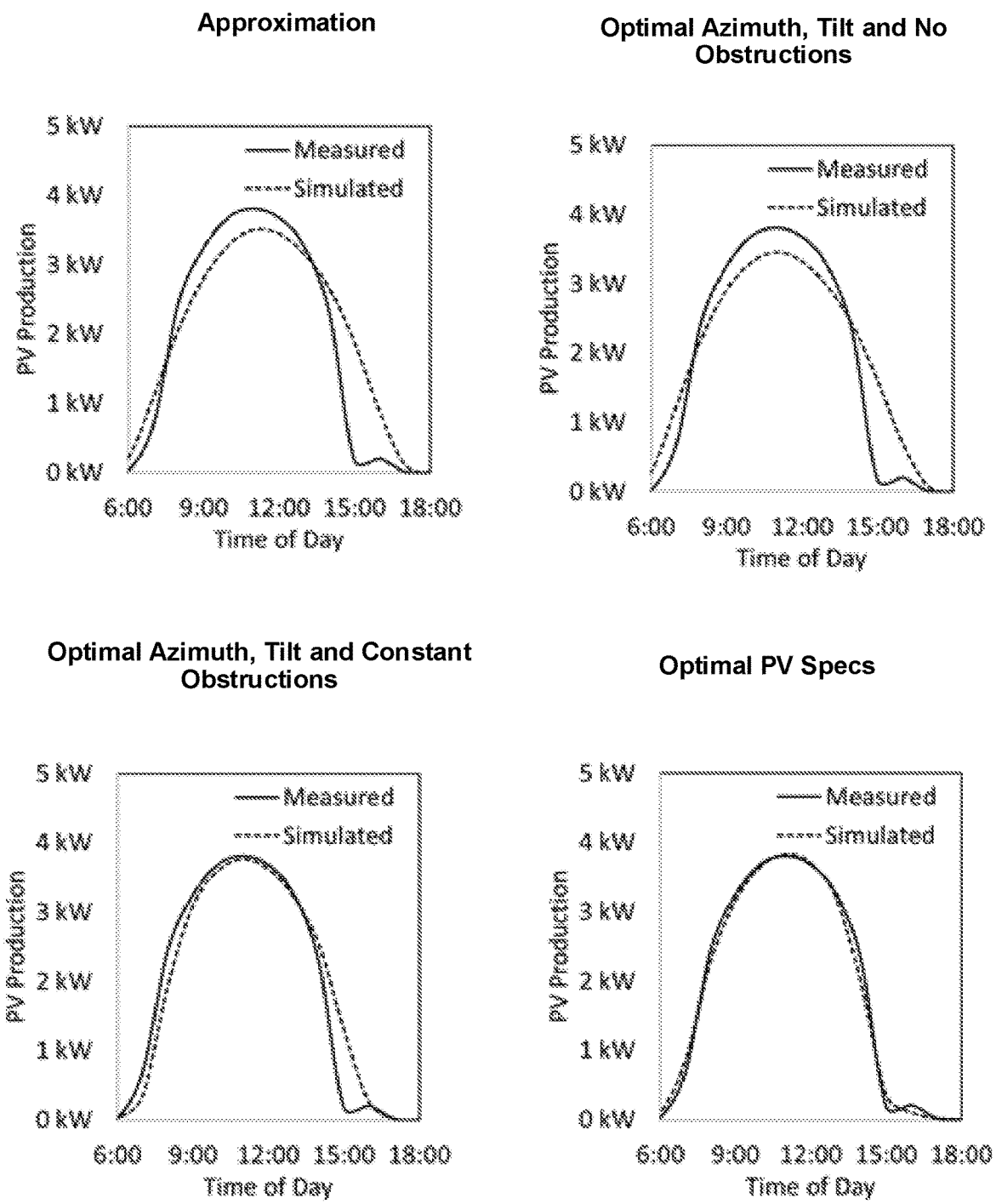

Fig. 30. Daily results for optimal PV specs.
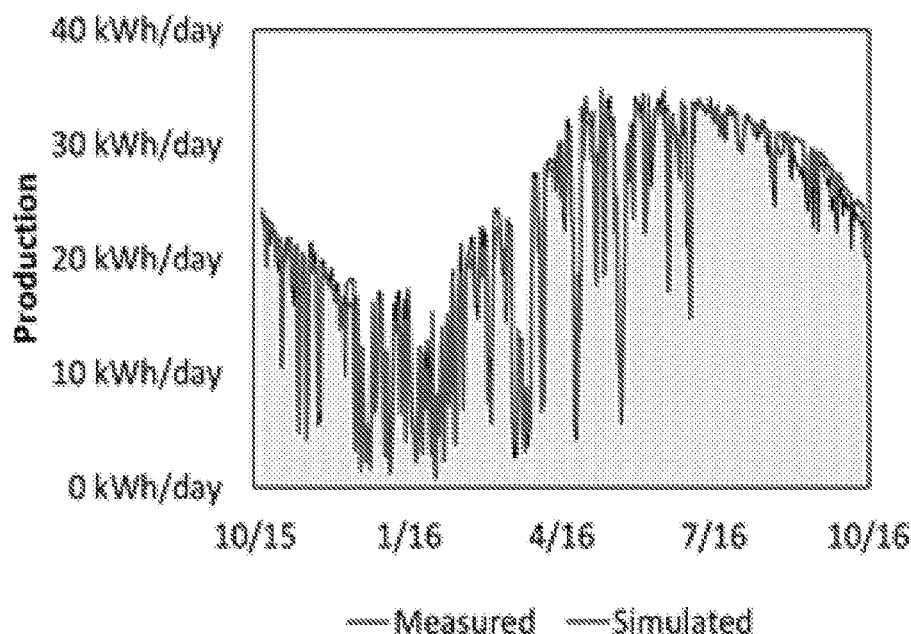
Fig. 31. Impact of changing constant horizon on annual energy production.
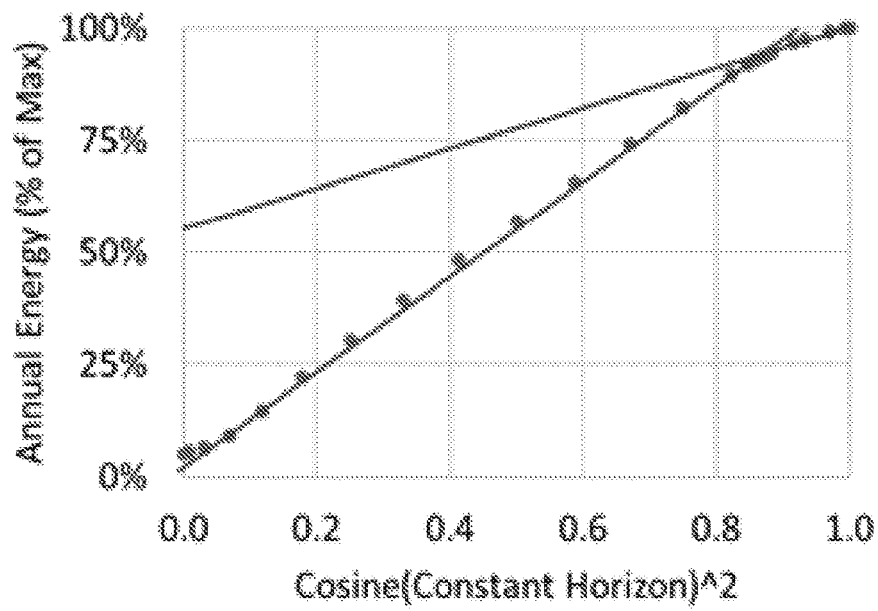

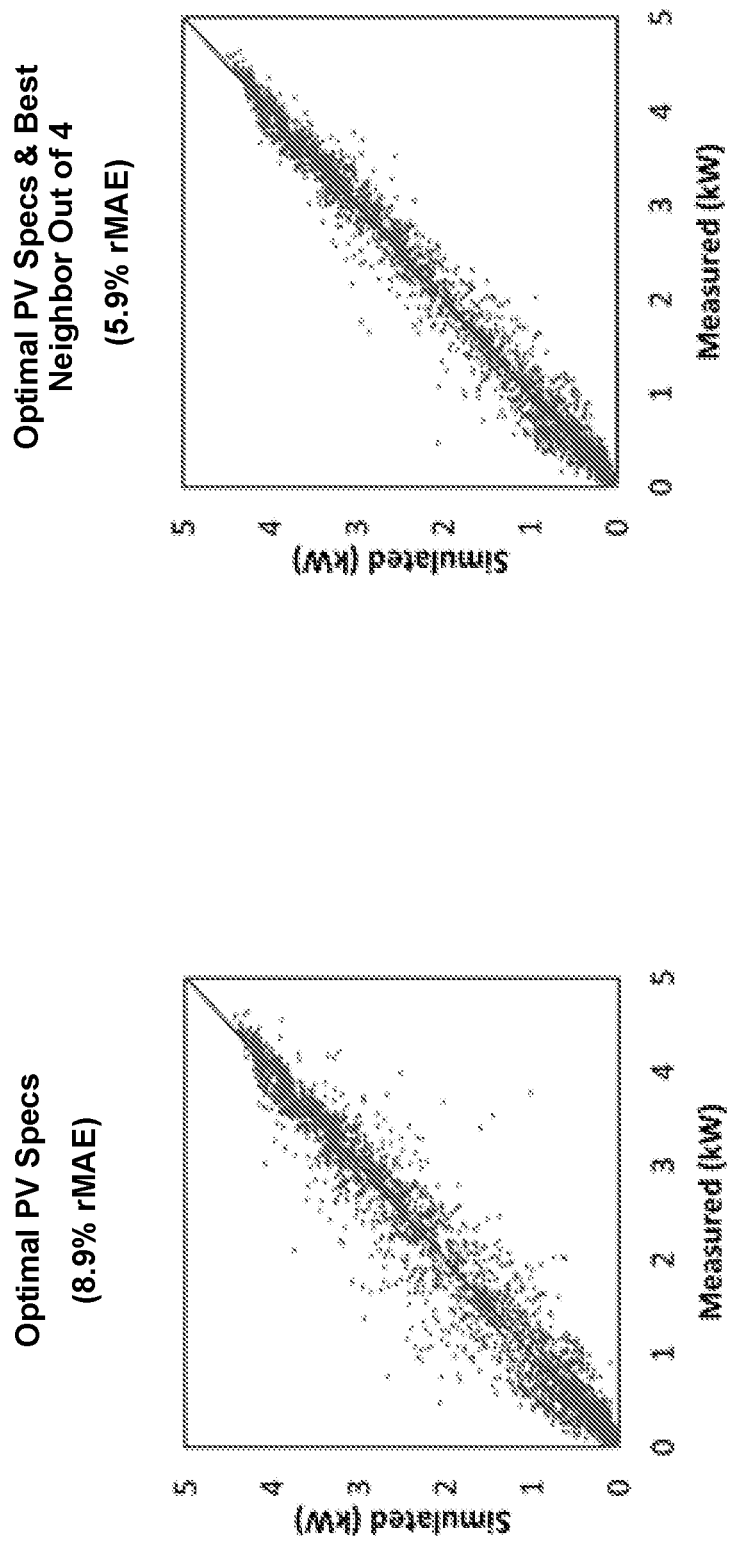
Fig. 32. Potential for machine learning.

Fig. 34.

| Type | Fixed | Fixed | Fixed | Fixed | Fixed | Fixed | Fixed | Fixed | 1-Axis | 1-Axis | 1-Axis | 1-Axis |
|---|---|---|---|---|---|---|---|---|---|---|---|---|
| Azimuth | 180 | 180 | 180 | 180 | 180 | 180 | 180 | 180 | 180 | 180 | 180 | 180 |
| Tilt | 0 | 5 | 10 | 15 | 20 | 25 | 30 | 35 | 0 | 5 | 10 | 15 |
| 1/1/2012 6:00 | 0.00 | 0.00 | 0.00 | 0.00 | 0.00 | 0.00 | 0.00 | 0.00 | 0.00 | 0.00 | 0.00 | 0.00 |
| 1/1/2012 6:30 | 0.00 | 0.00 | 0.00 | 0.00 | 0.00 | 0.00 | 0.00 | 0.00 | 0.00 | 0.00 | 0.00 | 0.00 |
| 1/1/2012 7:00 | 0.00 | 0.00 | 0.00 | 0.00 | 0.00 | 0.00 | 0.00 | 0.00 | 0.00 | 0.00 | 0.00 | 0.00 |
| 1/1/2012 7:30 | 0.08 | 0.10 | 0.12 | 0.14 | 0.15 | 0.17 | 0.18 | 0.19 | 0.31 | 0.31 | 0.32 | 0.32 |
| 1/1/2012 8:00 | 0.18 | 0.22 | 0.25 | 0.28 | 0.31 | 0.34 | 0.37 | 0.39 | 0.53 | 0.54 | 0.55 | 0.56 |
| 1/1/2012 8:30 | 0.27 | 0.32 | 0.36 | 0.40 | 0.44 | 0.48 | 0.51 | 0.54 | 0.60 | 0.62 | 0.64 | 0.66 |
| 1/1/2012 9:00 | 0.36 | 0.41 | 0.46 | 0.51 | 0.56 | 0.60 | 0.63 | 0.66 | 0.63 | 0.66 | 0.69 | 0.72 |
| 1/1/2012 9:30 | 0.40 | 0.45 | 0.50 | 0.54 | 0.58 | 0.62 | 0.65 | 0.68 | 0.57 | 0.60 | 0.63 | 0.67 |
| 1/1/2012 10:00 | 0.49 | 0.56 | 0.62 | 0.68 | 0.73 | 0.77 | 0.81 | 0.84 | 0.63 | 0.67 | 0.72 | 0.77 |
| 1/1/2012 10:30 | 0.50 | 0.57 | 0.63 | 0.68 | 0.73 | 0.77 | 0.81 | 0.84 | 0.57 | 0.62 | 0.67 | 0.72 |
| 1/1/2012 11:00 | 0.54 | 0.60 | 0.67 | 0.72 | 0.77 | 0.81 | 0.85 | 0.88 | 0.56 | 0.62 | 0.68 | 0.73 |
| 1/1/2012 11:30 | 0.57 | 0.64 | 0.70 | 0.76 | 0.81 | 0.85 | 0.89 | 0.93 | 0.57 | 0.64 | 0.70 | 0.76 |
| 1/1/2012 12:00 | ⋮ | ⋮ | ⋮ | ⋮ | ⋮ | ⋮ | ⋮ | ⋮ | ⋮ | ⋮ | ⋮ | ⋮ |

Fig. 35.
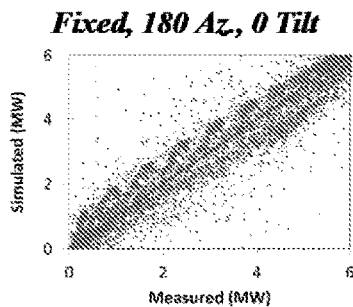
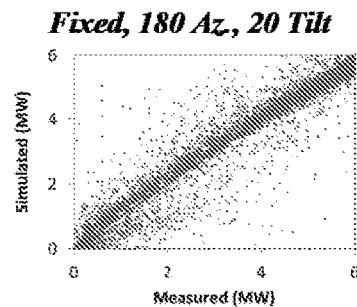
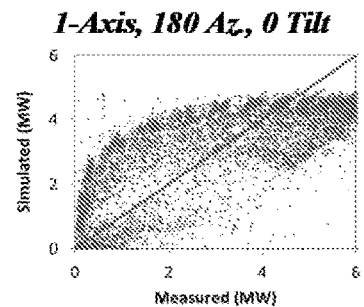
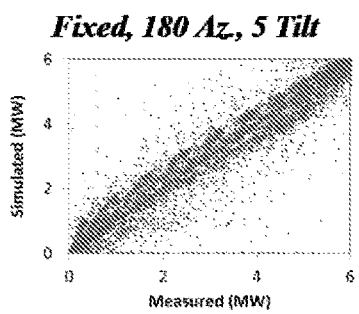
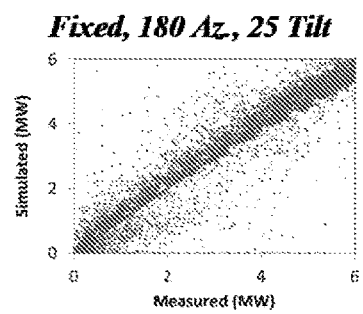
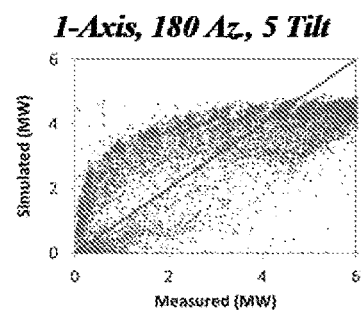
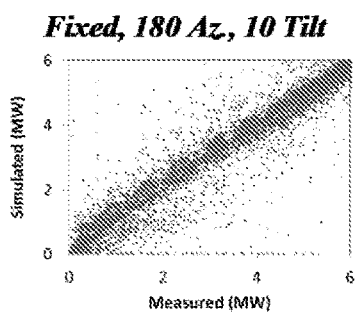
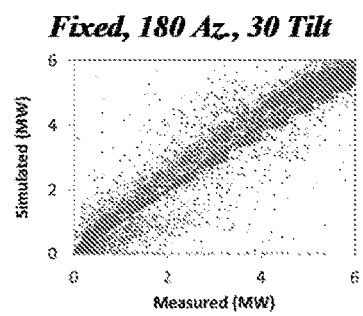
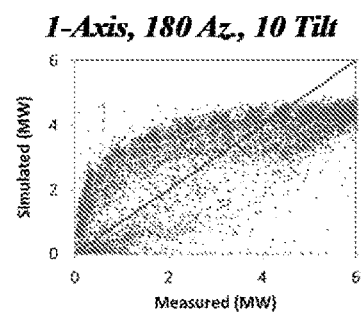
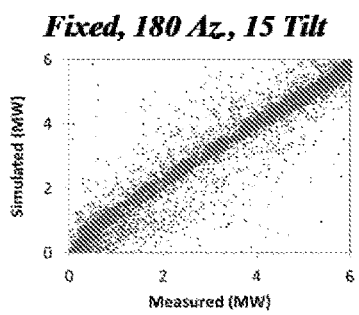
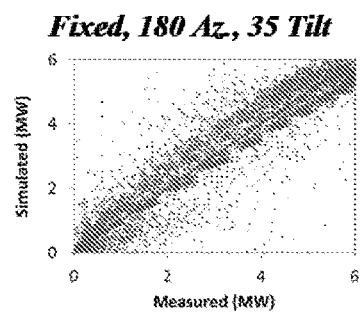
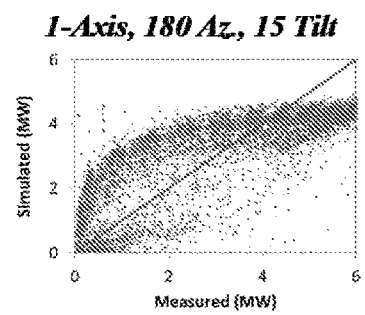

SYSTEM AND METHOD FOR PHOTOVOLTAIC SYSTEM CONFIGURATION SPECIFICATION INFERRENCE WITH THE AID OF A DIGITAL COMPUTER

CROSS-REFERENCE TO RELATED APPLICATION

This patent application is a continuation of U.S. patent application Ser. No. 16/198,671, filed Nov. 21, 2018, pending; which is a continuation of U.S. Pat. No. 10,140,401, issued Nov. 27, 2018; which is a continuation-in-part of U.S. Pat. No. 9,740,803, issued Aug. 22, 2017; which is a continuation of U.S. Pat. No. 8,682,585, issued Mar. 25, 2014; which is a continuation-in-part of U.S. Pat. No. 8,437,959, issued May 7, 2013; which is a continuation of U.S. Pat. No. 8,335,649, issued Dec. 18, 2012; which is a continuation of U.S. Pat. No. 8,165,812, issued Apr. 24, 2012, the priority dates of which are claimed and the disclosures of which are incorporated by reference.

FIELD

This application relates in general to photovoltaic power generation fleet planning and operation and, in particular, to a system and method for photovoltaic system configuration specification inference with the aid of a digital computer with the aid of a digital computer.

BACKGROUND

Photovoltaic (PV) systems are widely used as standalone off-grid power systems, as sources of supplemental electricity, such as for use in a building or house, and in power grid-connected systems. A power grid is an electricity generation, transmission, and distribution infrastructure that delivers electricity from suppliers to consumers. Typically, when integrated into a power grid, photovoltaic systems are collectively operated as a photovoltaic fleet. As electricity is consumed almost immediately upon production, planners and operators of power grids need to be able to accurately gauge both on-going and forecasted power generation and consumption.

Photovoltaic fleets participating in a power grid are expected to exhibit predictable power generation behaviors, and production data is needed at all levels of the power grid. Accurate production data is particularly crucial when a photovoltaic fleet makes a significant contribution to a power grid's overall energy mix. Photovoltaic production forecasting involves obtaining a prediction of solar irradiance (or measured solar irradiance, where production is being simulated) that is combined with ambient temperature data and each photovoltaic plant's system specification in a simulation model, which then generates a forecast of individual plant energy output production. The individual photovoltaic plant forecasts can then be combined into a photovoltaic fleet energy forecast, such as described in commonly-assigned U.S. Pat. Nos. 8,165,811; 8,165,812; 8,165,813, all issued to Hoff on Apr. 24, 2012; U.S. Pat. Nos. 8,326,535; 8,326,536, issued to Hoff on Dec. 4, 2012; and U.S. Pat. No. 8,335,649, issued to Hoff on Dec. 18, 2012, the disclosures of which are incorporated by reference.

A grid-connected photovoltaic fleet can be operationally dispersed or concentrated in one site. The aggregate contribution of a photovoltaic fleet to a power grid can be determined as a function of the individual photovoltaic system contributions. Photovoltaic system specifications are crucial to forecasting plant power output and include geographic location, PV rating, inverter rating, tilt angle, azimuth angle, other losses, obstruction profile (elevation angles in multiple azimuth directions), and other factors.

Inaccuracies in system specifications can adversely affect forecasting. Accepting user-supplied system specifications has the advantage of simplicity, albeit at the risk of being inaccurate. Alternatively, system specifications can be inferred from measured photovoltaic production data, which is often available. For instance, in utility-scale operations, photovoltaic plant owners instrument plant components for grid operations and market settlement. Similarly, third party photovoltaic leasing companies, who are responsible for maintaining their leased systems, outfit the systems with recording and telemetry systems to report production data. The production data is also evaluated to determine when maintenance is needed; personnel are typically dispatched upon a significant divergence between measured and simulated performance data. Finally, photovoltaic systems often have a guaranteed production level. Performance monitoring systems collect measured performance data to substantiate guaranteed production claims by comparing simulation results over a long period.

Inferred system specifications from measured photovoltaic production data can be daunting, particularly from a computational volume perspective in which the number of possible combinations of system specification parameters is not limited. Consider a simple example. Suppose that the goal is to infer all photovoltaic system specifications within 1°, where no orientation information is known about the photovoltaic system, and to model obstructions as opaque features in seven different 30° azimuthal bins, that is, 75° to 105°, 105° to 135°, . . . , 255° to 285°). A brute force approach requires testing all possible combinations in a combinatorics search space. Azimut may be between 90° and 270° (180 possibilities). Tilt angle may be between 0° and 90° (90 possibilities). The obstruction's elevation angle for each azimuth bin may be between 0° and 50° (50 possibilities). These parameters are representative of most kinds of obstructions. By combining these parameters together, the brute force approach would require simulations for 12 quadrillion candidate systems, which does not even include variations in inverter size, loss factor, and other parameters. The complexity of the photovoltaic simulations required in determining system specifications further compounds the issue because these simulations can be computationally costly.

Photovoltaic system output is particularly sensitive to shading due to cloud cover. A photovoltaic array with only a small portion covered in shade can suffer a dramatic decrease in power output. For a single photovoltaic system, power capacity is measured by the maximum power output determined under standard test conditions and is expressed in units of Watt peak (Wp). The actual power could vary from the rated system power capacity depending upon geographic location, time of day, weather conditions, and other factors. Moreover, photovoltaic fleets scattered over a large area are subject to different location-specific cloud conditions with a consequential effect on aggregate power output.

Consequently, photovoltaic fleets operating under cloudy conditions can exhibit variable and unpredictable performance. Conventionally, fleet variability is determined by centrally collecting direct power measurements from individual systems or equivalent indirectly-derived power measurements. To be of optimal usefulness, the direct power measurement data must be collected in near-real time at fine-grained time intervals to generate high resolution power output time series. The practicality of this approach diminishes as the number of systems, variations in system specifications, and geographic dispersion grow. Moreover, the costs and feasibility of providing remote power measurement data can make high speed data collection and analysis insurmountable due to the transmission bandwidth and storage space needed coupled with the processing resources required to scale quantitative power measurement analysis upwards as fleet size grows.

For instance, one direct approach to obtaining high speed time series power production data from a fleet of existing photovoltaic systems is to install physical meters on every system, record the electrical power output at a desired time interval, such as every 10 seconds, and sum the recorded output across all systems in the fleet. The totalized power data could then be used to calculate the time-averaged fleet power, variance, and similar values for the rate of change of fleet power. An equivalent direct approach for a future photovoltaic fleet or an existing photovoltaic fleet with incomplete metering and telemetry is to collect solar irradiance data from a dense network of weather monitoring stations covering all anticipated locations of interest at the desired time interval, use a photovoltaic performance model to simulate the high speed time series output data for each system individually, and sum the results at each time interval.

With either direct approach to obtaining high speed time series power production data, several difficulties arise. First, in terms of physical plant, calibrating, installing, operating, and maintaining meters and weather stations is expensive and detracts from cost savings otherwise afforded through a renewable energy source. Similarly, collecting, validating, transmitting, and storing high speed data for every photovoltaic system or location requires collateral data communications and processing infrastructure at significant expense. Moreover, data loss occurs whenever instrumentation or data communications fail.

Second, in terms of inherent limitations, both direct approaches only work for times, locations, and photovoltaic system configurations when and where meters are pre-installed. Both direct approaches also cannot be used to directly forecast future system performance since meters must be physically present at the time and location of interest. Also, data must be recorded at the time resolution that corresponds to the desired output time resolution. While low time-resolution results can be calculated from high resolution data, the opposite calculation is not possible. For example, photovoltaic fleet behavior with a 10-second resolution cannot be determined from data collected with a 15-minute resolution.

The few solar data networks that exist in the United States, such as the ARM network, described in G. M. Stokes et al., "The atmospheric radiation measurement (ARM) program: programmatic background and design of the cloud and radiation test bed," Bulletin of Am. Meteor. Soc., Vol. 75, pp. 1201-1221 (1994), the disclosure of which is incorporated by reference, and the SURFRAD network, do not have high density networks (the closest pair of stations in the ARM network are 50 km apart) nor have they been collecting data at a fast rate (the fastest rate is 20 seconds in the ARM network and one minute in the SURFRAD network). The limitations of the direct measurement approaches have prompted researchers to evaluate other alternatives. Researchers have installed dense networks of solar monitoring devices in a few limited locations, such as described in S. Kuszamaul et al., "Lanai High-Density Irradiance Sensor Network for Characterizing Solar Resource Variability of MW-Scale PV System." $35^{th}$ Photovoltaic Specialists Conf., Honolulu, Hi. (Jun. 20-25, 2010), and R. George, "Estimating Ramp Rates for Large PV Systems Using a Dense Array of Measured Solar Radiation Data," Am. Solar Energy Society Annual Conf. Procs., Raleigh, N.C. (May 18, 2011), the disclosures of which are incorporated by reference. As data are being collected, the researchers examine the data to determine if there are underlying models that can translate results from these devices to photovoltaic fleet production at a much broader area, yet fail to provide translation of the data. In addition, half-hour or hourly satellite irradiance data for specific locations and time periods of interest have been combined with randomly selected high speed data from a limited number of ground-based weather stations, such as described in CAISO 2011. "Summary of Preliminary Results of 33% Renewable Integration Study—2010," Cal. Public Util. Comm. LTPP No. R.10-05-006 (Apr. 29, 2011) and J. Stein, "Simulation of 1-Minute Power Output from Utility-Scale Photovoltaic Generation Systems," Am. Solar Energy Society Annual Conf. Procs., Raleigh, N.C. (May 18, 2011), the disclosures of which are incorporated by reference. This approach, however, does not produce time synchronized photovoltaic fleet variability for any particular time period because the locations of the ground-based weather stations differ from the actual locations of the fleet. While such results may be useful as input data to photovoltaic simulation models for purpose of performing high penetration photovoltaic studies, they are not designed to produce data that could be used in grid operational tools.

Similarly, accurate photovoltaic system specifications are as important to photovoltaic power output forecasting as obtaining a reliable solar irradiance forecasts. Specifications provided by the owner or operator can vary in terms of completeness, quality and correctness, which can skew power output forecasting. Moreover, in some situations, system specifications may simply not be available, as can happen with privately-owned systems. Residential systems, for example, are typically not controlled or accessible by power grid operators and other personnel who need to understand and gauge expected photovoltaic power output capabilities and shortcomings and even large utility-connected systems may have specifications that are not publicly available due to privacy or security reasons.

Therefore, a need remains for an approach to determining photovoltaic system configuration specifications, even when configuration data is incomplete or unavailable, and as few times as possible during the searching process, for use in forecasting photovoltaic energy production output.

SUMMARY

The operational specifications of a photovoltaic plant configuration can be inferred through evaluation of historical measured system production data and measured solar resource data. Preferably, the solar resource data includes both historical and forecast irradiance values. Based upon the location of the photovoltaic plant under consideration, a time-series power generation data set is simulated based on a normalized and preferably linearly-scalable solar power simulation model. The simulation is run for a wide range of hypothetical photovoltaic system configurations. A power rating is derived for each system configuration by comparison of the measured versus simulated production data, which is applied to scale up the simulated time-series data.

The simulated energy production is statistically compared to actual historical data, and the system configuration reflecting the lowest overall error is identified as the inferred (and "optimal") system configuration.

In a further embodiment, a photovoltaic system's configuration specification can be inferred by an evaluative process that searches through a space of candidate values for each of the variables in the specification. Each variable is selected in a specific ordering that narrows the field of candidate values. A constant horizon is assumed to account for diffuse irradiance insensitive to specific obstruction locations relative to the photovoltaic system's geographic location. Initial values for the azimuth angle, constant horizon obstruction elevation angle, and tilt angle are determined, followed by final values for these three variables. The effects of direct obstructions that block direct irradiance in the areas where the actual horizon and the range of sun path values overlap relative to the system's geographic location are next evaluated to find the exact obstruction elevation angle over a range of azimuth bins or directions. The photovoltaic temperature response coefficient and the inverter rating or power curve of the photovoltaic system are then determined.

One embodiment provides a system and method for photovoltaic system configuration specification inference with the aid of a digital computer. Measured photovoltaic production for a photovoltaic system operating at a known geographic location over a set time period is obtained by a computer that includes a processor. A preexisting configuration for the photovoltaic system is obtained by the computer. A search is conducted by the computer for optimal values for a plurality of variables in a configuration specification for the photovoltaic system, including: determining the optimal values comprising initial optimal values for the variables including an azimuth angle, constant horizon obstruction elevation angle, and tilt angle based on the measured photovoltaic production; determining by the optimal values comprising final optimal values for the azimuth angle, constant horizon obstruction elevation angle, and tilt angle by using the initial optimal values for the azimuth angle, constant horizon obstruction elevation angle, and tilt angle. The preexisting configuration used by a production output controller for the photovoltaic system is modified by the computer with at least some of the optimal values for the variables in the configuration specification. The photovoltaic system is operated based on the modified preexisting configuration via the production output controller.

A further embodiment provides a system for simulating photovoltaic production with an assumed constant horizon with the aid of a digital computer. The system includes a computer including a processor and configured to: obtain a time series of measured irradiance for a photovoltaic system comprised in a power grid and operating at a known geographic location over a set time period, the power grid further comprising a plurality of power generators other than the photovoltaic system, a transmission infrastructure, and a power distribution infrastructure for distributing power from the photovoltaic system and the power generators to consumers; obtain by the computer a time series of ambient temperature measured for the geographic location over the same set time period; assume by the computer a constant horizon to account for diffuse irradiance insensitive to specific obstruction locations relative to the photovoltaic system's geographic location; adjust by the computer the measured irradiance time series based upon the constant horizon; and simulate by the computer photovoltaic production based on the adjusted measured irradiance time series, time series of ambient temperature, and configuration specification of the photovoltaic system, wherein an amount of the power requested from one or more of the power generators and distributed from the one or more power generators using the transmission infrastructure and the distribution infrastructure to one or more of the consumers is based on the simulated photovoltaic production.

Some of the notable elements of this methodology non-exclusively include:

(1) Employing a fully derived statistical approach to generating high-speed photovoltaic fleet production data;

(2) Using a small sample of input data sources as diverse as ground-based weather stations, existing photovoltaic systems, or solar data calculated from satellite images;

(3) Producing results that are usable for any photovoltaic fleet configuration;

(4) Supporting any time resolution, even those time resolutions faster than the input data collection rate;

(5) Providing results in a form that is useful and usable by electric power grid planning and operation tools; and (6) Inferring photovoltaic plant configuration specifications, which can be used to correct, replace or, if configuration data is unavailable, stand-in for the plant's specifications.

Still other embodiments will become readily apparent to those skilled in the art from the following detailed description, wherein are described embodiments by way of illustrating the best mode contemplated. As will be realized, other and different embodiments are possible and the embodiments' several details are capable of modifications in various obvious respects, all without departing from their spirit and the scope. Accordingly, the drawings and detailed description are to be regarded as illustrative in nature and not as restrictive.

BRIEF DESCRIPTION OF THE DRAWINGS

FIG. 29 is a set of graphs showing, by way of examples, hourly photovoltaic simulation production versus measured photovoltaic production for the entire year for a sample day.

FIG. 30 is a graph showing, by way of example, daily results for the scenario based on optimal photovoltaic system configuration specifications.

FIG. 31 is a graph showing, by way of example, the effect of changing the constant horizon on annual energy production (relative to a system with no obstructions) for a horizontal system.

FIG. 32 is a pair of graphs respectively showing, by way of examples, optimal photovoltaic system configuration specifications based on simulations using data for different geographic tiles.

FIG. 34 is a table showing, by way of example, simulated half-hour photovoltaic energy production for a 1 kW-AC photovoltaic system.

FIG. 35 are graphs depicting, by way of example, simulated versus measured power output for hypothetical photovoltaic system configuration specifications evaluated using the method of FIG. 19.

DETAILED DESCRIPTION

Photovoltaic cells employ semiconductors exhibiting a photovoltaic effect to generate direct current electricity through conversion of solar irradiance. Within each photovoltaic cell, light photons excite electrons in the semiconductors to create a higher state of energy, which acts as a charge carrier for the electrical current. The direct current electricity is converted by power inverters into alternating current electricity, which is then output for use in a power grid or other destination consumer. A photovoltaic system uses one or more photovoltaic panels that are linked into an array to convert sunlight into electricity. A single photovoltaic plant can include one or more of these photovoltaic arrays. In turn, a collection of photovoltaic plants can be collectively operated as a photovoltaic fleet that is integrated into a power grid, although the constituent photovoltaic plants within the fleet may actually be deployed at different physical locations spread out over a geographic region.

To aid with the planning and operation of photovoltaic fleets, whether at the power grid, supplemental, or stand-alone power generation levels, accurate photovoltaic system configuration specifications are needed to efficiently estimate individual photovoltaic power plant production. Photovoltaic system configurations can be inferred, even in the absence of presumed configuration specifications, by evaluation of measured historical photovoltaic system production data and measured historical resource data.

BRIEF DESCRIPTION OF THE DRAWINGS

Figure 1:
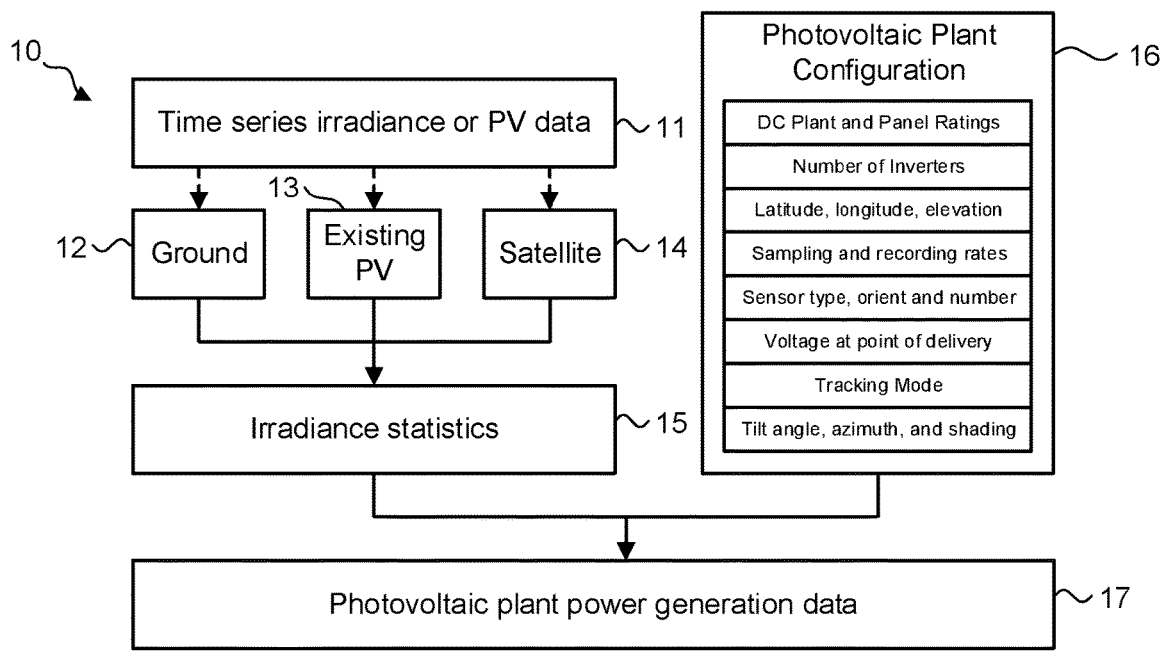
FIG. 1 is a flow diagram showing a computer-implemented method for generating a probabilistic forecast of photovoltaic fleet power generation in accordance with one embodiment.

FIG. 1 is a flow diagram showing a computer-implemented method 10 for generating a probabilistic forecast of photovoltaic fleet power generation in accordance with one embodiment. The method 10 can be implemented in software and execution of the software can be performed on a computer system, such as further described infra, as a series of process or method modules or steps.

Figure 3:
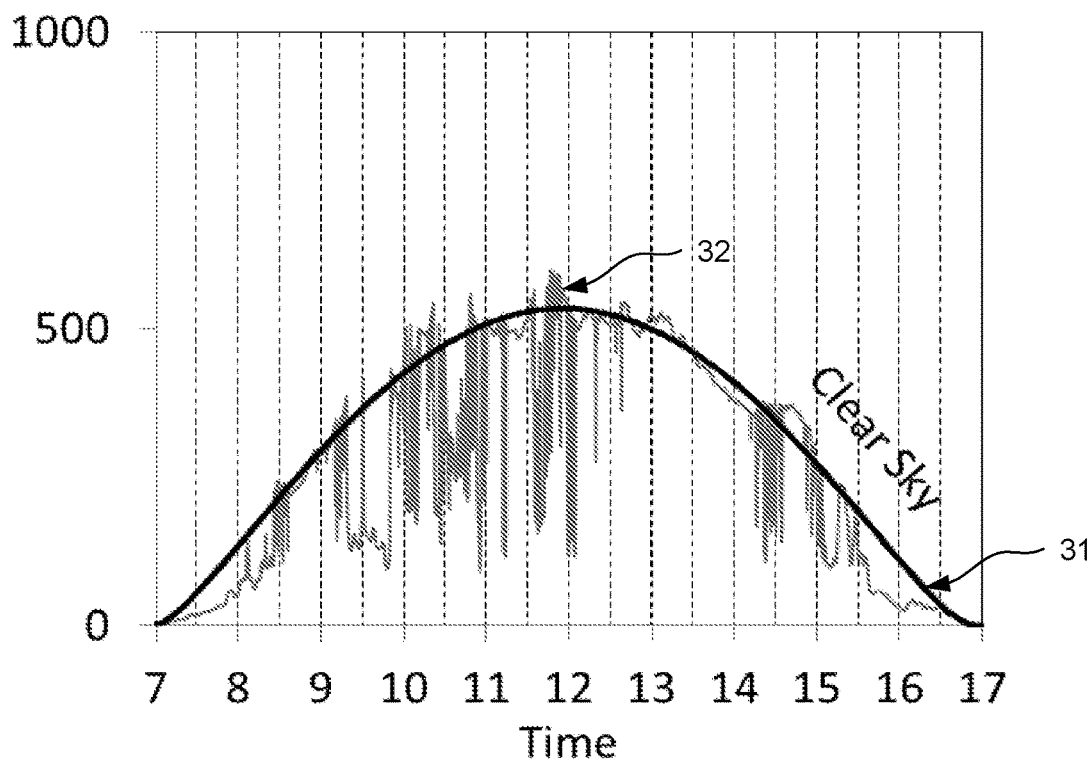
FIG. 3 is a graph depicting, by way of example, ten hours of time series irradiance data collected from a ground-based weather station with 10-second resolution.

A time series of solar irradiance or photovoltaic ("PV") data is first obtained (step 11) for a set of locations representative of the geographic region within which the photovoltaic fleet is located or intended to operate, as further described infra with reference to FIG. 3. Each time series contains solar irradiance observations measured or derived, then electronically recorded at a known sampling rate at fixed time intervals, such as at half-hour intervals, over successive observational time periods. The solar irradiance observations can include solar irradiance measured by a representative set of ground-based weather stations (step 12), existing photovoltaic systems (step 13), satellite observations (step 14), or some combination thereof. Other sources of the solar irradiance data are possible, including numeric weather prediction models.

Next, the solar irradiance data in the time series is converted over each of the time periods, such as at half-hour intervals, into a set of global horizontal irradiance clear sky indexes, which are calculated relative to clear sky global horizontal irradiance ("GHI") 30 based on the type of solar irradiance data, such as described in commonly-assigned U.S. Pat. No. 10,409,925, issued Sep. 10, 2019, the disclosure of which is incorporated by reference. The set of clearness indexes are interpreted into as irradiance statistics (step 15), as further described infra with reference to FIG. 4-FIG. 6, and power statistics, including a time series of the power statistics for the photovoltaic plant, are generated (step 17) as a function of the irradiance statistics and photovoltaic plant configuration (step 16). The photovoltaic plant configuration specification includes power generation and location information, including direct current ("DC") plant and photovoltaic panel ratings; number of power inverters; latitude, longitude and elevation; sampling and recording rates; sensor type, orientation, and number; voltage at point of delivery; tracking mode (fixed, single-axis tracking, dual-axis tracking), azimuth angle, tilt angle, row-to-row spacing, tracking rotation limit, and shading or other physical obstructions. Other types of information can also be included as part of the photovoltaic plant configuration. The resultant high-speed time series plant performance data can be combined to estimate photovoltaic fleet power output and variability, such as described in commonly-assigned U.S. Pat. Nos. 8,165,811; 8,165,812; 8,165,813; 8,326,535; 8,335,649; and 8,326,536, cited supra, for use by power grid planners, operators and other interested parties.

The calculated irradiance statistics are combined with the photovoltaic fleet configuration to generate the high-speed time series photovoltaic production data. In a further embodiment, the foregoing methodology may also require conversion of weather data for a region, such as data from satellite regions, to average point weather data. A non-optimized approach would be to calculate a correlation coefficient matrix on-the-fly for each satellite data point. Alternatively, a conversion factor for performing area-to-point conversion of satellite imagery data is described in commonly-assigned U.S. Pat. Nos. 8,165,813 and 8,326,536, cited supra.

Figure 2:
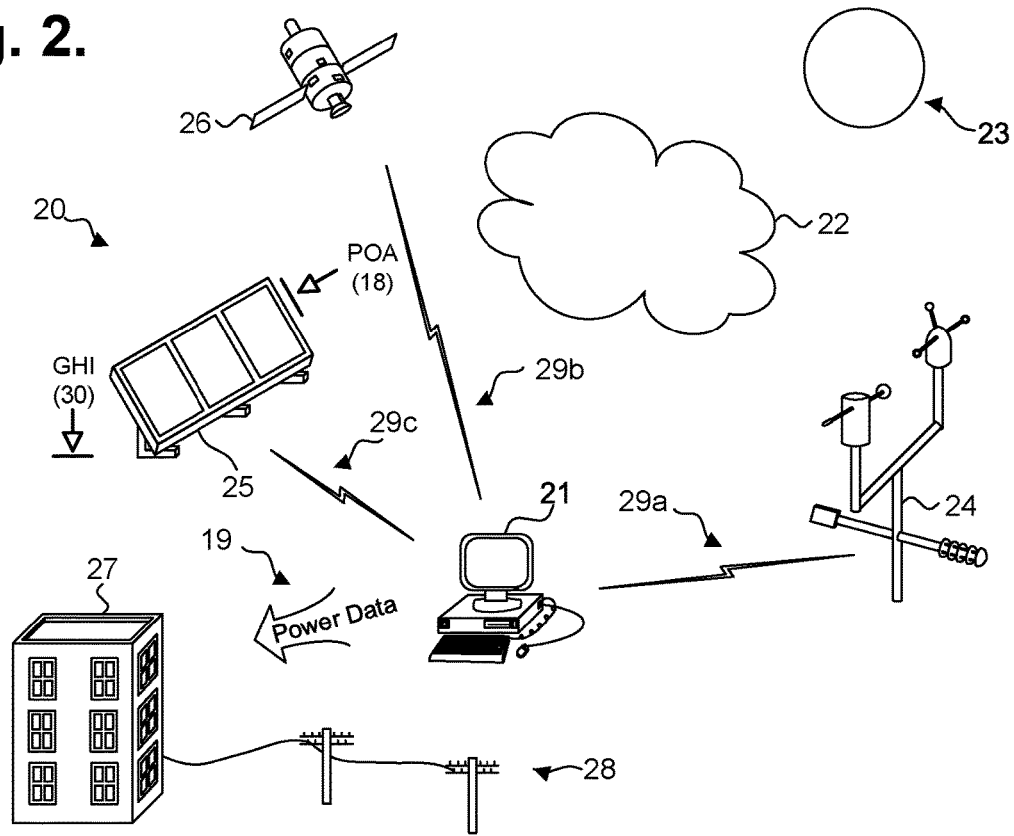
FIG. 2 is a block diagram showing a computer-implemented system for inferring operational specifications of a photovoltaic power generation system in accordance with a further embodiment.

Each forecast of power production data for a photovoltaic plant predicts the expected power output over a forecast period. FIG. 2 is a block diagram showing a computer-implemented system 20 for generating a probabilistic forecast of photovoltaic fleet power generation in accordance with one embodiment. Time series power output data 19 for a photovoltaic plant is generated using observed field conditions relating to overhead sky clearness. Solar irradiance 23 relative to prevailing cloudy conditions 22 in a geographic region of interest is measured. Direct solar irradiance measurements can be collected by ground-based weather stations 24. Solar irradiance measurements can also be derived or inferred by the actual power output of existing photovoltaic systems 25. Additionally, satellite observations 26 can be obtained for the geographic region. In a further embodiment, the solar irradiance can be generated by numerical weather prediction models. Both the direct and inferred solar irradiance measurements are considered to be sets of point values that relate to a specific physical location, whereas satellite imagery data is considered to be a set of area values that need to be converted into point values, such as described in commonly-assigned U.S. Pat. Nos. 8,165, 813 and 8,326,536, cited supra. Still other sources of solar irradiance measurements are possible.

The solar irradiance measurements are centrally collected by a computer system 21 or equivalent computational device. The computer system 21 executes the methodology described supra with reference to BRIEF DESCRIPTION OF THE DRAWINGS FIG. 1 and as further detailed herein to generate time series power data 26 and other analytics, which can be stored or provided 27 to planners, operators, and other parties for use in solar power generation 28 planning and operations. In a further embodiment, the computer system 21 executes the methodology described infra beginning with reference to FIG. 19 and to FIG. 22 for inferring operational specifications of a photovoltaic power generation system, which can be stored or provided 27 to planners and other interested parties for use in predicting individual and fleet power output generation. The data feeds 29a-c from the various sources of solar irradiance data need not be high speed connections; rather, the solar irradiance measurements can be obtained at an input data collection rate and application of the methodology described herein provides the generation of an output time series at any time resolution, even faster than the input time resolution. The computer system 21 includes hardware components conventionally found in a general purpose programmable computing device, such as a central processing unit, memory, user interfacing means, such as a keyboard, mouse, and display, input/output ports, network interface, and non-volatile storage, and execute software programs structured into routines, functions, and modules for execution on the various systems. In addition, other configurations of computational resources, whether provided as a dedicated system or arranged in client-server or peer-to-peer topologies, and including unitary or distributed processing, communications, storage, and user interfacing, are possible.

The detailed steps performed as part of the methodology described supra with reference to BRIEF DESCRIPTION OF THE DRAWINGS FIG. 1 will now be described.

Obtain Time Series Irradiance Data

The first step is to obtain time series irradiance data from representative locations. This data can be obtained from ground-based weather stations, existing photovoltaic systems, a satellite network, or some combination sources, as well as from other sources. The solar irradiance data is collected from several sample locations across the geographic region that encompasses the photovoltaic fleet.

Direct irradiance data can be obtained by collecting weather data from ground-based monitoring systems. FIG. 3 is a graph depicting, by way of example, ten hours of time series irradiance data collected from a ground-based weather station with 10-second resolution, that is, the time interval equals ten seconds. In the graph, the line 32 is the measured horizontal irradiance and the line 31 is the calculated clear sky horizontal irradiance for the location of the weather station.

Irradiance data can also be inferred from select photovoltaic systems using their electrical power output measurements. A performance model for each photovoltaic system is first identified, and the input solar irradiance corresponding to the power output is determined.

Finally, satellite-based irradiance data can also be used. As satellite imagery data is pixel-based, the data for the geographic region is provided as a set of pixels, which span across the region and encompassing the photovoltaic fleet.

Calculate Irradiance Statistics

The time series irradiance data for each location is then converted into time series clearness index data, which is then used to calculate irradiance statistics, as described infra.

Clearness Index (Kt)

Figure 4:
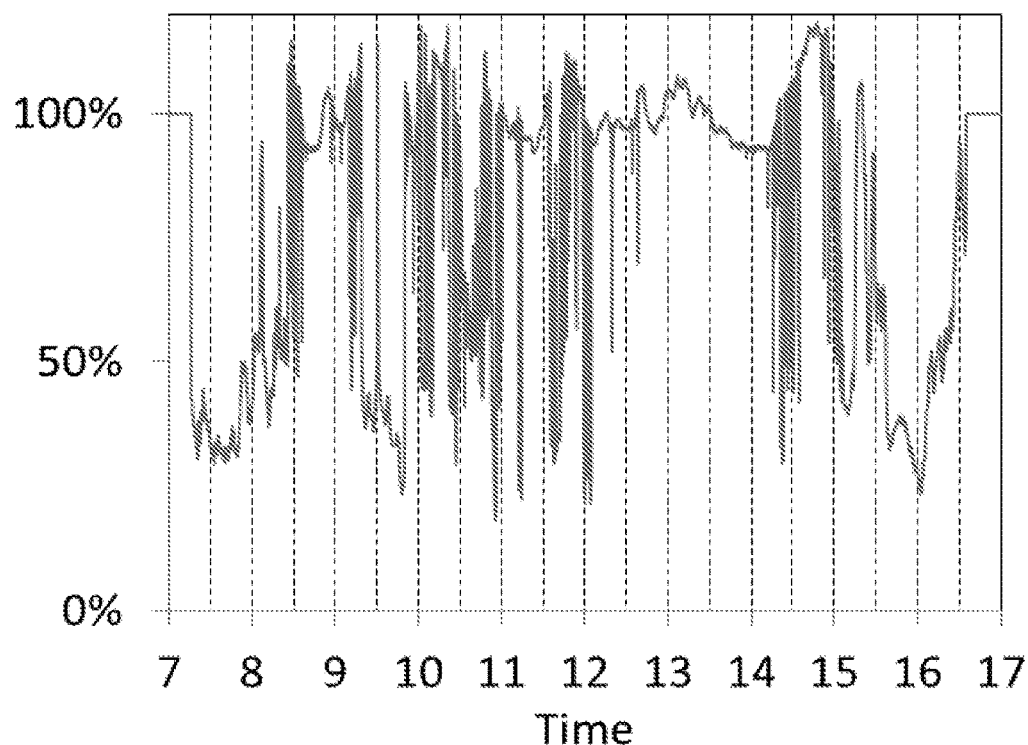
FIG. 4 is a graph depicting, by way of example, the clearness index that corresponds to the irradiance data presented in FIG. 3.

The clearness index (Kt) is calculated for each observation in the data set. In the case of an irradiance data set, the clearness index is determined by dividing the measured global horizontal irradiance by the clear sky global horizontal irradiance, may be obtained from any of a variety of analytical methods. FIG. 4 is a graph depicting, by way of example, the clearness index that corresponds to the irradiance data presented in FIG. 3. Calculation of the clearness index as described herein is also generally applicable to other expressions of irradiance and cloudy conditions, including global horizontal and direct normal irradiance.

Change in Clearness Index (ΔKt)

Figure 5:
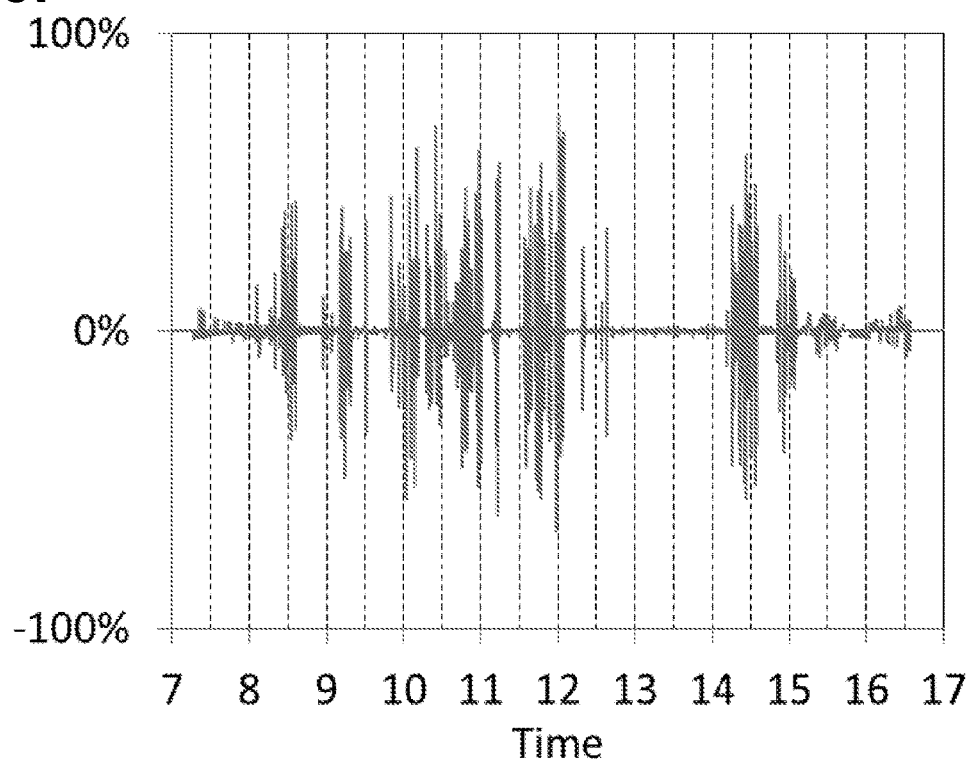
FIG. 5 is a graph depicting, by way of example, the change in clearness index that corresponds to the clearness index presented in FIG. 4.

The change in clearness index (ΔKt) over a time increment of Δt is the difference between the clearness index starting at the beginning of a time increment t and the clearness index starting at the beginning of a time increment t, plus a time increment Δt. FIG. 5 is a graph depicting, by way of example, the change in clearness index that corresponds to the clearness index presented in FIG. 4.

Time Period

The time series data set is next divided into time periods, for instance, from five to sixty minutes, over which statistical calculations are performed. The determination of time period is selected depending upon the end use of the power output data and the time resolution of the input data. For example, if fleet variability statistics are to be used to schedule regulation reserves on a 30-minute basis, the time period could be selected as 30 minutes. The time period must be long enough to contain a sufficient number of sample observations, as defined by the data time interval, yet be short enough to be usable in the application of interest. An empirical investigation may be required to determine the optimal time period as appropriate.

Fundamental Statistics

Table 1 lists the irradiance statistics calculated from time series data for each time period at each location in the geographic region. Note that time period and location subscripts are not included for each statistic for purposes of notational simplicity.

TABLE 1

| Statistic | Variable |
|---|---|
| Mean clearness index | $\mu_{Kt}$ |
| Variance clearness index | $\sigma^2_{Kt}$ |
| Mean clearness index change | $\mu_{\Delta Kt}$ |
| Variance clearness index change | $\sigma^2_{\Delta Kt}$ |

Table 2 lists sample clearness index time series data and associated irradiance statistics over five-minute time periods. The data is based on time series clearness index data that has a one-minute time interval. The analysis was performed over a five-minute time period. Note that the clearness index at 12:06 is only used to calculate the clearness index change and not to calculate the irradiance statistics.

TABLE 2

| | Clearness Index (Kt) | Clearness Index Change (ΔKt) |
|---|---|---|
| 12:00 | 50% | 40% |
| 12:01 | 90% | 0% |
| 12:02 | 90% | −80% |
| 12:03 | 10% | 0% |
| 12:04 | 10% | 80% |
| 12:05 | 90% | −40% |
| 12:06 | 50% | |
| Mean (μ) | 57% | 0% |
| Variance (σ²) | 13% | 27% |

The mean clearness index change equals the first clearness index in the succeeding time period, minus the first clearness index in the current time period divided by the number of time intervals in the time period. The mean clearness index change equals zero when these two values are the same. The mean is small when there are a sufficient number of time intervals. Furthermore, the mean is small relative to the clearness index change variance. To simplify the analysis, the mean clearness index change is assumed to equal zero for all time periods.

Figure 6:
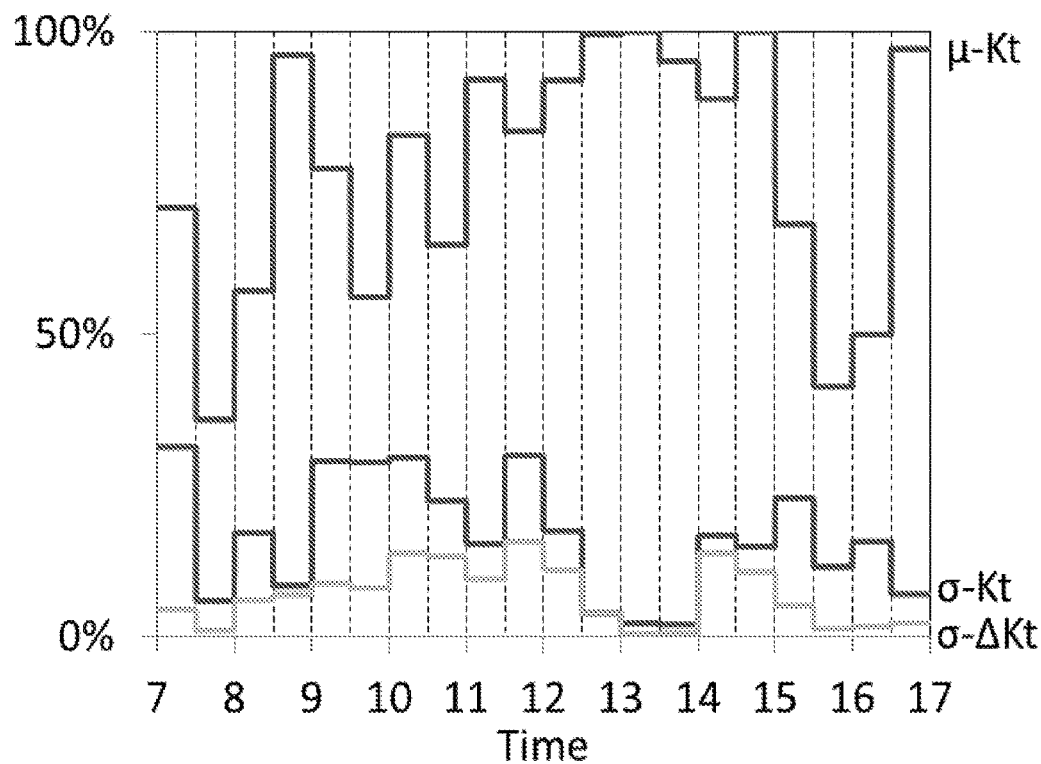
FIG. 6 is a graph depicting, by way of example, the irradiance statistics that correspond to the clearness index in FIG. 4 and the change in clearness index in FIG. 5.

FIG. 6 is a graph depicting, by way of example, the irradiance statistics that correspond to the clearness index in FIG. 4 and the change in clearness index in FIG. 5 using a half-hour hour time period. Note that FIG. 6 presents the standard deviations, determined as the square root of the variance, rather than the variances, to present the standard deviations in terms that are comparable to the mean.

Calculate Fleet Irradiance Statistics

Irradiance statistics were calculated in the previous section for the data stream at each sample location in the geographic region. The meaning of these statistics, however, depends upon the data source. Irradiance statistics calculated from a ground-based weather station data represent results for a specific geographical location as point statistics. Irradiance statistics calculated from satellite data represent results for a region as area statistics. For example, if a satellite pixel corresponds to a one square kilometer grid, then the results represent the irradiance statistics across a physical area one kilometer square.

Average irradiance statistics across the photovoltaic fleet region are a critical part of the methodology described herein. This section presents the steps to combine the statistical results for individual locations and calculate average irradiance statistics for the region as a whole. The steps differ depending upon whether point statistics or area statistics are used.

Irradiance statistics derived from ground-based sources simply need to be averaged to form the average irradiance statistics across the photovoltaic fleet region. Irradiance statistics from satellite sources are first converted from irradiance statistics for an area into irradiance statistics for an average point within the pixel. The average point statistics are then averaged across all satellite pixels to determine the average across the photovoltaic fleet region.

Mean Clearness Index ($\mu_{\overline{Kt}}$) and Mean Change in Clearness Index ($\mu_{\overline{\Delta Kt}}$)

The mean clearness index should be averaged no matter what input data source is used, whether ground, satellite, or photovoltaic system originated data. If there are N locations, then the average clearness index across the photovoltaic fleet region is calculated as follows.

$$\mu_{Kt} = \sum_{i=1}^{N} \frac{\mu_{Kt_i}}{N} \tag{1}$$

The mean change in clearness index for any period is assumed to be zero. As a result, the mean change in clearness index for the region is also zero.

$$\mu_{\overline{\Delta Kt}} = 0 \tag{2}$$

Convert Area Variance to Point Variance

The following calculations are required if satellite data is used as the source of irradiance data. Satellite observations represent values averaged across the area of the pixel, rather than single point observations. The clearness index derived from this data ($Kt^{Area}$) ($Kt^{Area}$) may therefore be considered an average of many individual point measurements.

$$Kt^{Area} = \sum_{i=1}^{N} \frac{Kt^i}{N} \tag{3}$$

As a result, the variance of the area clearness index based on satellite data can be expressed as the variance of the average clearness indexes across all locations within the satellite pixel.

$$\sigma^2_{Kt-Area} = VAR[Kt^{Area}] = VAR\left[\sum_{i=1}^{N} \frac{Kt^i}{N}\right] \tag{4}$$

The variance of a sum, however, equals the sum of the covariance matrix.

$$\sigma^2_{Kt-Area} = \left(\frac{1}{N^2}\right) \sum_{i=1}^{N} \sum_{j=1}^{N} COV[Kt^i, Kt^j] \tag{5}$$

Let $\rho^{Kt^i, Kt^j}$ represents the correlation coefficient between the clearness index at location i and location j within the satellite pixel. By definition of correlation coefficient, $COV[Kt^i, Kt^j] = \sigma_{Kt}^i \sigma_{Kt}^j \rho^{Kt^i, Kt^j}$. Furthermore, since the objective is to determine the average point variance across the satellite pixel, the standard deviation at any point within the satellite pixel can be assumed to be the same and equals $\sigma_{Kt}$, which means that $\sigma_{Kt}^i \sigma_{Kt}^j = \sigma_{Kt}^2$ for all location pairs. As a result, $COV[Kt^i, Kt^j] = \sigma_{Kt}^2 \rho^{Kt^i, Kt^j}$. Substituting this result into Equation (5) and simplify.

$$\sigma^2_{Kt-Area} = \sigma^2_{Kt} \left(\frac{1}{N^2}\right) \sum_{i=1}^{N} \sum_{j=1}^{N} \rho^{Kt^i, Kt^j} \tag{6}$$

Suppose that data was available to calculate the correlation coefficient in Equation (6). The computational effort required to perform a double summation for many points can be quite large and computationally resource intensive. For example, a satellite pixel representing a one square kilometer area contains one million square meter increments. With one million increments, Equation (6) would require one trillion calculations to compute.

The calculation can be simplified by conversion into a continuous probability density function of distances between location pairs across the pixel and the correlation coefficient for that given distance, as further described supra. Thus, the irradiance statistics for a specific satellite pixel, that is, an area statistic, rather than a point statistics, can be converted into the irradiance statistics at an average point within that pixel by dividing by a "Area" term (A), which corresponds to the area of the satellite pixel. Furthermore, the probability density function and correlation coefficient functions are generally assumed to be the same for all pixels within the fleet region, making the value of A constant for all pixels and reducing the computational burden further. Details as to how to calculate A are also further described supra.

$$\sigma^2_{Kt} = \frac{\sigma^2_{Kt-Area}}{A^{Satellite\ Pixel}_{Kt}} \tag{7}$$

where:

$$A^{Satellite\ Pixel}_{Kt} = \left(\frac{1}{N^2}\right) \sum_{i=1}^{N} \sum_{j=1}^{N} \rho^{i,j} \tag{8}$$

Likewise, the change in clearness index variance across the satellite region can also be converted to an average point estimate using a similar conversion factor, $A_{\Delta Kt}^{Area}$.

$$\sigma^2_{\Delta Kt} = \frac{\sigma^2_{\Delta Kt-Area}}{A^{Satellite\ Pixel}_{\Delta Kt}} \tag{9}$$

Variance of Clearness Index $$\left(\sigma\frac{2}{Kt}\right)$$

and Variance of Change in Clearness Index $$\left(\sigma\frac{2}{\Delta Kt}\right)$$

At this point, the point statistics ($\sigma_{Kt}^2$ and $\sigma_{\Delta Kt}^2$) have been determined for each of several representative locations within the fleet region. These values may have been obtained from either ground-based point data or by converting satellite data from area into point statistics. If the fleet region is small, the variances calculated at each location i can be averaged to determine the average point variance across the fleet region. If there are N locations, then average variance of the clearness index across the photovoltaic fleet region is calculated as follows.

$$\sigma\frac{2}{Kt} = \sum_{i=1}^{N} \frac{\sigma^2_{Kt_i}}{N} \tag{10}$$

Likewise, the variance of the clearness index change is calculated as follows.

$$\sigma_{\overline{\Delta Kt}}^2 = \sum_{i=1}^{N} \frac{\sigma_{\Delta Kt_i}^2}{N} \quad (11)$$

Calculate Fleet Power Statistics

The next step is to calculate photovoltaic fleet power statistics using the fleet irradiance statistics, as determined supra, and physical photovoltaic fleet configuration data. These fleet power statistics are derived from the irradiance statistics and have the same time period.

The critical photovoltaic fleet performance statistics that are of interest are the mean fleet power, the variance of the fleet power, and the variance of the change in fleet power over the desired time period. As in the case of irradiance statistics, the mean change in fleet power is assumed to be zero.

Photovoltaic System Power for Single System at Time t

Photovoltaic system power output (kW) is approximately linearly related to the AC-rating of the photovoltaic system (R in units of kWAC) times plane-of-array irradiance. Plane-of-array irradiance ("POA") 18 (shown in BRIEF DESCRIPTION OF THE DRAWINGS FIG. 1) can be represented by the clearness index over the photovoltaic system (KtPV) times the clear sky global horizontal irradiance times an orientation factor (O), which both converts global horizontal irradiance to plane-of-array irradiance and has an embedded factor that converts irradiance from Watts/m2 to kW output/kW of rating. Thus, at a specific point in time (t), the power output for a single photovoltaic system (n) equals:

$$P_t^n = R^n O_t^n KtPV_t^n I_t^{Clear,n} \quad (12)$$

The change in power equals the difference in power at two different points in time.

$$\Delta P_{t,\Delta t}^n = R^n O_{t+\Delta t}^n KtPV_{t+\Delta t}^n I_{t+\Delta t}^{Clear,n} - R^n O_t^n KtPV_t^n I_t^{Clear,n} \quad (13)$$

The rating is constant, and over a short time interval, the two clear sky plane-of-array irradiances are approximately the same ($O_{t+\Delta t}^n I_{t+\Delta t}^{Clear,n} \approx O_t^n I_t^{Clear,n}$), so that the three terms can be factored out and the change in the clearness index remains.

$$\Delta P_{t,\Delta t}^n \approx R^n O_t^n I_t^{Clear,n} \Delta KtPV_t^n \quad (14)$$

Time Series Photovoltaic Power for Single System $P^n$ is a random variable that summarizes the power for a single photovoltaic system n over a set of times for a given time interval and set of time periods. $\Delta P^n$ is a random variable that summarizes the change in power over the same set of times.

Mean Fleet Power ($\mu_P$)

The mean power for the fleet of photovoltaic systems over the time period equals the expected value of the sum of the power output from all of the photovoltaic systems in the fleet.

$$\mu_P = E\left[\sum_{n=1}^{N} R^n O^n KtPV^n I^{Clear,n}\right] \quad (15)$$

If the time period is short and the region small, the clear sky irradiance does not change much and can be factored out of the expectation.

$$\mu_P = \mu_{I^{Clear}} E\left[\sum_{n=1}^{N} R^n O^n KtPV^n\right] \quad (16)$$

Again, if the time period is short and the region small, the clearness index can be averaged across the photovoltaic fleet region and any given orientation factor can be assumed to be a constant within the time period. The result is that:

$$\mu_P = R^{Adj.Fleet} \mu_{I^{Clear}} \mu_{\overline{Kt}} \quad (17)$$

where $\mu_{I^{Clear}}$ is calculated, $\mu_{\overline{Kt}}$ is taken from Equation (1) and:

$$R^{Adj.Fleet} = \sum_{n=1}^{N} R^n O^n \quad (18)$$

This value can also be expressed as the average power during clear sky conditions times the average clearness index across the region.

$$\mu_P = \mu_P^{Clear} \mu_{\overline{Kt}} \quad (19)$$

Variance of Fleet Power ($\sigma_P^2$)

The variance of the power from the photovoltaic fleet equals:

$$\sigma_P^2 = VAR\left[\sum_{n=1}^{N} R^n O^n KtPV^n I^{Clear,n}\right] \quad (20)$$

If the clear sky irradiance is the same for all systems, which will be the case when the region is small and the time period is short, then:

$$\sigma_P^2 = VAR\left[I^{Clear} \sum_{n=1}^{N} R^n O^n KtPV^n\right] \quad (21)$$

The variance of a product of two independent random variables X, Y, that is, VAR[XY]) equals $E[X]^2 VAR[Y] + E[Y]^2 VAR[X] + VAR[X] VAR[Y]$. If the X random variable has a large mean and small variance relative to the other terms, then $VAR[XY] \approx E[X]^2 VAR[Y]$. Thus, the clear sky irradiance can be factored out of Equation (21) and can be written as:

$$\sigma_P^2 = (\mu_{I^{Clear}})^2 VAR\left[\sum_{n=1}^{N} R^n KtPV^n O^n\right] \quad (22)$$

The variance of a sum equals the sum of the covariance matrix.

$$\sigma_P^2 = (\mu_{I^{Clear}})^2 \left(\sum_{i=1}^{N} \sum_{j=1}^{N} COV[R^i KtPV^i O^i, R^j KtPV^j O^j]\right) \quad (23)$$

In addition, over a short time period, the factor to convert from clear sky GHI to clear sky POA does not vary much and becomes a constant. All four variables can be factored out of the covariance equation.

$$\sigma_P^2 = (\mu_{tClear})^2 \left( \sum_{i=1}^{N} \sum_{j=1}^{N} (R^i O^i)(R^j O^j) COV[KtPV^i, KtPV^j] \right) \quad (24)$$

For any i and j, $$COV[KtPV^i, KtPV^j] = \sqrt{\sigma_{KtPV^i}^2 \sigma_{KtPV^j}^2} \, \rho^{Kt^i, Kt^j} \cdot \sigma_P^2 = \quad (25)$$

$$(\mu_{tClear})^2 \left( \sum_{i=1}^{N} \sum_{j=1}^{N} (R^i O^i)(R^j O^j) \sqrt{\sigma_{KtPV^i}^2 \sigma_{KtPV^j}^2} \, \rho^{Kt^i, Kt^j} \right)$$

As discussed supra, the variance of the satellite data required a conversion from the satellite area, that is, the area covered by a pixel, to an average point within the satellite area. In the same way, assuming a uniform clearness index across the region of the photovoltaic plant, the variance of the clearness index across a region the size of the photovoltaic plant within the fleet also needs to be adjusted. The same approach that was used to adjust the satellite clearness index can be used to adjust the photovoltaic clearness index. Thus, each variance needs to be adjusted to reflect the area that the $i^{th}$ photovoltaic plant covers.

$$\sigma_{KtPV^i}^2 = A_{Kt}^i \sigma_{Kt}^2 \quad (26)$$

Substituting and then factoring the clearness index variance given the assumption that the average variance is constant across the region yields:

$$\sigma_P^2 = (R^{Adj.Fleet} \mu_{tClear})^2 \, P^{Kt} \, \sigma_{Kt}^2 \quad (27)$$

where the correlation matrix equals:

$$P^{Kt} = \frac{\sum_{i=1}^{N} \sum_{j=1}^{N} (R^i O^i A_{Kt}^i)(R^j O^j A_{Kt}^j) \rho^{Kt^i, Kt^j}}{\left( \sum_{n=1}^{N} R^n O^n \right)^2} \quad (28)$$

$R^{Adj.Fleet} \mu_{tClear}$ in Equation (27) can be written as the power produced by the photovoltaic fleet under clear sky conditions, that is:

$$\sigma_P^2 = \mu_{pClear}^2 \, P^{Kt} \, \sigma_{Kt}^2 \quad (29)$$

If the region is large and the clearness index mean or variances vary substantially across the region, then the simplifications may not be able to be applied. Notwithstanding, if the simplification is inapplicable, the systems are likely located far enough away from each other, so as to be independent. In that case, the correlation coefficients between plants in different regions would be zero, so most of the terms in the summation are also zero and an inter-regional simplification can be made. The variance and mean then become the weighted average values based on regional photovoltaic capacity and orientation.

Discussion

In Equation (28), the correlation matrix term embeds the effect of intra-plant and inter-plant geographic diversification. The area-related terms (A) inside the summations reflect the intra-plant power smoothing that takes place in a large plant and may be calculated using the simplified relationship, as further discussed supra. These terms are then weighted by the effective plant output at the time, that is, the rating adjusted for orientation. The multiplication of these terms with the correlation coefficients reflects the inter-plant smoothing due to the separation of photovoltaic systems from one another.

Variance of Change in Fleet Power ($\sigma_{\Delta P}^2$)

A similar approach can be used to show that the variance of the change in power equals:

$$\sigma_{\Delta P}^2 = \mu_{pClear}^2 \, P^{\Delta Kt} \, \sigma_{\Delta Kt}^2 \quad (30)$$

where:

$$P^{\Delta Kt} = \frac{\sum_{i=1}^{N} \sum_{j=1}^{N} (R^i O^i A_{\Delta Kt}^i)(R^j O^j A_{\Delta Kt}^j) \rho^{\Delta Kt^i, \Delta Kt^j}}{\left( \sum_{n=1}^{N} R^n O^n \right)^2} \quad (31)$$

The determination of Equations (30) and (31) becomes computationally intensive as the network of points becomes large. For example, a network with 10,000 photovoltaic systems would require the computation of a correlation coefficient matrix with 100 million calculations. The computational burden can be reduced in two ways. First, many of the terms in the matrix are zero because the photovoltaic systems are located too far away from each other. Thus, the double summation portion of the calculation can be simplified to eliminate zero values based on distance between locations by construction of a grid of points. Second, once the simplification has been made, rather than calculating the matrix on-the-fly for every time period, the matrix can be calculated once at the beginning of the analysis for a variety of cloud speed conditions, and then the analysis would simply require a lookup of the appropriate value.

Time Lag Correlation Coefficient

The next step is to adjust the photovoltaic fleet power statistics from the input time interval to the desired output time interval. For example, the time series data may have been collected and stored every 60 seconds. The user of the results, however, may want to have photovoltaic fleet power statistics at a 10-second rate. This adjustment is made using the time lag correlation coefficient.

The time lag correlation coefficient reflects the relationship between fleet power and that same fleet power starting one time interval ($\Delta t$) later. Specifically, the time lag correlation coefficient is defined as follows:

$$\rho^{P, P^{\Delta t}} = \frac{COV[P, P^{\Delta t}]}{\sqrt{\sigma_P^2 \sigma_{P^{\Delta t}}^2}} \quad (32)$$

The assumption that the mean clearness index change equals zero implies that $\sigma_{P^{\Delta t}}^2 = \sigma_P^2$. Given a non-zero variance of power, this assumption can also be used to show that $$\frac{COV[P, P^{\Delta t}]}{\sigma_P^2} = 1 - \frac{\sigma_{\Delta P}^2}{2\sigma_P^2}.$$

Therefore:

$$\rho^{P,P^{\Delta t}} = 1 - \frac{\sigma_{\Delta P}^2}{2\sigma_P^2} \qquad (33)$$

This relationship illustrates how the time lag correlation coefficient for the time interval associated with the data collection rate is completely defined in terms of fleet power statistics already calculated. A more detailed derivation is described infra.

Equation (33) can be stated completely in terms of the photovoltaic fleet configuration and the fleet region clearness index statistics by substituting Equations (29) and (30). Specifically, the time lag correlation coefficient can be stated entirely in terms of photovoltaic fleet configuration, the variance of the clearness index, and the variance of the change in the clearness index associated with the time increment of the input data.

$$\rho^{P,P^{\Delta t}} = 1 - \frac{P^{\Delta Kt}\sigma_{\frac{2}{\Delta Kt}}}{2\,P^{Kt}\sigma_{\frac{2}{Kt}}} \qquad (34)$$

Generate High-Speed Time Series Photovoltaic Fleet Power

The final step is to generate high-speed time series photovoltaic fleet power data based on irradiance statistics, photovoltaic fleet configuration, and the time lag correlation coefficient. This step is to construct time series photovoltaic fleet production from statistical measures over the desired time period, for instance, at half-hour output intervals.

A joint probability distribution function is required for this step. The bivariate probability density function of two unit normal random variables (X and Y) with a correlation coefficient of $\rho$ equals:

$$f(x, y) = \frac{1}{2\pi\sqrt{1-\rho^2}}\exp\left[-\frac{(x^2 + y^2 - 2\rho x y)}{2(1-\rho^2)}\right] \qquad (35)$$

The single variable probability density function for a unit normal random variable X alone is $$(x) = \frac{1}{\sqrt{2\pi}}\exp\left(-\frac{x^2}{2}\right).$$

In addition, a conditional distribution for y can be calculated based on a known x by dividing the bivariate probability density function by the single variable probability density, that is, $$f(y \mid x) = \frac{f(x, y)}{f(x)}.$$

Making the appropriate substitutions, the result is that the conditional distribution of y based on a known x equals:

$$f(y \mid x) = \frac{1}{\sqrt{2\pi}\sqrt{1-\rho^2}}\exp\left[-\frac{(y-\rho x)^2}{2(1-\rho^2)}\right] \qquad (36)$$

Define a random variable $$Z = \frac{Y - \rho x}{\sqrt{1-\rho^2}}$$

and substitute into Equation (36). The result is that the conditional probability of z given a known x equals:

$$f(z \mid x) = \frac{1}{\sqrt{2\pi}}\exp\left(-\frac{z^2}{2}\right) \qquad (37)$$

The cumulative distribution function for Z can be denoted by $\Phi(z^*)$, where $z^*$ represents a specific value for z. The result equals a probability (p) that ranges between 0 (when $z^* = -\infty$) and 1 (when $z^* = \infty$). The function represents the cumulative probability that any value of z is less than $z^*$, as determined by a computer program or value lookup.

$$p = \Phi(z^*) = \frac{1}{\sqrt{2\pi}}\int_{-\infty}^{z^*}\exp\left(-\frac{z^2}{2}\right)dz \qquad (38)$$

Rather than selecting $z^*$, however, a probability p falling between 0 and 1 can be selected and the corresponding $z^*$ that results in this probability found, which can be accomplished by taking the inverse of the cumulative distribution function.

$$\Phi^{-1}(p) = z^* \qquad (39)$$

Substituting back for z as defined above results in:

$$\Phi^{-1}(p) = \frac{y - \rho x}{\sqrt{1-\rho^2}} \qquad (40)$$

Now, let the random variables equal $$X = \frac{P - \mu_P}{\sigma_P} \text{ and } Y = \frac{P^{\Delta t} - \mu_{P^{\Delta t}}}{\sigma_{P^{\Delta t}}},$$

with the correlation coefficient being the time lag correlation coefficient between P and $P^{\Delta t}$, that is, let $\rho = \rho^{P,P^{\Delta t}}$. When $\Delta t$ is small, then the mean and standard deviations for $P^{\Delta t}$ are approximately equal to the mean and standard deviation for P. Thus, Y can be restated as $$Y \approx \frac{P^{\Delta t} - \mu_P}{\sigma_P}.$$

Add a time subscript to all of the relevant data to represent a specific point in time and substitute x, y, and ρ into Equation (40).

$$\Phi^{-1}(p) = \frac{\left(\frac{P_t^{\Delta t} - \mu_P}{\sigma_P}\right) - \rho^{P,P^{\Delta t}}\left(\frac{P_t - \mu_P}{\sigma_P}\right)}{\sqrt{1 - \rho^{P,P^{\Delta t}2}}} \quad (41)$$

The random variable $P^{\Delta t}$, however, is simply the random variable P shifted in time by a time interval of Δt. As a result, at any given time t, $P^{\Delta t}_t = P_{t+\Delta t}$. Make this substitution into Equation (41) and solve in terms of $P_{t+\Delta t}$.

$$P_{t+\Delta t} = \rho^{P,P^{\Delta t}} P_t + (1 - \rho^{P,P^{\Delta t}})\mu_P + \sqrt{\sigma_P^2(1 - \rho^{P,P^{\Delta t}2})} \, \Phi^{-1}(p) \quad (42)$$

At any given time, photovoltaic fleet power equals photovoltaic fleet power under clear sky conditions times the average regional clearness index, that is, $P_t = P_t^{Clear} Kt_t$. In addition, over a short time period, $$\mu_P \approx P_t^{Clear}\mu_{\overline{Kt}} \text{ and } \sigma_P^2 \approx (P_t^{Clear})^2 P^{Kt}\sigma\frac{2}{Kt}.$$

Substitute these three relationships into Equation (42) and factor out photovoltaic fleet power under clear sky conditions ($P_t^{Clear}$) as common to all three terms.

$$P_{t+\Delta t} = P_t^{Clear} \left[\rho^{P,P^{\Delta t}} Kt_t + (1 - \rho^{P,P^{\Delta t}})\mu_{\overline{Kt}} + \sqrt{P^{Kt}\sigma\frac{2}{Kt}(1 - \rho^{P,P^{\Delta t}2})} \, \Phi^{-1}(p_t)\right] \quad (43)$$

Equation (43) provides an iterative method to generate high-speed time series photovoltaic production data for a fleet of photovoltaic systems. At each time step (t+Δt), the power delivered by the fleet of photovoltaic systems ($P_{t+\Delta t}$) is calculated using input values from time step t. Thus, a time series of power outputs can be created. The inputs include:

$P_r^{Clear}$—photovoltaic fleet power during clear sky conditions calculated using a photovoltaic simulation program and clear sky irradiance.

$Kt_t$—average regional clearness index inferred based on $P_t$ calculated in time step t, that is, $Kt_t = P_t/P_t^{Clear}$.

$\mu_{\overline{Kt}}$—mean clearness index calculated using time series irradiance data and Equation (1).

$\sigma\frac{2}{Kt}$— variance of the clearness index calculated using time series irradiance data and Equation (10).

$\rho^{P,P^{\Delta t}}$—fleet configuration as reflected in the time lag correlation coefficient calculated using Equation (34). In turn, Equation (34), relies upon correlation coefficients from Equations (28) and (31). A method to obtain these correlation coefficients by empirical means is described in commonly-assigned U.S. Pat. No. 8,165,811, issued Apr. 24, 2012, and U.S. Pat. No. 8,165,813, issued Apr. 24, 2012, the disclosure of which is incorporated by reference.

$P^{Kt}$—fleet configuration as reflected in the clearness index correlation coefficient matrix calculated using Equation (28) where, again, the correlation coefficients may be obtained using the empirical results as further described infra.

$\Phi^{-1}(p_t)$—the inverse cumulative normal distribution function based on a random variable between 0 and 1.

Derivation of Empirical Models

The previous section developed the mathematical relationships used to calculate irradiance and power statistics for the region associated with a photovoltaic fleet. The relationships between Equations (8), (28), (31), and (34) depend upon the ability to obtain point-to-point correlation coefficients. This section presents empirically-derived models that can be used to determine the value of the coefficients for this purpose.

Figure 7A:
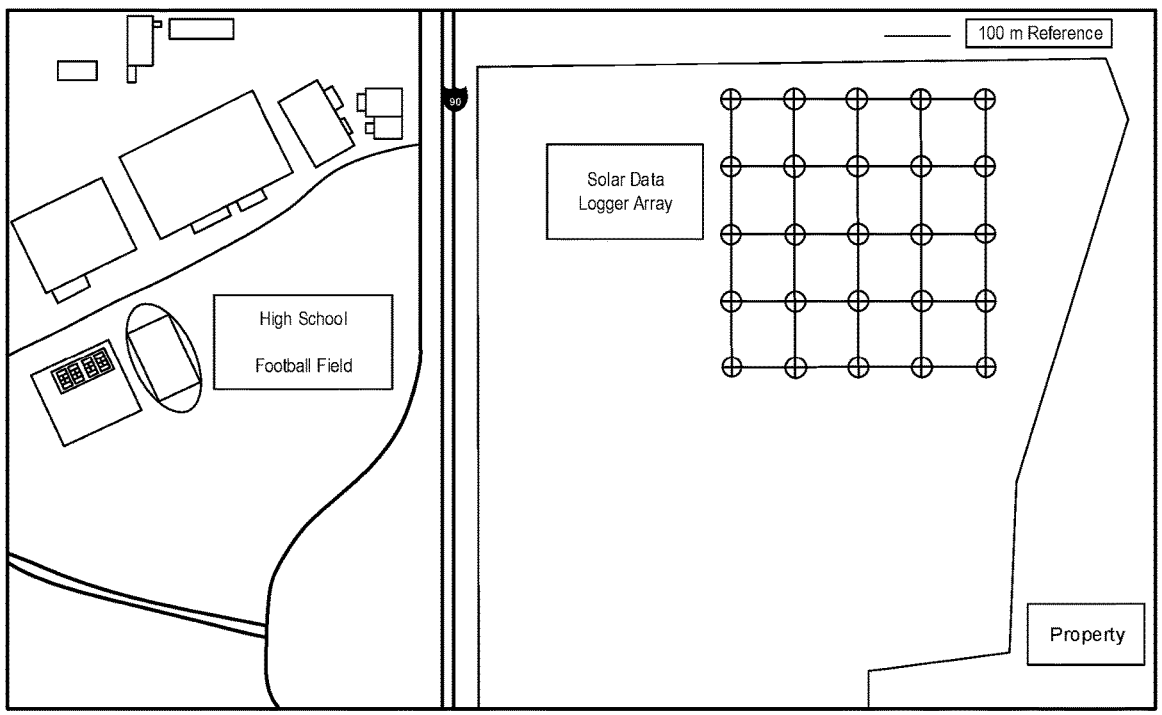
FIGS. 7A-7B are photographs showing, by way of example, the locations of the Cordelia Junction and Napa high density weather monitoring stations.
Figure 7B:
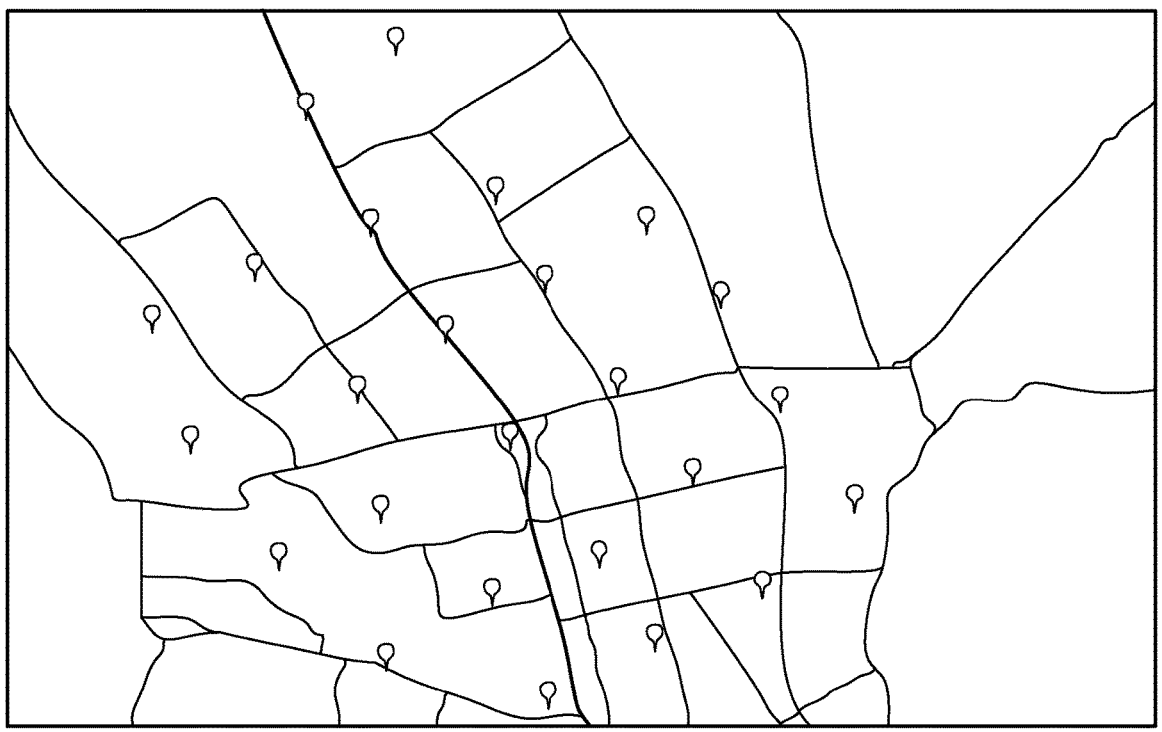

A mobile network of 25 weather monitoring devices was deployed in a 400 meter by 400 meter grid in Cordelia Junction, Calif., between Nov. 6, 2010, and Nov. 15, 2010, and in a 4,000 meter by 4,000 meter grid in Napa, Calif., between Nov. 19, 2010, and Nov. 24, 2010. FIGS. 7A-7B are photographs showing, by way of example, the locations of the Cordelia Junction and Napa high density weather monitoring stations.

An analysis was performed by examining results from Napa and Cordelia Junction using 10, 30, 60, 120 and 180 second time intervals over each half-hour time period in the data set. The variance of the clearness index and the variance of the change in clearness index were calculated for each of the 25 locations for each of the two networks. In addition, the clearness index correlation coefficient and the change in clearness index correlation coefficient for each of the 625 possible pairs, 300 of which are unique, for each of the two locations were calculated.

An empirical model is proposed as part of the methodology described herein to estimate the correlation coefficient of the clearness index and change in clearness index between any two points by using as inputs the following: distance between the two points, cloud speed, and time interval. For the analysis, distances were measured, cloud speed was implied, and a time interval was selected.

The empirical models infra describe correlation coefficients between two points (i and j), making use of "temporal distance," defined as the physical distance (meters) between points i and j, divided by the regional cloud speed (meters per second) and having units of seconds. The temporal distance answers the question, "How much time is needed to span two locations?"

Cloud speed was estimated to be six meters per second. Results indicate that the clearness index correlation coefficient between the two locations closely matches the estimated value as calculated using the following empirical model:

$$\rho^{Kt^i, Kt^j} = \exp(C_1 \times \text{TemporalDistance})^{\text{ClearnessPower}} \quad (44)$$

where TemporalDistance=Distance (meters)/CloudSpeed (meters per second), ClearnessPower=ln($C_2\Delta t$)−9.3, such that 5≤k≤15, where the expected value is k=9.3, $\Delta t$ is the desired output time interval (seconds), $C_1=10^{-3}$ seconds$^{-1}$, and $C_2=1$ seconds$^{-1}$.

Results also indicate that the correlation coefficient for the change in clearness index between two locations closely matches the values calculated using the following empirical relationship:

$$\rho^{\Delta Kt^i,\Delta Kt^j}=(\rho^{Kt^i,Kt^j})^{\Delta ClearnessPower} \quad (45)$$

where $\rho^{Kt^i,Kt^j}$ is calculated using Equation (44) and $$\Delta ClearnessPower = 1 + \frac{140}{C_2 \Delta t},$$

such that 100≤m≤200, where the expected value is m=140.

Empirical results also lead to the following models that may be used to translate the variance of clearness index and the variance of change in clearness index from the measured time interval ($\Delta t$ ref) to the desired output time interval ($\Delta t$).

$$\sigma^2_{Kt_{\Delta t}} = \sigma^2_{Kt_{\Delta t\,ref}} \exp\left[1 - \left(\frac{\Delta t}{\Delta t\,ref}\right)^{C_3}\right] \quad (46)$$

$$\sigma^2_{\Delta Kt_{\Delta t}} = \sigma^2_{\Delta Kt_{\Delta t\,ref}} \left\{1 - 2\left[1 - \left(\frac{\Delta t}{\Delta t\,ref}\right)^{C_3}\right]\right\} \quad (47)$$

where $C_3=0.1 \leq C_3 \leq 0.2$, where the expected value is $C_3=0.15$.

Figure 8A:
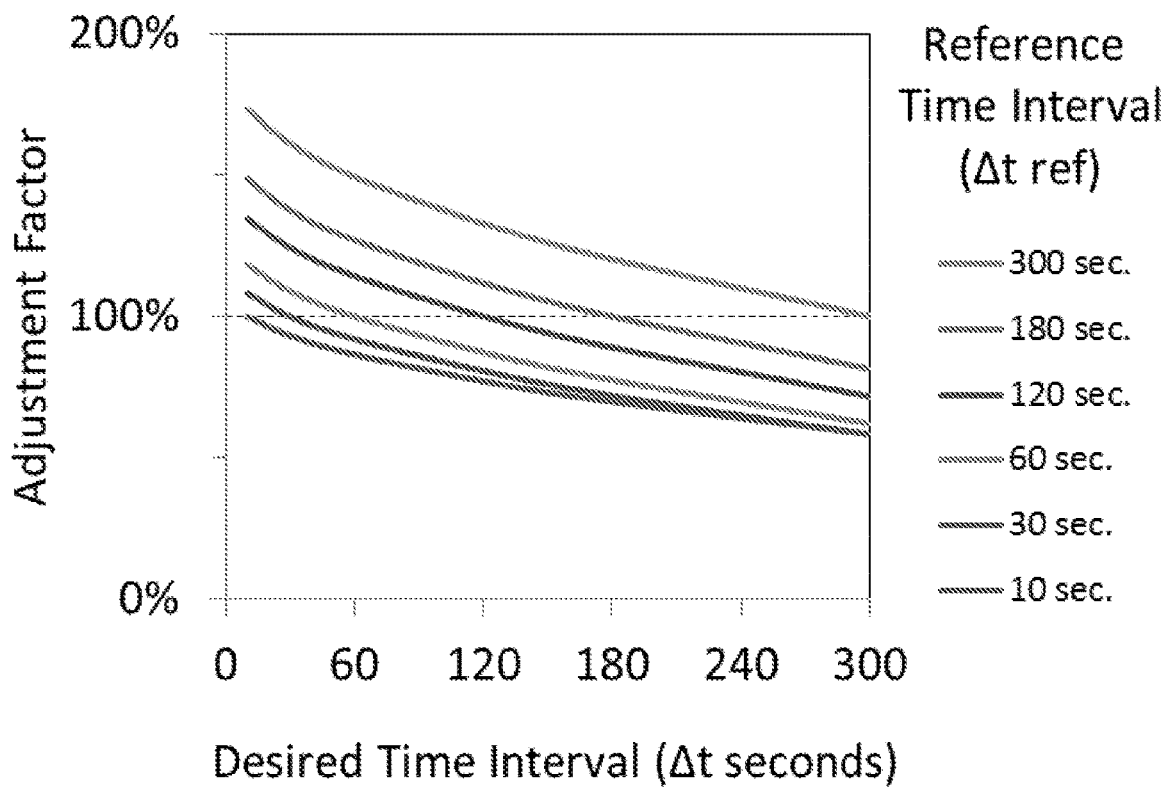
FIGS. 8A-8B are graphs depicting, by way of example, the adjustment factors plotted for time intervals from 10 seconds to 300 seconds.
Figure 8B:
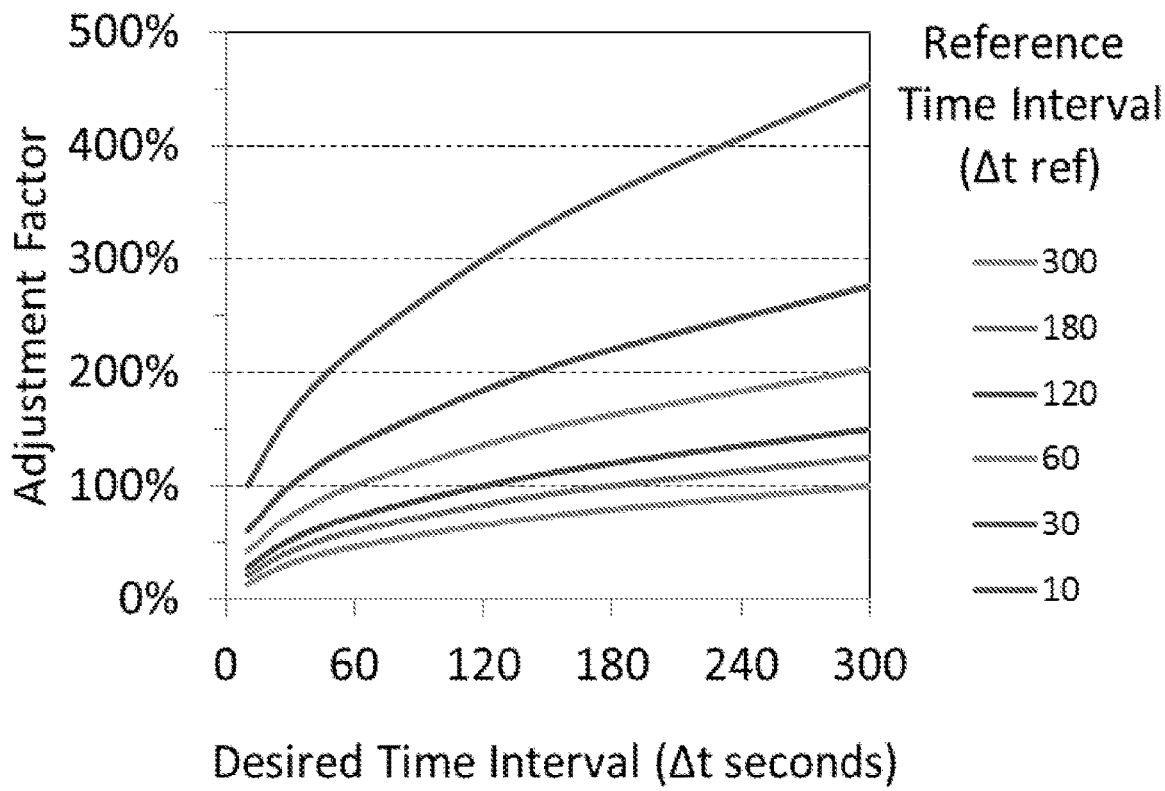
Figure 9A:
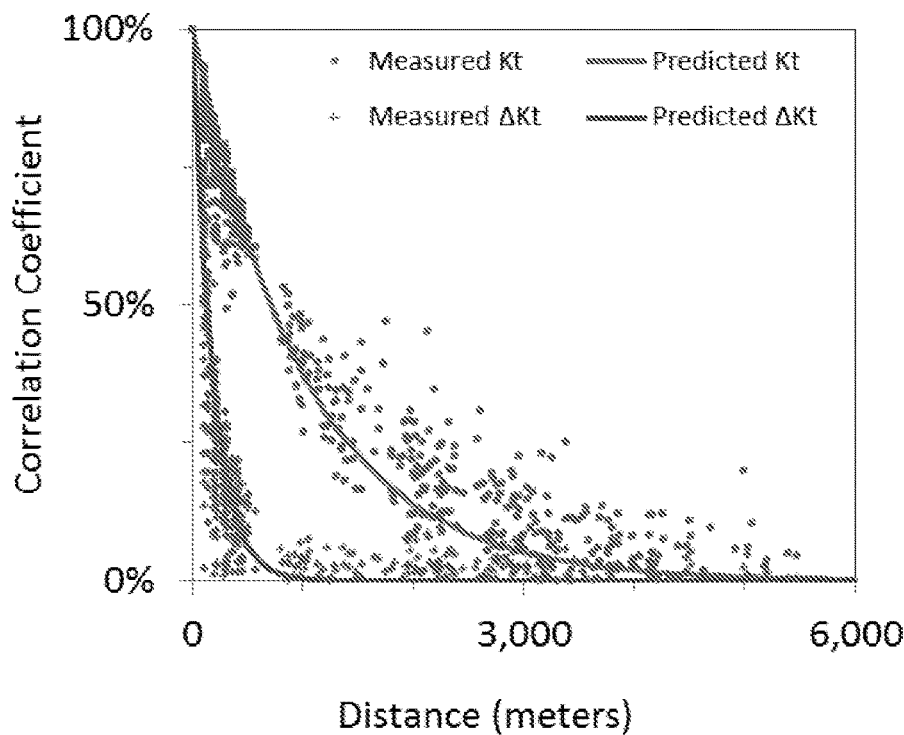
FIGS. 9A-9F are graphs depicting, by way of example, the measured and predicted weighted average correlation coefficients for each pair of locations versus distance.
Figure 9B:
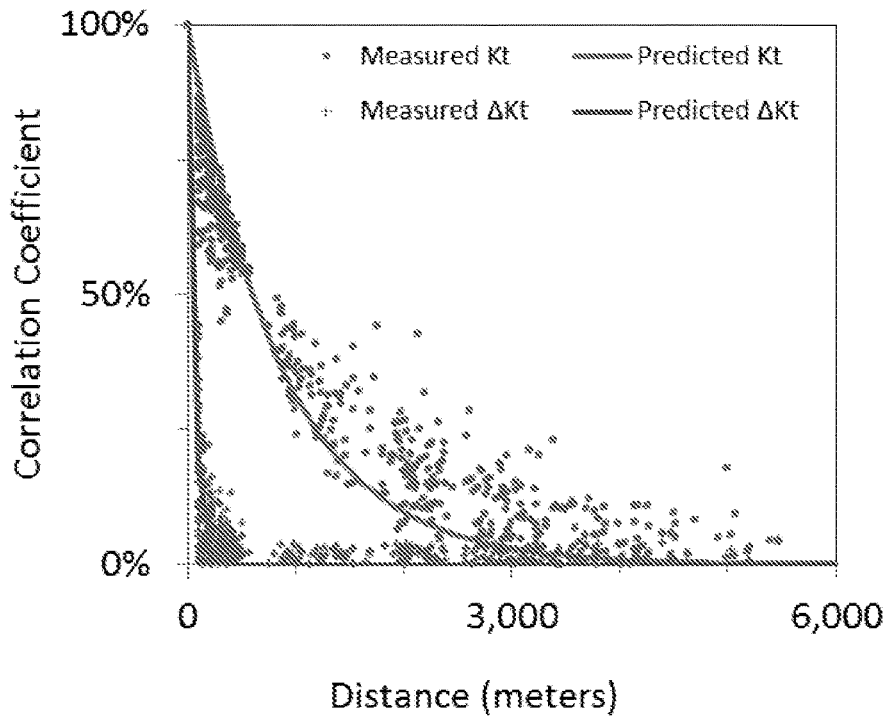
Figure 9C:
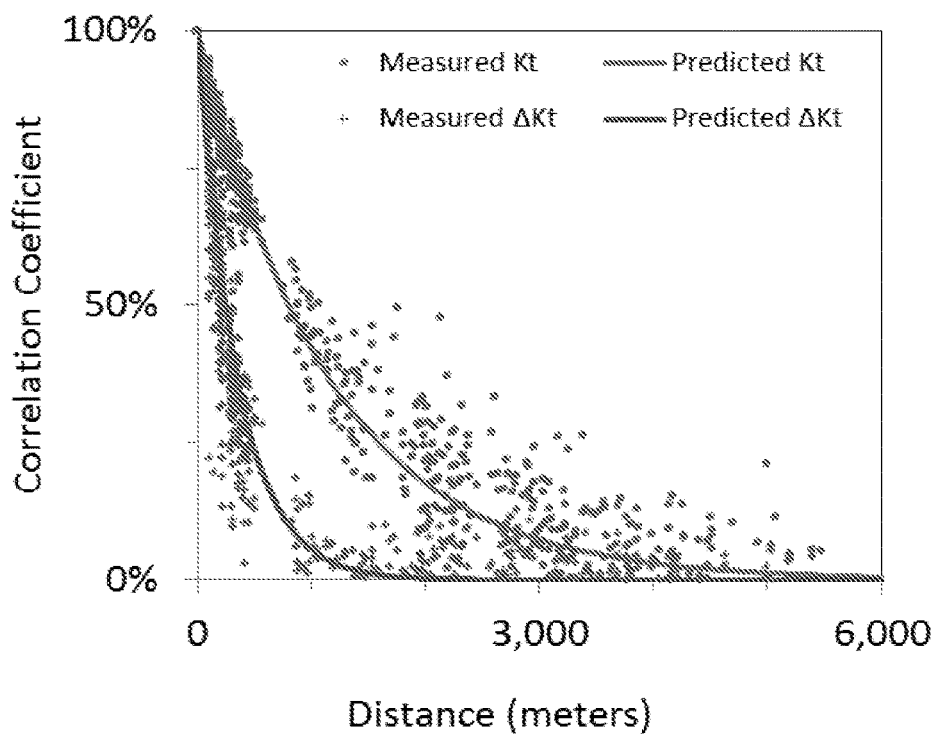
Figure 9D:
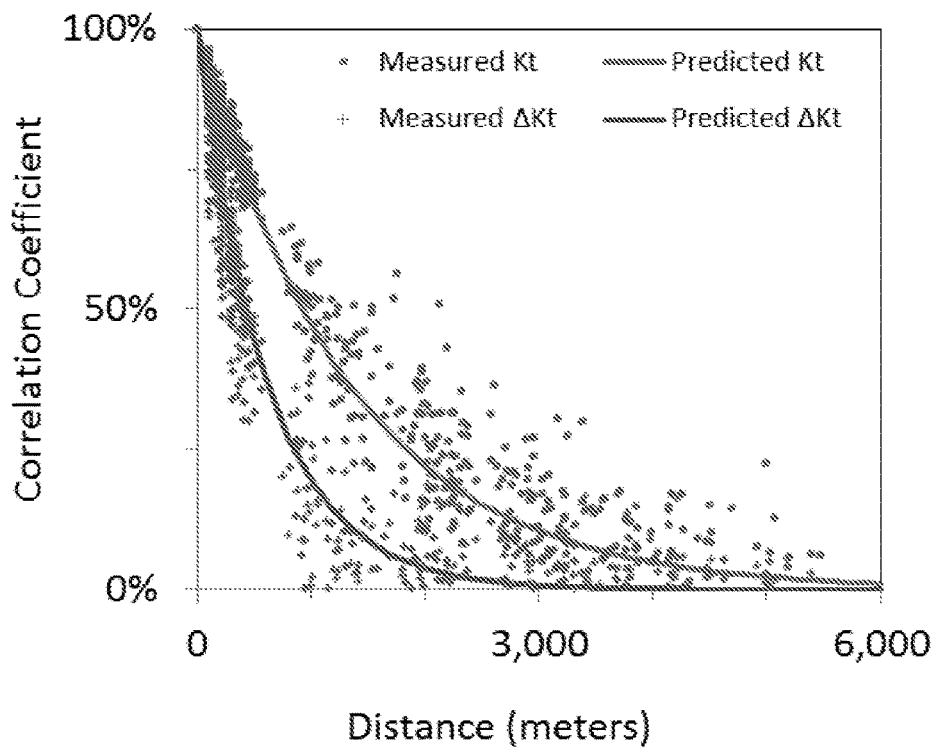
Figure 9E:
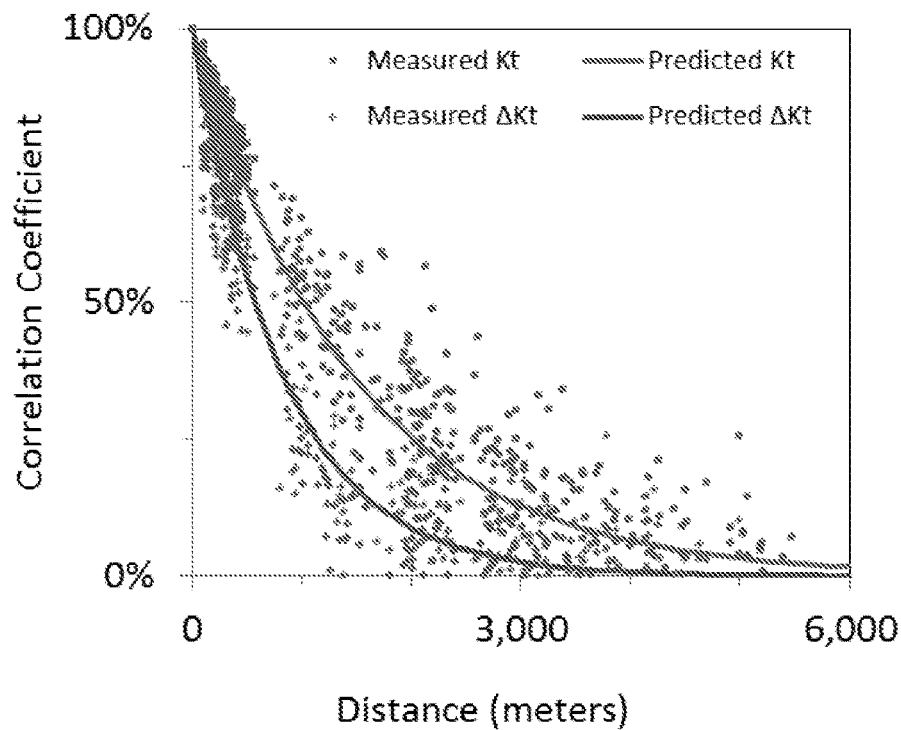
Figure 9F:
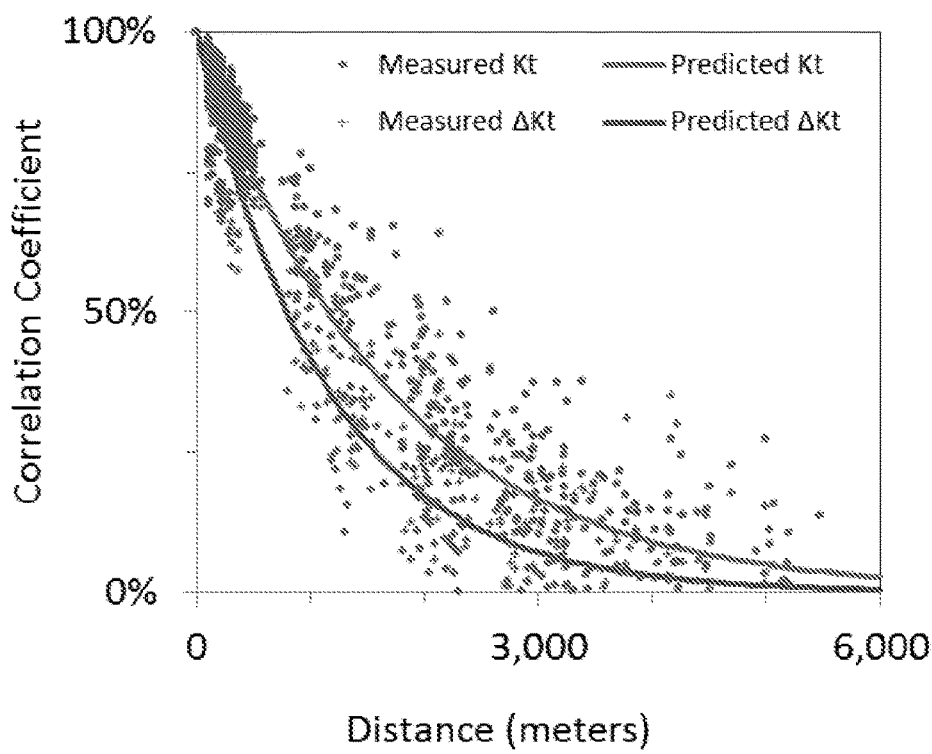
Figure 10A:
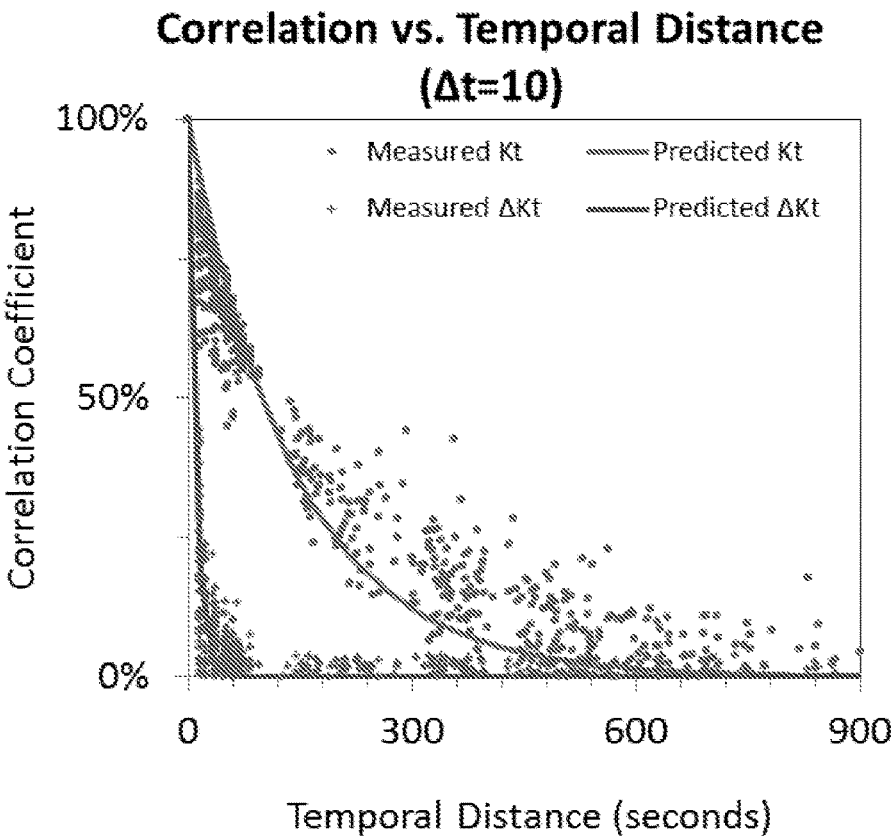
FIGS. 10A-10F are graphs depicting, by way of example, the same information as depicted in FIGS. 9A-9F versus temporal distance.
Figure 10B:
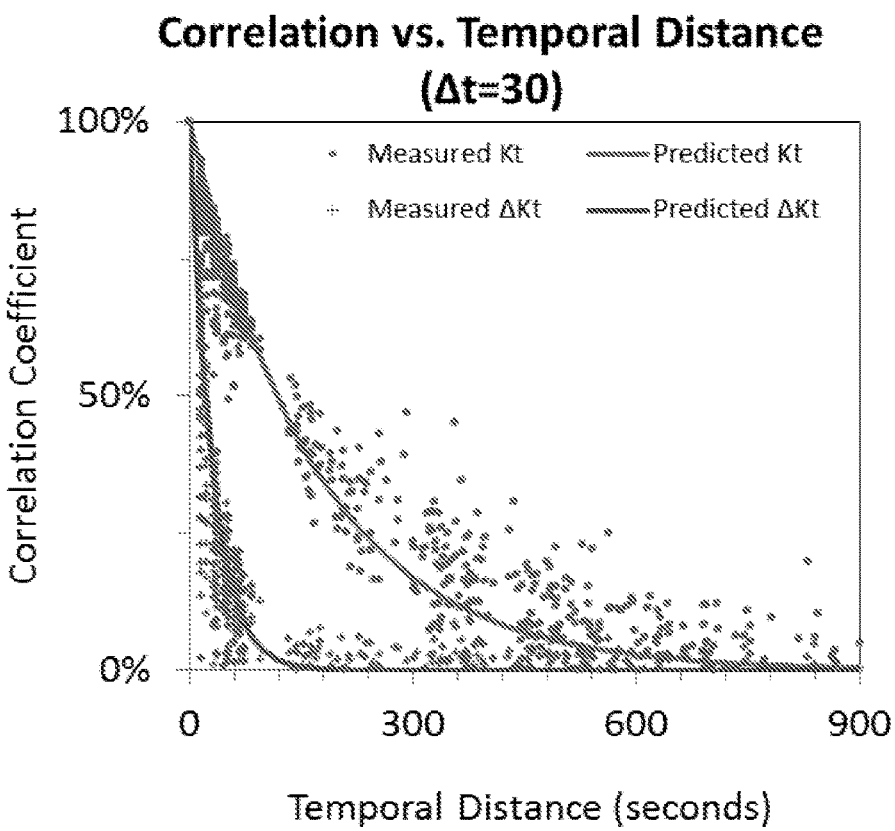
Figure 10C:
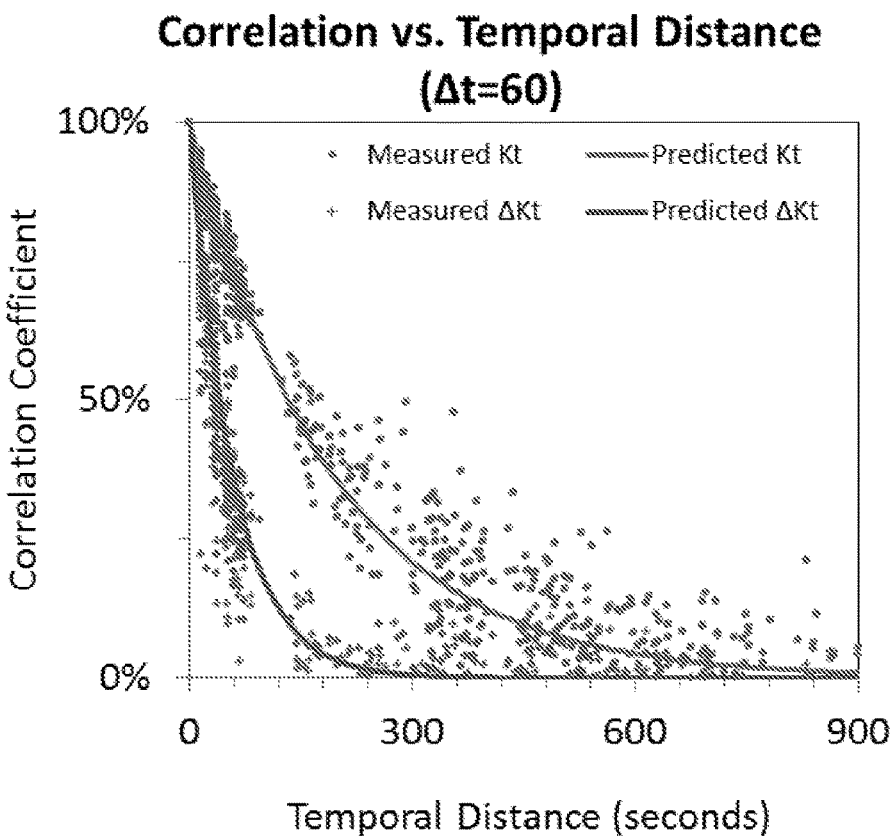
Figure 10D:
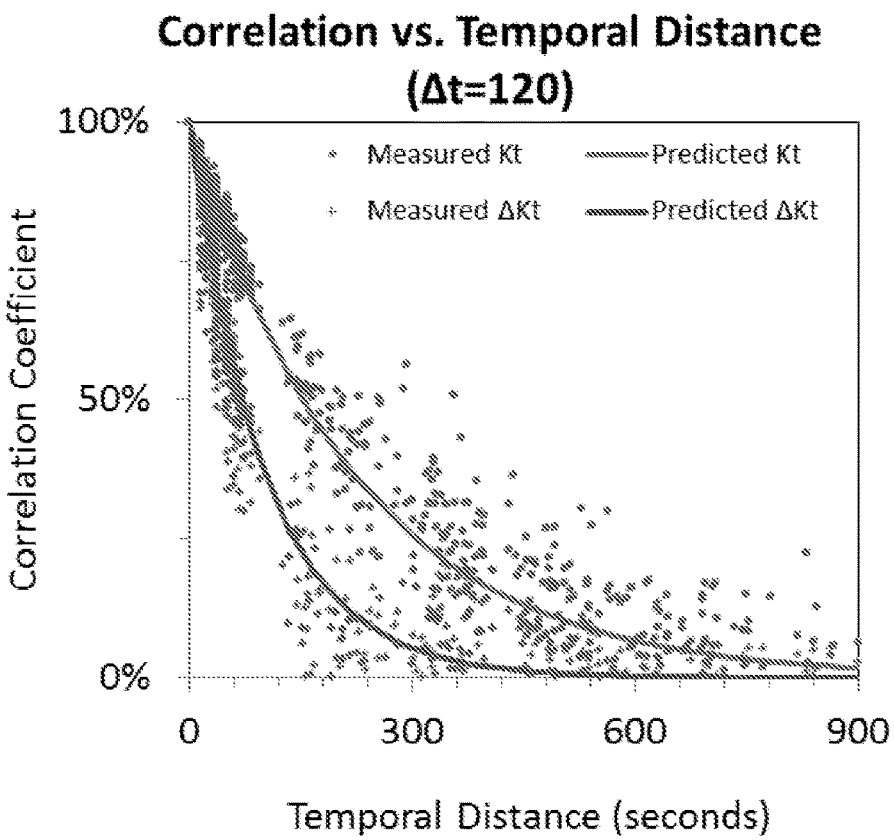
Figure 10E:
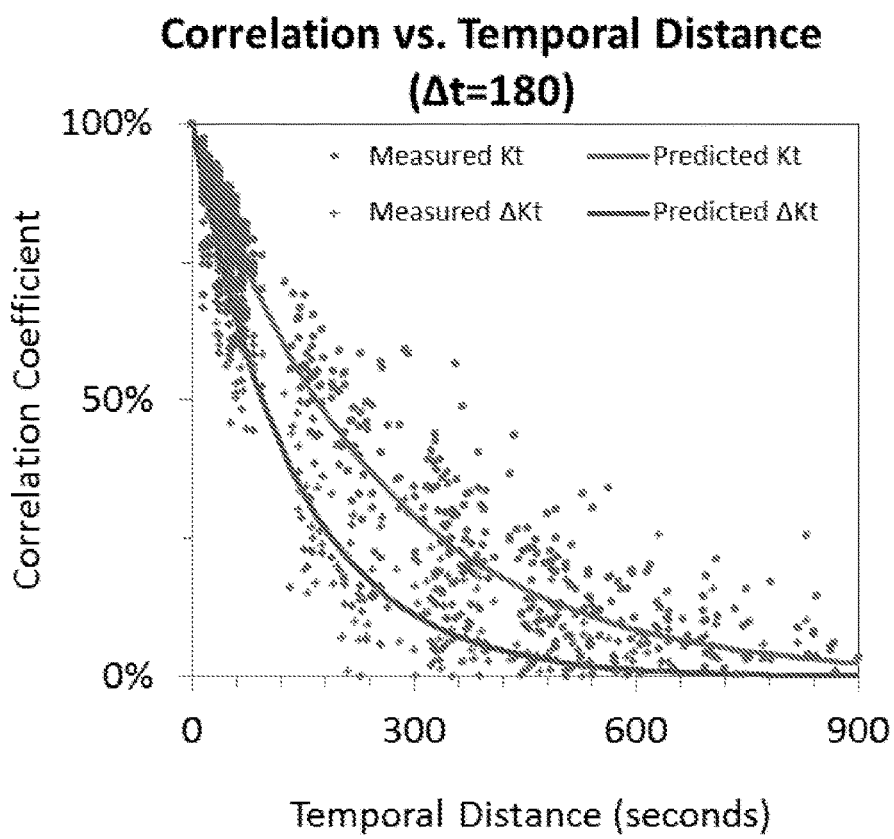
Figure 10F:
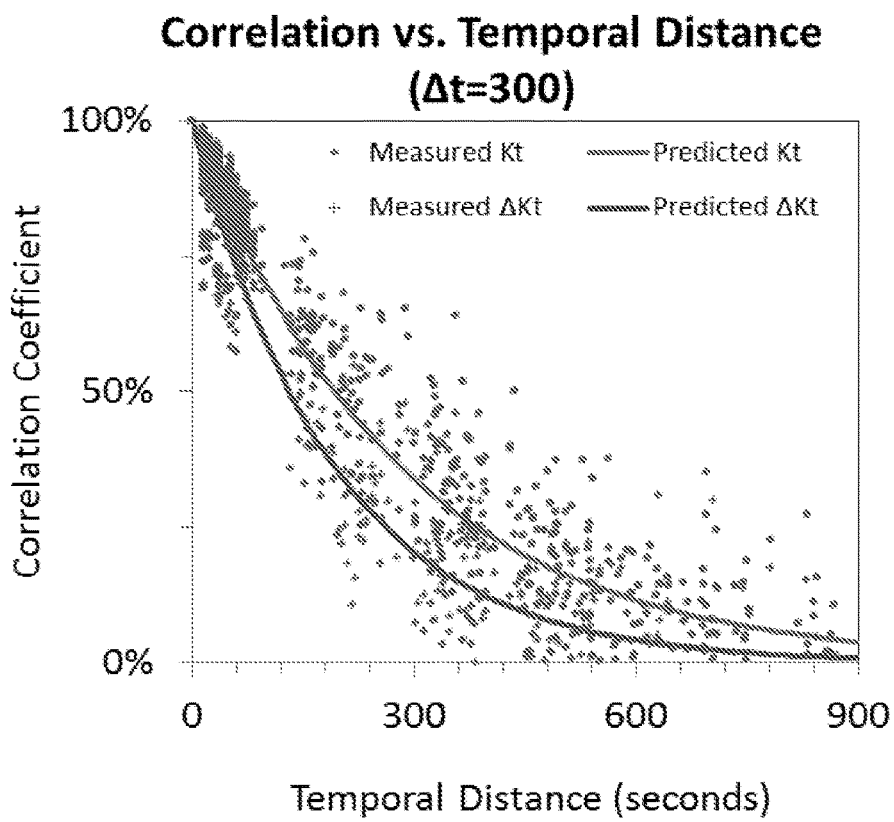
Figure 11A:
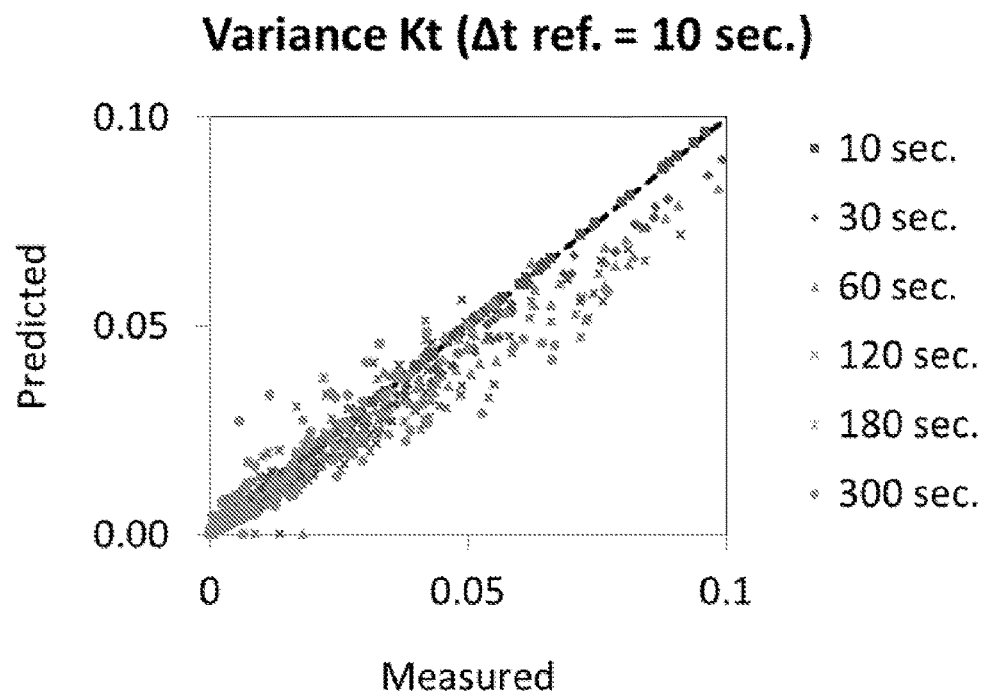
FIGS. 11A-11F are graphs depicting, by way of example, the predicted versus the measured variances of clearness indexes using different reference time intervals.
Figure 11B:
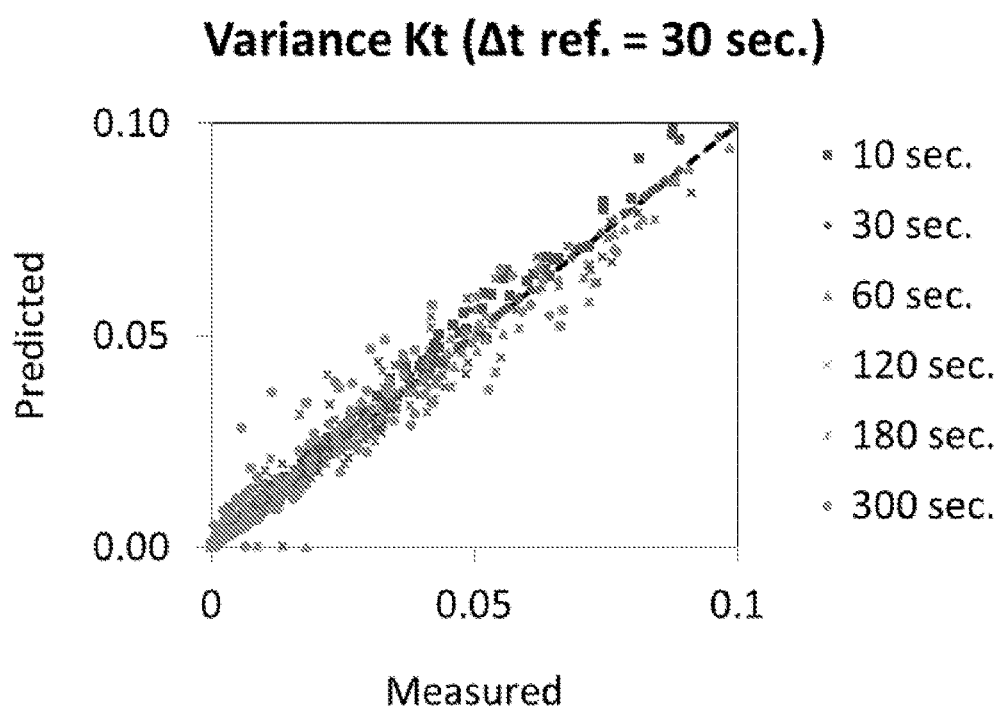
Figure 11C:
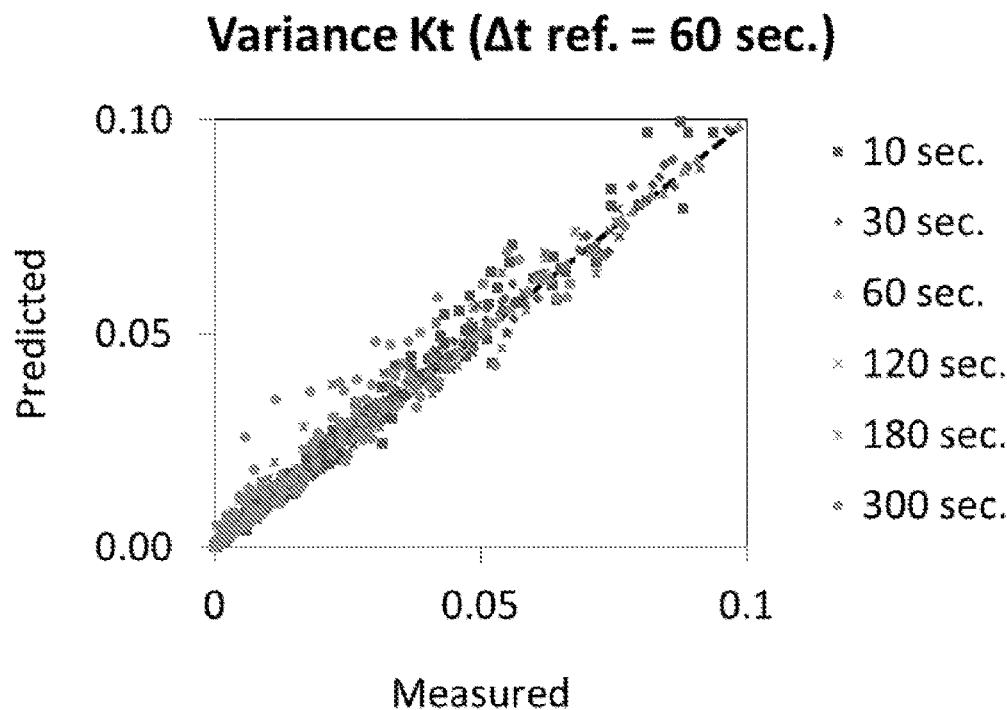
Figure 11D:
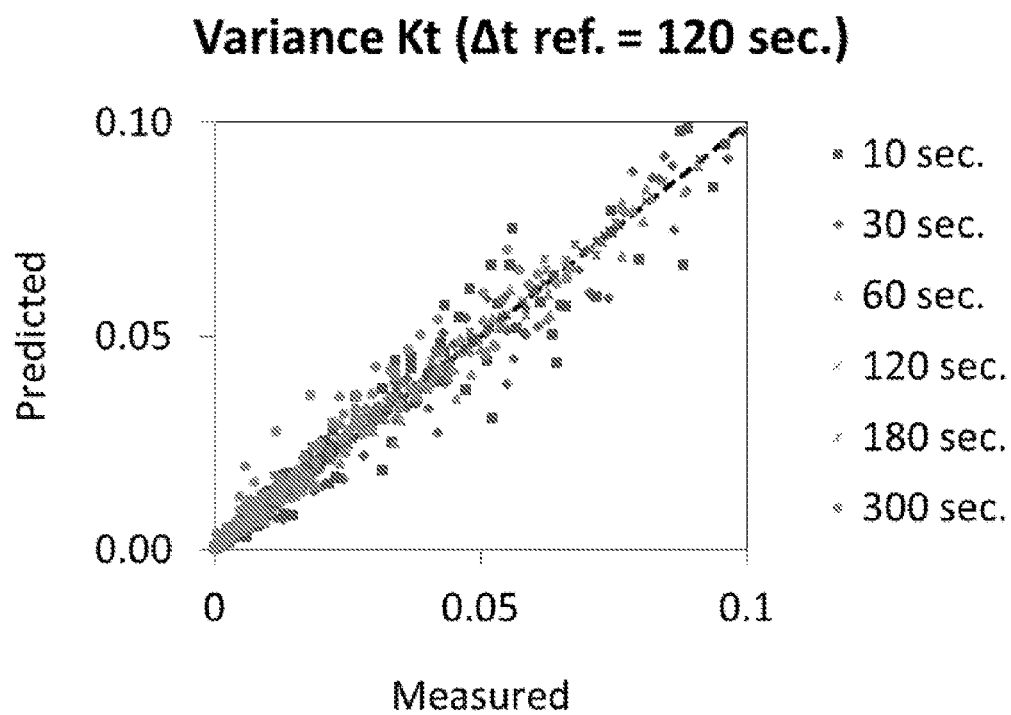
Figure 11E:
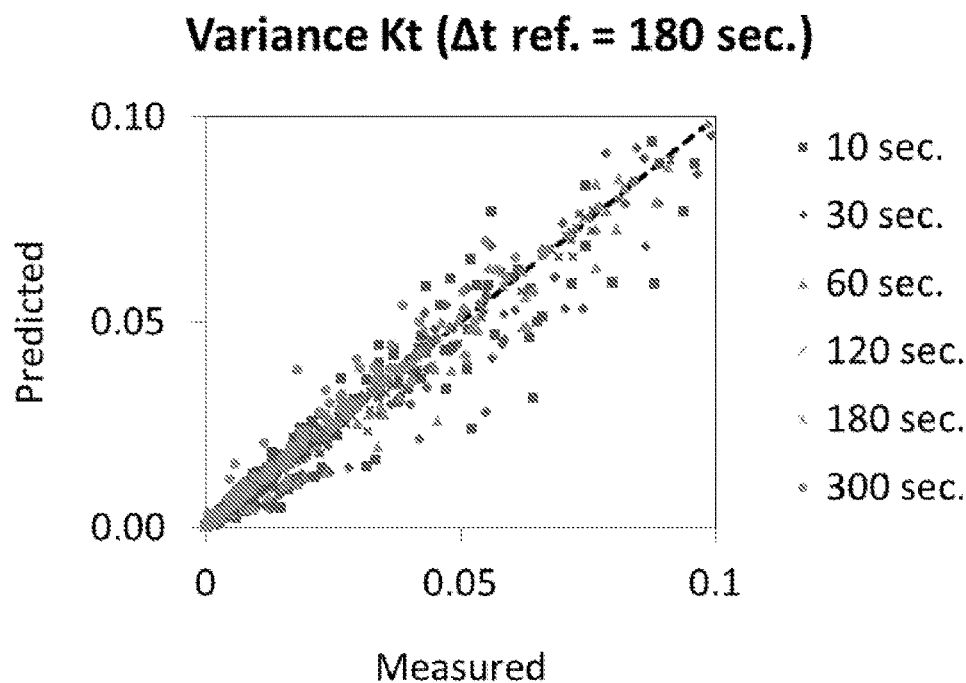
Figure 11F:
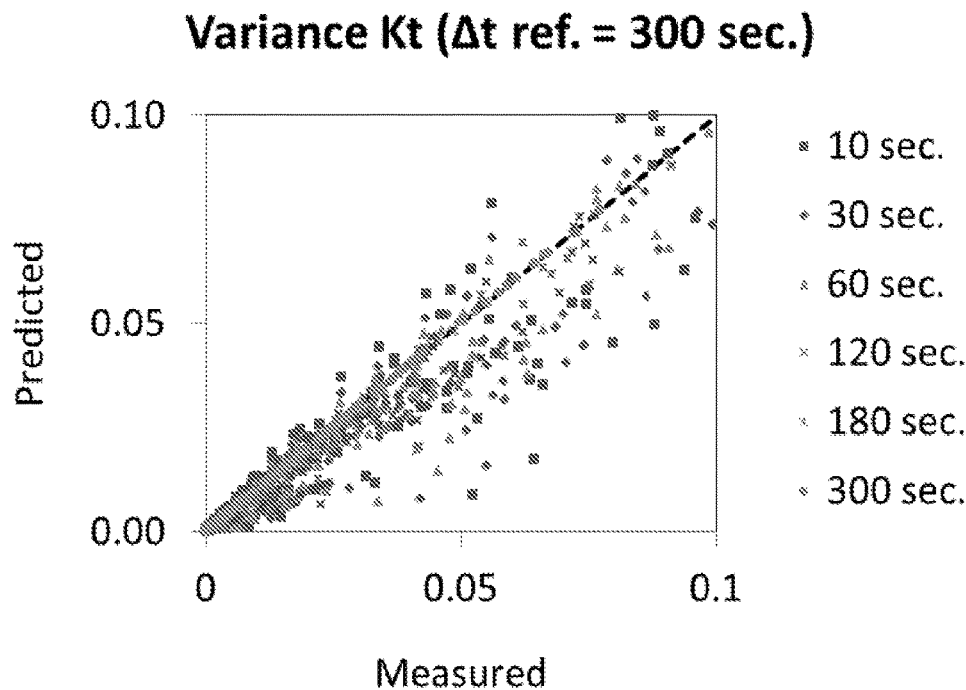
Figure 12A:
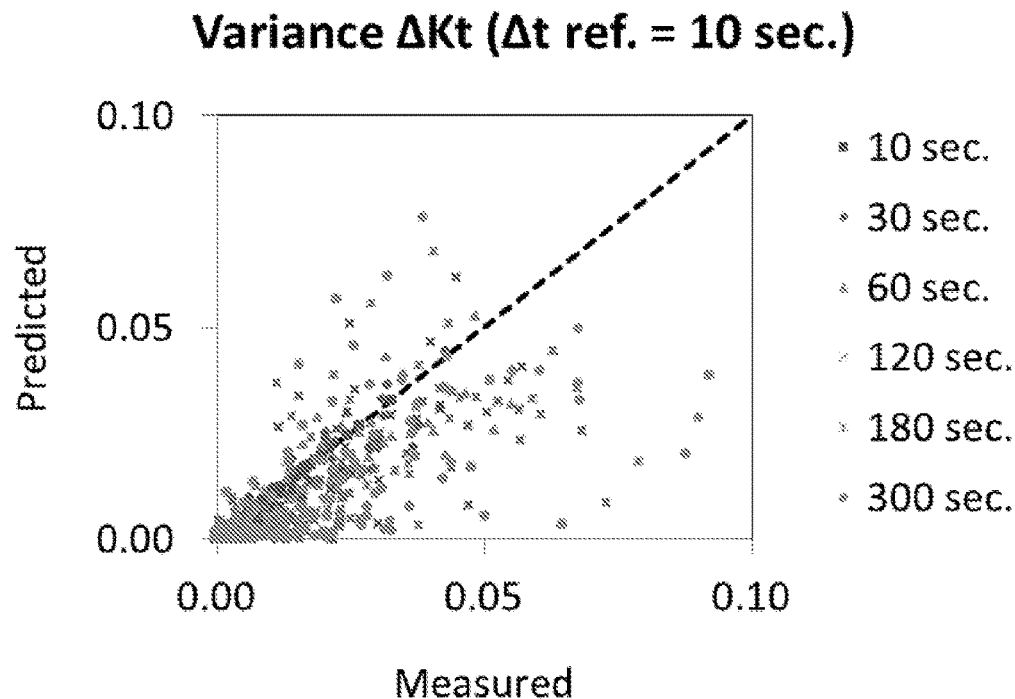
FIGS. 12A-12F are graphs depicting, by way of example, the predicted versus the measured variances of change in clearness indexes using different reference time intervals.
Figure 12B:
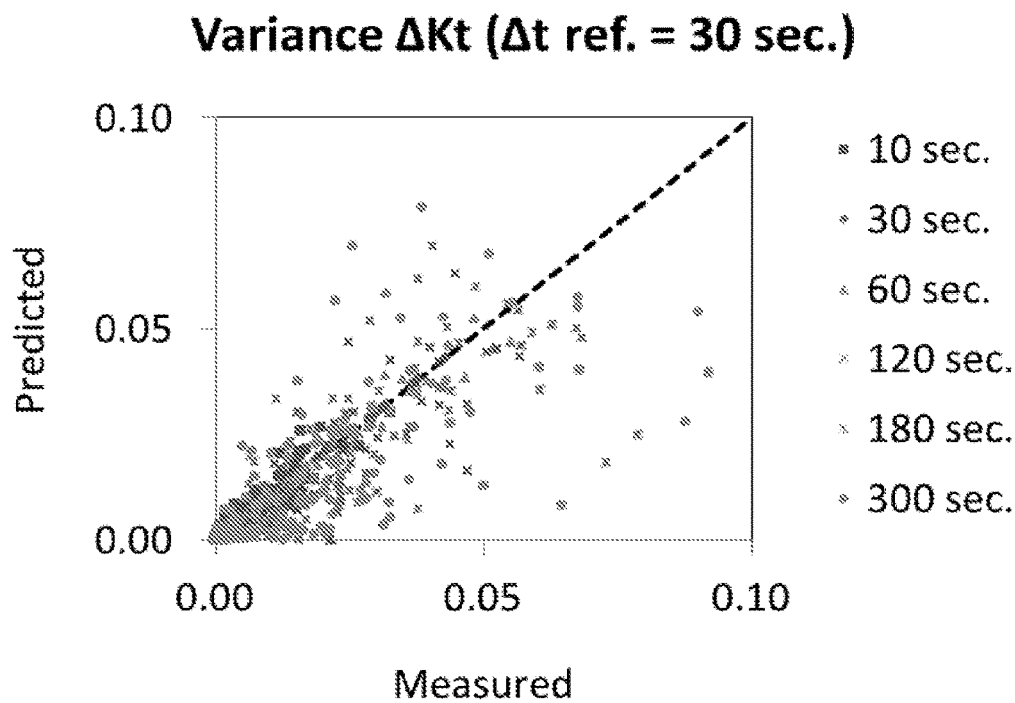
Figure 12C:
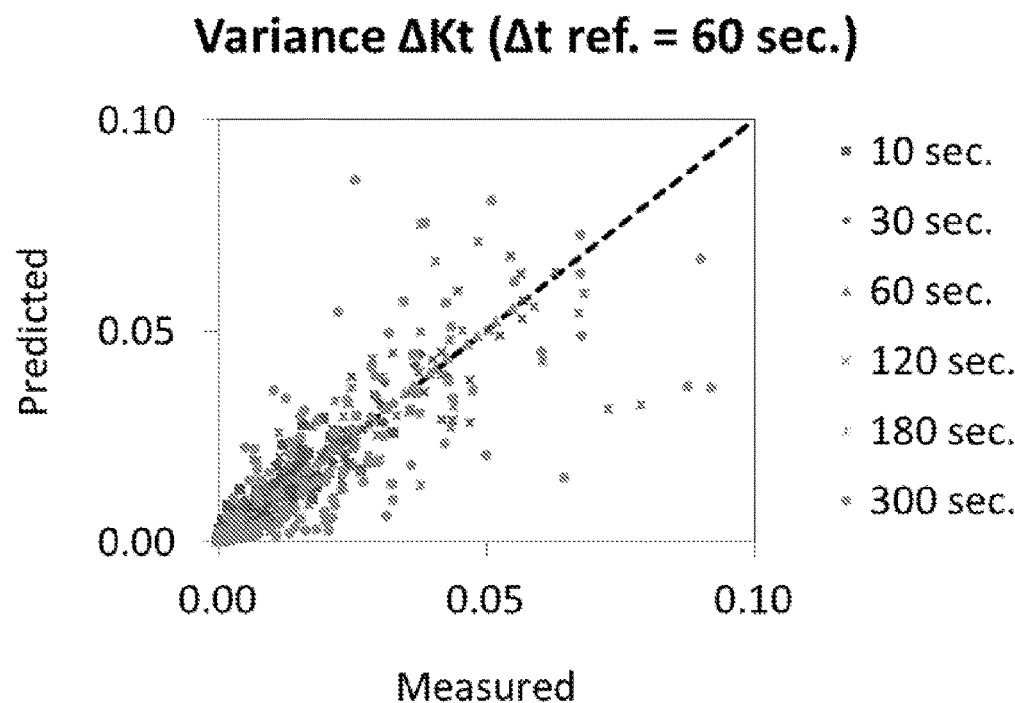
Figure 12D:
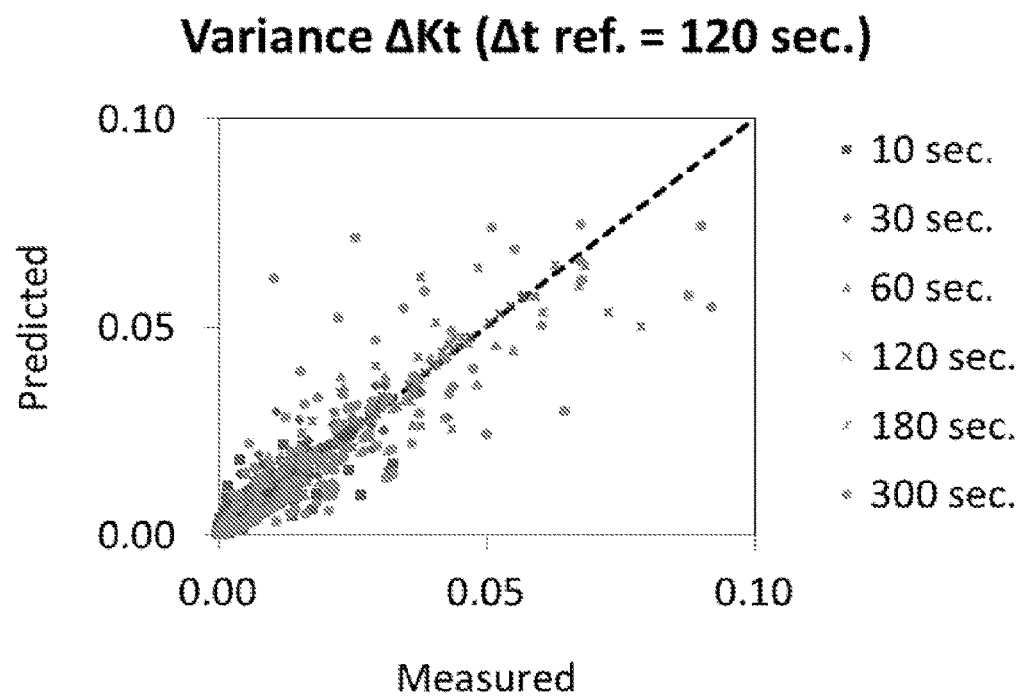
Figure 12E:
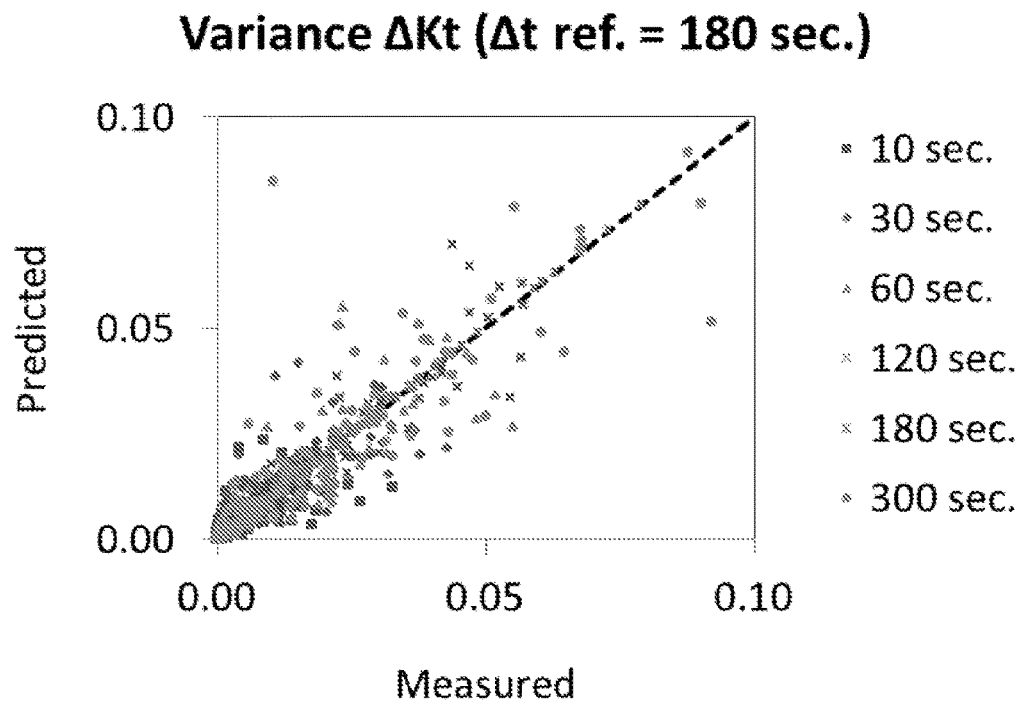
Figure 12F:
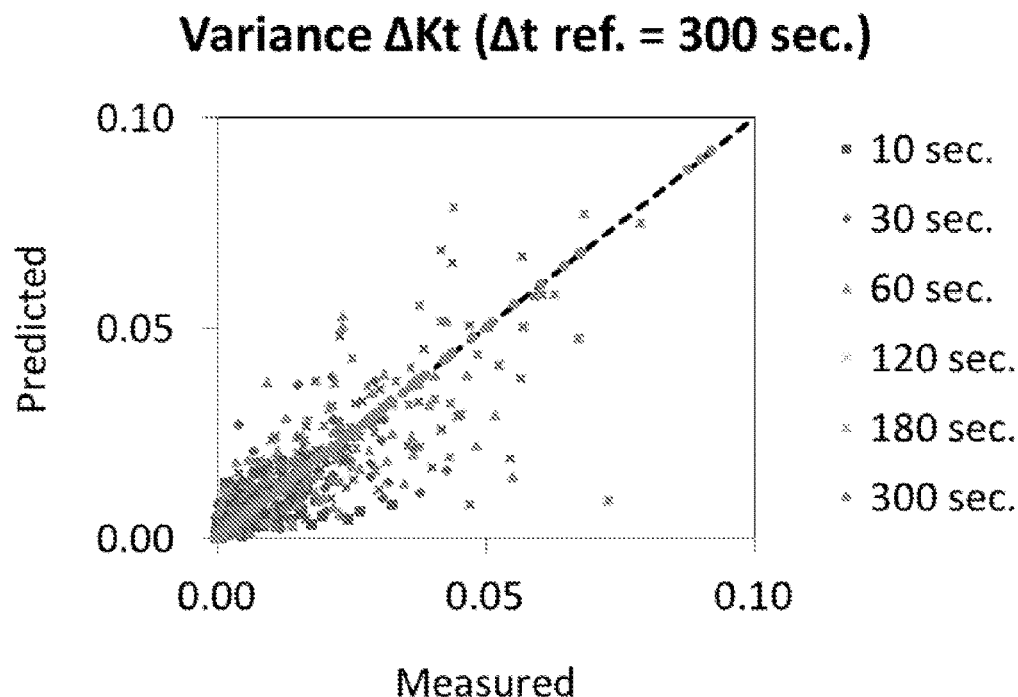

FIGS. 8A-8B are graphs depicting, by way of example, the adjustment factors plotted for time intervals from 10 seconds to 300 seconds. For example, if the variance is calculated at a 300-second time interval and the user desires results at a 10-second time interval, the adjustment for the variance clearness index would be 1.49

These empirical models represent a valuable means to rapidly calculate correlation coefficients and translate time interval with readily-available information, which avoids the use of computation-intensive calculations and high-speed streams of data from many point sources, as would otherwise be required.

Validation

Equations (44) and (45) were validated by calculating the correlation coefficients for every pair of locations in the Cordelia Junction network and the Napa network at half-hour time periods. The correlation coefficients for each time period were then weighted by the corresponding variance of that location and time period to determine weighted average correlation coefficient for each location pair. The weighting was performed as follows:

$$\overline{\rho^{Kt^i,Kt^j}} = \frac{\sum_{t=1}^{T} \sigma^2_{Kt-i,jt} \rho^{Kt^i,Kt^{jt}}}{\sum_{t=1}^{T} \sigma^2_{Kt-i,jt}}, \text{ and}$$

$$\overline{\rho^{\Delta Kt^i,\Delta Kt^j}} = \frac{\sum_{t=1}^{T} \sigma^2_{\Delta Kt-i,jt} \rho^{\Delta Kt^i,\Delta Kt^{jt}}}{\sum_{t=1}^{T} \sigma^2_{\Delta Kt-i,jt}}.$$

FIGS. 9A-9F are graphs depicting, by way of example, the measured and predicted weighted average correlation coefficients for each pair of locations versus distance. FIGS. 10A-10F are graphs depicting, by way of example, the same information as depicted in FIGS. 9A-9F versus temporal distance, based on the assumption that cloud speed was 6 meters per second. The upper line and dots appearing in close proximity to the upper line present the clearness index and the lower line and dots appearing in close proximity to the lower line present the change in clearness index for time intervals from 10 seconds to 5 minutes. The symbols are the measured results and the lines are the predicted results.

Several observations can be drawn based on the information provided by the FIGS. 9A-9F and FIGS. 10A-10F. First, for a given time interval, the correlation coefficients for both the clearness index and the change in the clearness index follow an exponential decline pattern versus distance (and temporal distance). Second, the predicted results are a good representation of the measured results for both the correlation coefficients and the variances, even though the results are for two separate networks that vary in size by a factor of 100. Third, the change in the clearness index correlation coefficient converges to the clearness correlation coefficient as the time interval increases. This convergence is predicted based on the form of the empirical model because $\Delta ClearnessPower$ approaches one as $\Delta t$ becomes large.

Equations (46) and (47) were validated by calculating the average variance of the clearness index and the variance of the change in the clearness index across the 25 locations in each network for every half-hour time period. FIGS. 11A-11F are graphs depicting, by way of example, the predicted versus the measured variances of clearness indexes using different reference time intervals. FIGS. 12A-12F are graphs depicting, by way of example, the predicted versus the measured variances of change in clearness indexes using different reference time intervals. FIGS. 11A-11F and FIGS. 12A-12F suggest that the predicted results are similar to the measured results.

Discussion

The point-to-point correlation coefficients calculated using the empirical forms described supra refer to the locations of specific photovoltaic power production sites. Importantly, note that the data used to calculate these coefficients was not obtained from time sequence measurements taken at the points themselves. Rather, the coefficients were calculated from fleet-level data (cloud speed), fixed fleet data (distances between points), and user-specified data (time interval).

The empirical relationships of the foregoing types of empirical relationships may be used to rapidly compute the coefficients that are then used in the fundamental mathematical relationships. The methodology does not require that these specific empirical models be used and improved models will become available in the future with additional data and analysis.

Example

This section provides a complete illustration of how to apply the methodology using data from the Napa network of 25 irradiance sensors on Nov. 21, 2010. In this example, the sensors served as proxies for an actual 1-kW photovoltaic fleet spread evenly over the geographical region as defined by the sensors. For comparison purposes, a direct measurement approach is used to determine the power of this fleet and the change in power, which is accomplished by adding up the 10-second output from each of the sensors and normalizing the output to a 1-kW system. FIGS. 13A-13F are graphs and a diagram depicting, by way of example, application of the methodology described herein to the Napa network.

Figure 13A:
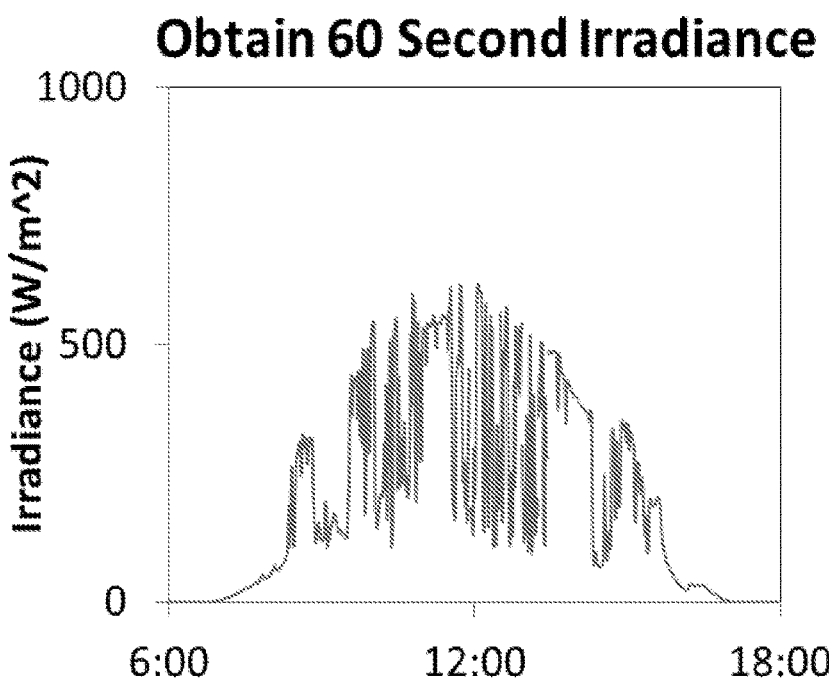
FIGS. 13A-13F are graphs and a diagram depicting, by way of example, application of the methodology described herein to the Napa network.
Figure 13B:
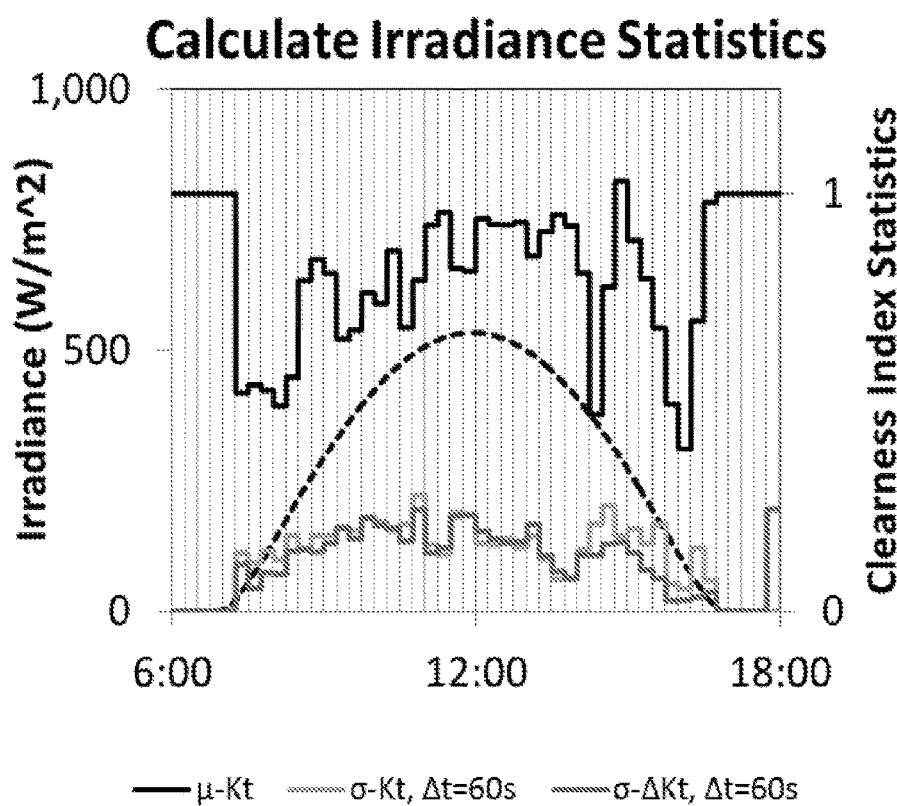
Figure 13C:
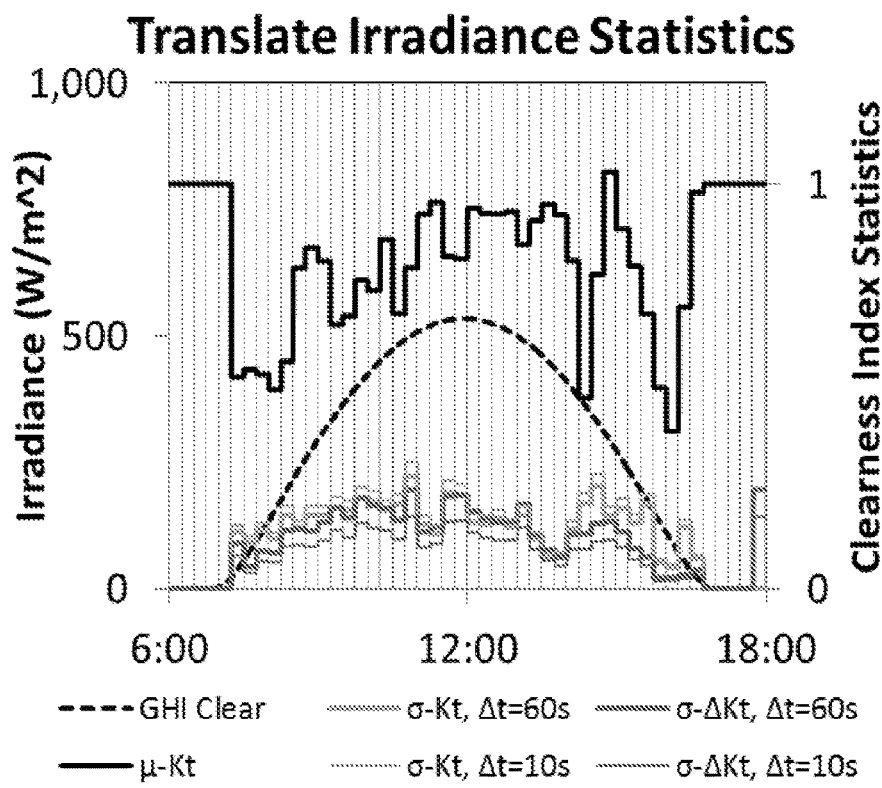
Figure 13D:
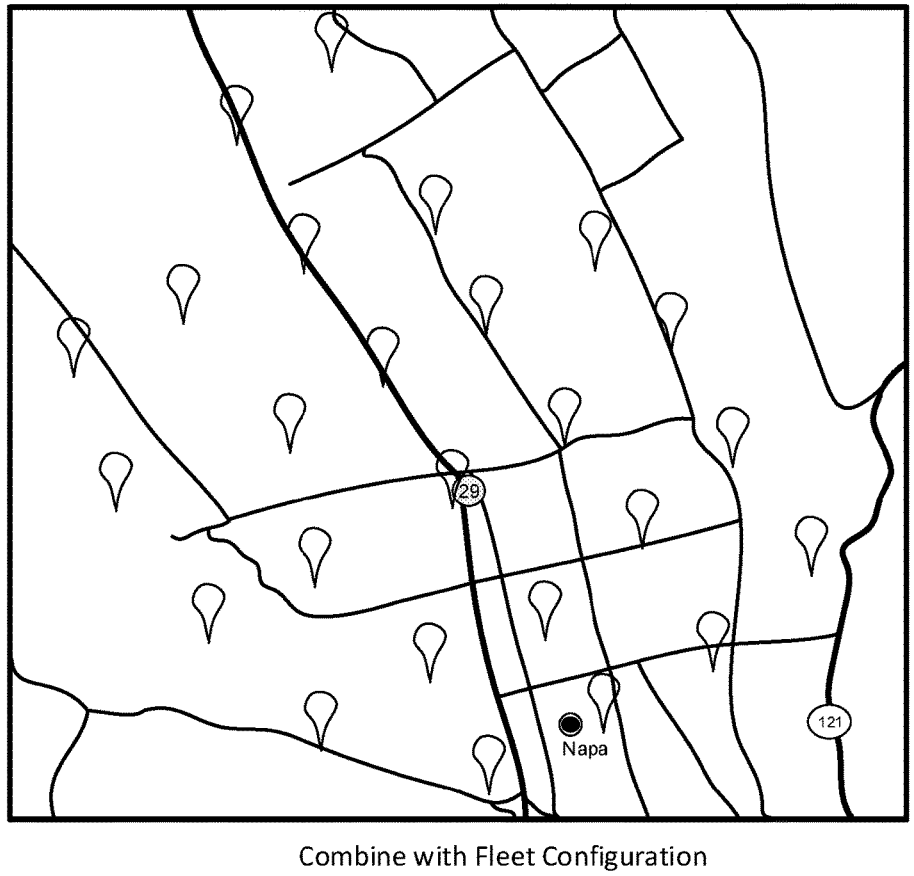
Figure 13E:
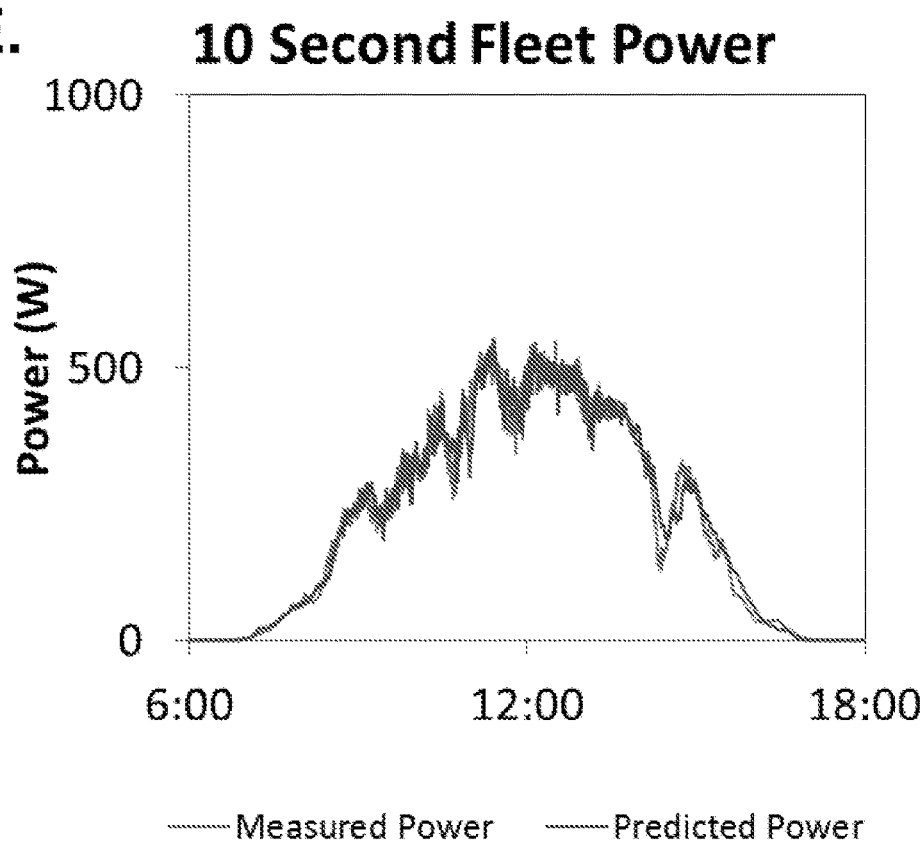
Figure 13F:
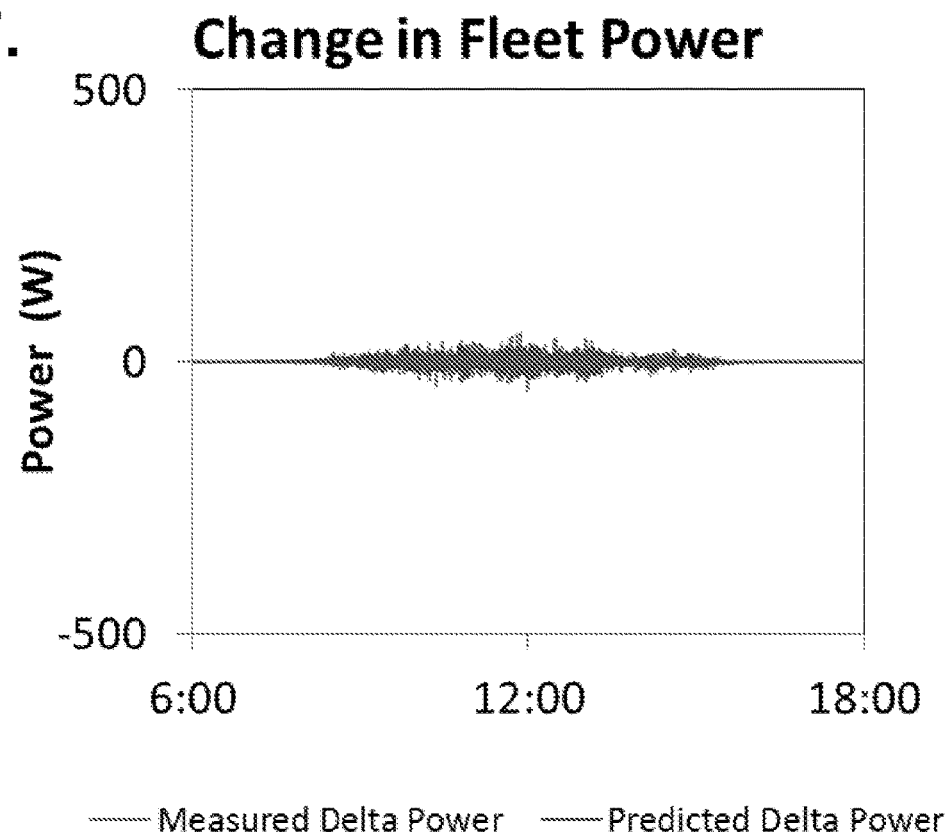

The predicted behavior of the hypothetical photovoltaic fleet was separately estimated using the steps of the methodology described supra. The irradiance data was measured using ground-based sensors, although other sources of data could be used, including from existing photovoltaic systems or satellite imagery. As shown in FIG. 13A, the data was collected on a day with highly variable clouds with one-minute global horizontal irradiance data collected at one of the 25 locations for the Napa network and specific 10-second measured power output represented by a blue line. This irradiance data was then converted from global horizontal irradiance to a clearness index. The mean clearness index, variance of clearness index, and variance of the change in clearness index was then calculated for every 15-minute period in the day. These calculations were performed for each of the 25 locations in the network. Satellite-based data or a statistically-significant subset of the ground measurement locations could have also served in place of the ground-based irradiance data. However, if the data had been collected from satellite regions, an additional translation from area statistics to average point statistics would have been required. The averaged irradiance statistics from Equations (1), (10), and (11) are shown in FIG. 13B, where standard deviation ($\sigma$) is presented, instead of variance ($\sigma^2$) to plot each of these values in the same units.

In this example, the irradiance statistics need to be translated since the data were recorded at a time interval of 60 seconds, but the desired results are at a 10-second resolution. The translation was performed using Equations (46) and (47) and the result is presented in FIG. 13C.

The details of the photovoltaic fleet configuration were then obtained. The layout of the fleet is presented in FIG. 13D. The details include the location of the each photovoltaic system (latitude and longitude), photovoltaic system rating (1/25 kW), and system orientation (all are horizontal).

Equation (43), and its associated component equations, were used to generate the time series data for the photovoltaic fleet with the additional specification of the specific empirical models, as described in Equations (44) through (47). The resulting fleet power and change in power is presented represented by the red lines in FIGS. 12E and 12F.

Probability Density Function

The conversion from area statistics to point statistics relied upon two terms $A_{Kt}$ and $A_{\Delta Kt}$ to calculate $\sigma_{Kt}^2$ and $\sigma_{\Delta Kt}^2$, respectively. This section considers these terms in more detail. For simplicity, the methodology supra applies to both Kt and $\Delta$Kt, so this notation is dropped. Understand that the correlation coefficient $\rho^{i,j}$ could refer to either the correlation coefficient for clearness index or the correlation coefficient for the change in clearness index, depending upon context. Thus, the problem at hand is to evaluate the following relationship:

$$A = \left(\frac{1}{N^2}\right) \sum_{i=1}^{N} \sum_{j=1}^{N} \rho^{i,j} \tag{48}$$

The computational effort required to calculate the correlation coefficient matrix can be substantial. For example, suppose that the one wants to evaluate variance of the sum of points within a 1 square kilometer satellite region by breaking the region into one million square meters (1,000 meters by 1,000 meters). The complete calculation of this matrix requires the examination of 1 trillion ($10^{12}$) location pair combinations.

Discrete Formulation

The calculation can be simplified using the observation that many of the terms in the correlation coefficient matrix are identical. For example, the covariance between any of the one million points and themselves is 1. This observation can be used to show that, in the case of a rectangular region that has dimension of H by W points (total of N) and the capacity is equal distributed across all parts of the region that:

$$\left(\frac{1}{N^2}\right)\sum_{i=1}^{N}\sum_{j=1}^{N}\rho^{i,j} = \left(\frac{1}{N^2}\right) \tag{49}$$

$$\left[\sum_{i=0}^{H-1}\sum_{j=0}^{i} 2^k [(H-i)(W-j)]\rho^d + \sum_{i=0}^{W-1}\sum_{j=0}^{i} 2^k [(W-i)(H-j)]\rho^d\right]$$

where:

$k = \begin{cases} -1, & \text{when } i = 0 \text{ and } j = 0 \\ 1, & \text{when } j = 0 \text{ or } j = i \\ 2, & \text{when } 0 < j < i \end{cases}$ When the region is a square, a further simplification can be made.

$$\left(\frac{1}{N^2}\right)\sum_{i=1}^{N}\sum_{j=1}^{N}\rho^{i,j} = \left(\frac{1}{N^2}\right)\left[\sum_{i=0}^{\sqrt{N}-1}\sum_{j=0}^{i} 2^k (\sqrt{N}-i)(\sqrt{N}-j)\rho^d\right] \tag{50}$$

where:

$k = \begin{cases} 0, & \text{when } i = 0 \text{ and } j = 0 \\ 2, & \text{when } j = 0 \text{ or } j = i, \text{ and} \\ 3, & \text{when } 0 < j < i \end{cases}$ $d = \left(\sqrt{i^2 + j^2}\right)\left(\frac{\sqrt{\text{Area}}}{\sqrt{N}-1}\right).$ The benefit of Equation (50) is that there are $$\frac{N - \sqrt{N}}{2}$$

rather than $N^2$ unique combinations that need to be evaluated. In the example above, rather than requiring one trillion possible combinations, the calculation is reduced to one-half million possible combinations.

Continuous Formulation

Even given this simplification, however, the problem is still computationally daunting, especially if the computation needs to be performed repeatedly in the time series. Therefore, the problem can be restated as a continuous formulation in which case a proposed correlation function may be used to simplify the calculation. The only variable that changes in the correlation coefficient between any of the location pairs is the distance between the two locations; all other variables are the same for a given calculation. As a result, Equation (50) can be interpreted as the combination of two factors: the probability density function for a given distance occurring and the correlation coefficient at the specific distance.

Figure 14:
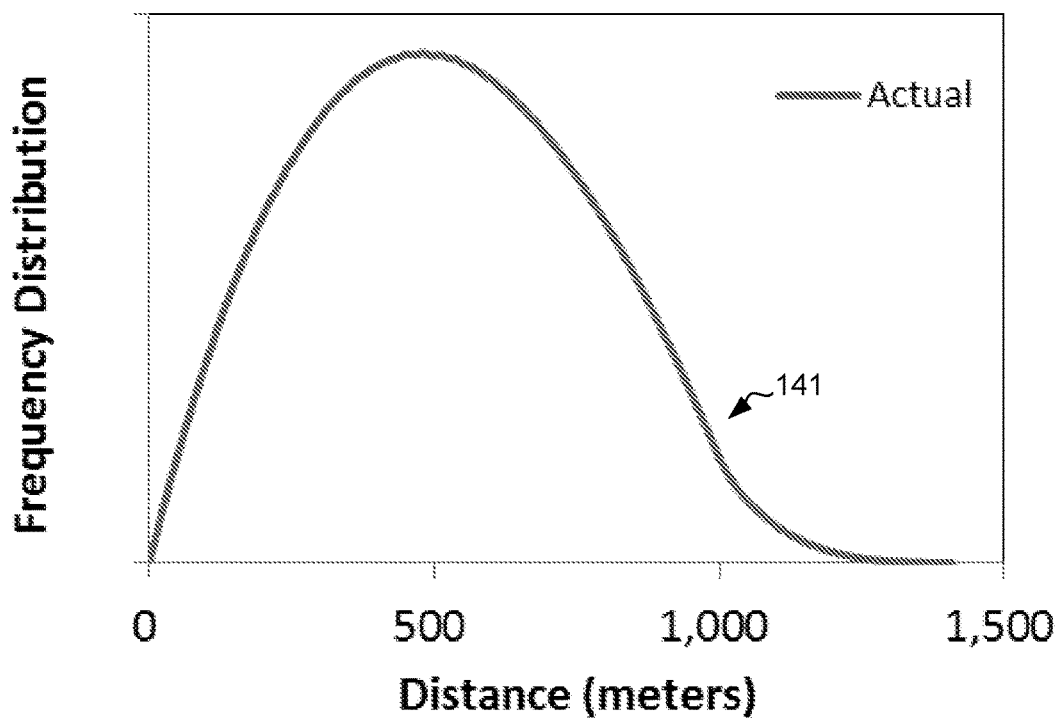
FIG. 14 is a graph depicting, by way of example, an actual probability distribution for a given distance between two pairs of locations, as calculated for a 1,000 meter×1,000 meter grid in one square meter increments.

Consider the probability density function. The actual probability of a given distance between two pairs occurring was calculated for a 1,000 meter×1,000 meter grid in one square meter increments. The evaluation of one trillion location pair combination possibilities was evaluated using Equation (48) and by eliminating the correlation coefficient from the equation. FIG. 14 is a graph depicting, by way of example, an actual probability distribution for a given distance between two pairs of locations, as calculated for a 1,000 meter×1,000 meter grid in one square meter increments.

The probability distribution suggests that a continuous approach can be taken, where the goal is to find the probability density function based on the distance, such that the integral of the probability density function times the correlation coefficient function equals:

$$A = \int f(D)\rho(d)dD \tag{51}$$

An analysis of the shape of the curve shown in FIG. 14 suggests that the distribution can be approximated through the use of two probability density functions. The first probability density function is a quadratic function that is valid between 0 and $\sqrt{\text{Area}}$.

$$f_{Quad} = \begin{cases} \left(\dfrac{6}{\text{Area}}\right)\left(D - \dfrac{D^2}{\sqrt{\text{Area}}}\right) & \text{for } 0 \leq D \leq \sqrt{\text{Area}} \\ 0 & \text{for } D > \sqrt{\text{Area}} \end{cases} \tag{52}$$

This function is a probability density function because integrating between 0 and $\sqrt{\text{Area}}$ equals 1, that is, $P[0 \leq D \leq \sqrt{\text{Area}}] = \int_0^{\sqrt{\text{Area}}} f_{Quad} dD = 1$.

The second function is a normal distribution with a mean of $\sqrt{\text{Area}}$ and standard deviation of $0.1 \sqrt{\text{Area}}$.

$$f_{Norm} = \left(\dfrac{1}{0.1 * \sqrt{\text{Area}}}\right)\left(\dfrac{1}{\sqrt{2\pi}}\right) e^{-\left(\frac{1}{2}\right)\left(\frac{D - \sqrt{\text{Area}}}{0.1 * \sqrt{\text{Area}}}\right)^2} \tag{53}$$

Likewise, integrating across all values equals 1.

To construct the desired probability density function, take, for instance, 94 percent of the quadratic density function plus 6 of the normal density function.

$$f = 0.94 \int_0^{\sqrt{\text{Area}}} f_{Quad} dD + 0.06 \int_{-\infty}^{+\infty} f_{Norm} dD \tag{54}$$

Figure 15:
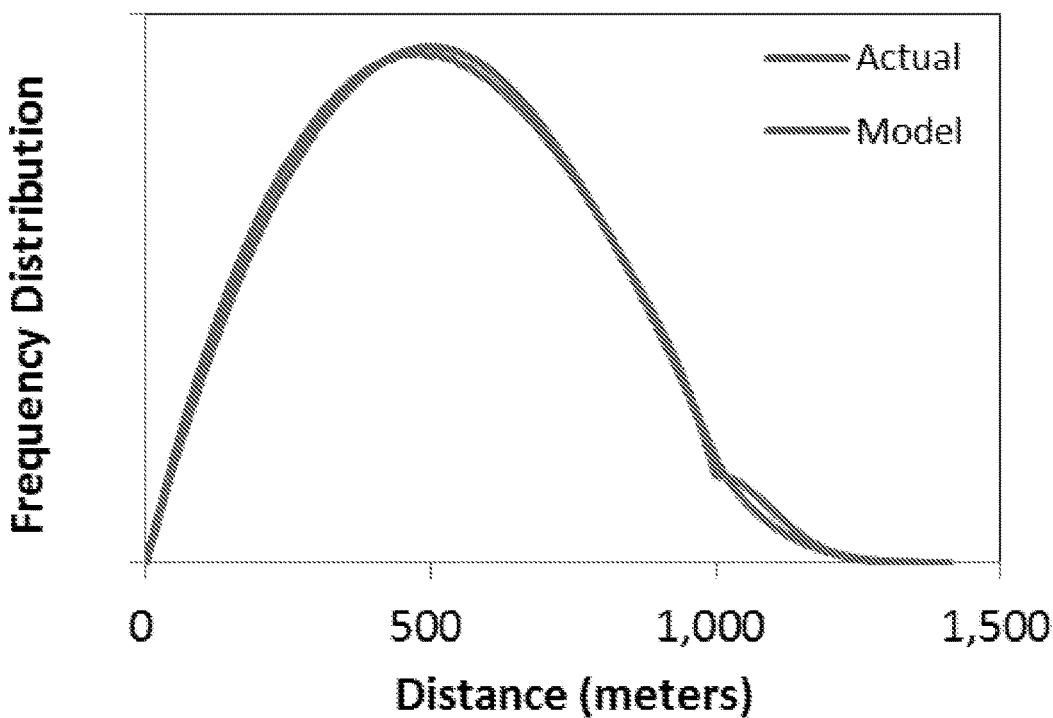
FIG. 15 is a graph depicting, by way of example, a matching of the resulting model to an actual distribution.

FIG. 15 is a graph depicting, by way of example, a matching of the resulting model to an actual distribution.

The result is that the correlation matrix of a square area with uniform point distribution as N gets large can be expressed as follows, first dropping the subscript on the variance since this equation will work for both Kt and ΔKt.

$$A \approx [0.94 \int_0^{\sqrt{\text{Area}}} f_{Quad} \rho(D) dD + 0.06 \int_{-\infty}^{+\infty} f_{Norm} \rho(D) dD] \tag{55}$$

where $\rho(D)$ is a function that expresses the correlation coefficient as a function of distance (D).

Area to Point Conversion Using Exponential Correlation Coefficient

Equation (55) simplifies the problem of calculating the correlation coefficient and can be implemented numerically once the correlation coefficient function is known. This section demonstrates how a closed form solution can be provided, if the functional form of the correlation coefficient function is exponential.

Noting the empirical results as shown in the graph in FIGS. 9A-9F, an exponentially decaying function can be taken as a suitable form for the correlation coefficient function. Assume that the functional form of correlation coefficient function equals:

$$\rho(D) = e^{\frac{xD}{\sqrt{\text{Area}}}} \tag{56}$$

Let Quad be the solution to $\int_0^{\sqrt{\text{Area}}} f_{Quad} \cdot \rho(D) \, dD$.

$$Quad = \int_0^{\sqrt{\text{Area}}} f_{Quad} \rho(D) dD = \tag{57}$$
$$\left(\dfrac{6}{\text{Area}}\right) \int_0^{\sqrt{\text{Area}}} \left(D - \dfrac{D^2}{\sqrt{\text{Area}}}\right)\left[e^{\frac{xD}{\sqrt{\text{Area}}}}\right] dD$$

Integrate to solve.

$$Quad = (6)\left[\left(\dfrac{x}{\sqrt{\text{Area}}} D - 1\right) e^{\frac{xD}{\sqrt{\text{Area}}}} - \tag{58}\right.$$
$$\left.\left(\left(\dfrac{x}{\sqrt{\text{Area}}}\right)^2 D^2 - 2\dfrac{x}{\sqrt{\text{Area}}} D + 2\right) e^{\frac{xD}{\sqrt{\text{Area}}}}\right]$$

Complete the result by evaluating at D equal to $\sqrt{\text{Area}}$ for the upper bound and 0 for the lower bound. The result is:

$$Quad = \left(\dfrac{6}{x^3}\right)[(x-2)(e^x + 1) + 4] \tag{59}$$

Next, consider the solution to $\int_{-\infty}^{\infty} f_{Norm} \cdot \rho(D) \, dD$, which will be called Norm.

$$Norm = \left(\dfrac{1}{\sigma}\right)\left(\dfrac{1}{\sqrt{2\pi}}\right) \int_{-\infty}^{+\infty} e^{-\left(\frac{1}{2}\right)\left(\frac{D-\mu}{\sigma}\right)^2} e^{\frac{xD}{\sqrt{\text{Area}}}} dD \tag{60}$$

where $\mu = \sqrt{\text{Area}}$ and $\sigma = 0.1 \sqrt{\text{Area}}$. Simplifying:

$$Norm = \left[e^{\frac{x}{\sqrt{\text{Area}}}\left(\mu + \frac{1}{2}\frac{x}{\sqrt{\text{Area}}}\sigma^2\right)}\right] \tag{61}$$
$$\left(\dfrac{1}{\sigma}\right)\left(\dfrac{1}{\sqrt{2\pi}}\right) \int_{-\infty}^{+\infty} e^{-\left(\frac{1}{2}\right)\left[\frac{D-\left(\mu + \frac{x}{\sqrt{\text{Area}}}\sigma^2\right)}{\sigma}\right]^2} dD$$

Substitute $$Z = \dfrac{D - \left(\mu + \dfrac{x}{\sqrt{\text{Area}}}\sigma^2\right)}{\sigma} \text{ and } \sigma dz = dD.$$

$$Norm = \left[e^{\frac{x}{\sqrt{\text{Area}}}\left(\mu + \frac{1}{2}\frac{x}{\sqrt{\text{Area}}}\sigma^2\right)}\right]\left(\dfrac{1}{\sqrt{2\pi}}\right) \int_{-\infty}^{+\infty} e^{-\left(\frac{1}{2}\right)z^2} dz \tag{62}$$

Integrate and solve.

$$\text{Norm} = e^{\frac{x}{\sqrt{\text{Area}}}\left(\mu + \frac{1}{2}\frac{x}{\sqrt{\text{Area}}}\sigma^2\right)} \quad (63)$$

Substitute the mean of $\sqrt{\text{Area}}$ and the standard deviation of $0.1\sqrt{\text{Area}}$ into Equation (55).

$$\text{Norm} = e^{x(1+0.005x)} \quad (64)$$

Substitute the solutions for Quad and Norm back into Equation (55). The result is the ratio of the area variance to the average point variance. This ratio was referred to as A (with the appropriate subscripts and superscripts) supra.

$$A = 0.94\left(\frac{6}{x^3}\right)[(x-2)(e^x+1)+4] + 0.06e^{x(1+0.005x)} \quad (65)$$

Example

This section illustrates how to calculate A for the clearness index for a satellite pixel that covers a geographical surface area of 1 km by 1 km (total area of 1,000,000 m²), using a 60-second time interval, and 6 meter per second cloud speed. Equation (56) required that the correlation coefficient be of the form $$e^{\frac{xD}{\sqrt{\text{Area}}}}.$$

The empirically derived result in Equation (44) can be rearranged and the appropriate substitutions made to show that the correlation coefficient of the clearness index equals $$\exp\left[\frac{(\ln\Delta t - 9.3)D}{1000\ \text{CloudSpeed}}\right].$$

Multiply the exponent by $$\frac{\sqrt{\text{Area}}}{\sqrt{\text{Area}}},$$

so that the correlation coefficient equals $$\exp\left\{\left[\frac{(\ln\Delta t - 9.3)\sqrt{\text{Area}}}{1000\ \text{CloudSpeed}}\right]\left[\frac{D}{\sqrt{\text{Area}}}\right]\right\}.$$

This expression is now in the correct form to apply Equation (65), where $$x = \frac{(\ln\Delta t - 9.3)\sqrt{\text{Area}}}{1000\ \text{CloudSpeed}}.$$

Figure 16:
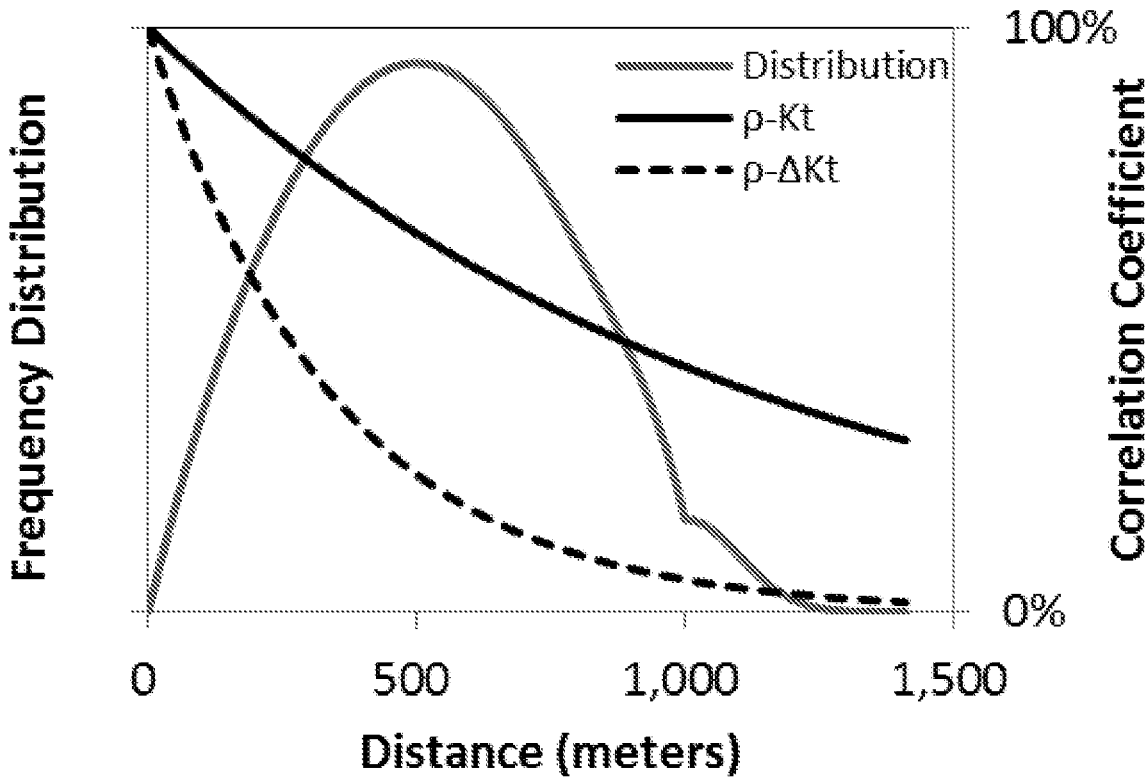
FIG. 16 is a graph depicting, by way of example, results generated by application of Equation (65).

Inserting the assumptions results in $$x = \frac{(\ln 60 - 9.3)\sqrt{1{,}000{,}000}}{1000 \times 6} = -0.86761,$$

which is applied to Equation (65). The result is that A equals 65 percent, that is, the variance of the clearness index of the satellite data collected over a 1 km² region corresponds to 65 percent of the variance when measured at a specific point. A similar approach can be used to show that the A equals 27 percent for the change in clearness index. FIG. 16 is a graph depicting, by way of example, results generated by application of Equation (65).

Time Lag Correlation Coefficient

This section presents an alternative approach to deriving the time lag correlation coefficient. The variance of the sum of the change in the clearness index equals:

$$\sigma_{\Sigma\Delta Kt}^2 = \text{VAR}[\Sigma(Kt^{\Delta t} - Kt)] \quad (66)$$

where the summation is over N locations. This value and the corresponding subscripts have been excluded for purposes of notational simplicity.

Divide the summation into two parts and add several constants to the equation:

$$\sigma_{\Sigma\Delta Kt}^2 = \text{VAR}\left[\sigma_{\Sigma Kt^{\Delta t}}\left(\frac{\sum Kt^{\Delta t}}{\sigma_{\Sigma Kt^{\Delta t}}}\right) - \sigma_{\Sigma Kt}\left(\frac{\sum Kt}{\sigma_{\Sigma Kt}}\right)\right] \quad (67)$$

Since $\sigma_{\Sigma Kt^{\Delta t}} \approx \sigma_{\Sigma Kt}$ (or $\sigma_{\Sigma Kt^{\Delta t}} = \sigma_{\Sigma Kt}$ if the first term in Kt and the last term in $Kt^{\Delta t}$ are the same):

$$\sigma_{\Sigma\Delta Kt}^2 = \sigma_{\Sigma Kt}^2 \text{VAR}\left[\frac{\sum Kt^{\Delta t}}{\sigma_{\Sigma Kt^{\Delta t}}} - \frac{\sum Kt}{\sigma_{\Sigma Kt}}\right] \quad (68)$$

The variance term can be expanded as follows:

$$\sigma_{\Sigma\Delta Kt}^2 = \quad (69)$$

$$\sigma_{\Sigma Kt}^2\left\{\frac{\text{VAR}[\sum Kt^{\Delta t}]}{\sigma_{\Sigma Kt^{\Delta t}}^2} + \frac{\text{VAR}[\sum Kt]}{\sigma_{\Sigma Kt}^2} - \frac{2\text{COV}[\sum Kt, \sum Kt^{\Delta t}]}{\sigma_{\Sigma Kt}\sigma_{\Sigma Kt^{\Delta t}}}\right\}$$

Since $$\text{COV}\left[\sum Kt, \sum Kt^{\Delta t}\right] = \sigma_{\Sigma Kt}\sigma_{\Sigma Kt^{\Delta t}}\rho^{\Sigma Kt, \Sigma Kt^{\Delta t}},$$

the first two terms equal one and the covariance term is replaced by the correlation coefficient.

$$\sigma_{\Sigma\Delta Kt}^2 = 2\sigma_{\Sigma Kt}^2\left(1 - \rho^{\Sigma Kt, \Sigma Kt^{\Delta t}}\right) \quad (70)$$

This expression rearranges to:

$$\rho^{\Sigma Kt, \Sigma Kt^{\Delta t}} = 1 - \frac{1}{2}\frac{\sigma_{\Sigma\Delta Kt}^2}{\sigma_{\Sigma Kt}^2} \quad (71)$$

Assume that all photovoltaic plant ratings, orientations, and area adjustments equal to one, calculate statistics for the clearness alone using the equations described supra and then substitute. The result is:

$$\rho^{\Sigma Kt, \Sigma Kt^{\Delta t}} = 1 - \frac{P^{\Delta Kt}\sigma^2_{\overline{\Delta Kt}}}{2P^{Kt}\sigma^2_{\overline{Kt}}} \qquad (72)$$

Relationship Between Time Lag Correlation Coefficient and Power/Change in Power Correlation Coefficient This section derives the relationship between the time lag correlation coefficient and the correlation between the series and the change in the series for a single location.

$$\rho^{P,\Delta P} = \frac{\text{COV}[P, \Delta P]}{\sqrt{\sigma^2_P \sigma^2_{\Delta P}}} = \frac{\text{COV}[P, P^{\Delta t} - P]}{\sqrt{\sigma^2_P \sigma^2_{\Delta P}}} = \frac{\text{COV}[P, P^{\Delta t}] - \sigma^2_P}{\sqrt{\sigma^2_P \sigma^2_{\Delta P}}}$$

Since $$\sigma^2_{\Delta P} = \text{VAR}[P^{\Delta t} - P] = \sigma^2_P + \sigma^2_{P^{\Delta t}} - 2\text{COV}[P, P^{\Delta t}] \text{ and COV}[P, P^{\Delta t}] =$$

$$\rho^{P,P^{\Delta t}} \sqrt{\sigma^2_P \sigma^2_{P^{\Delta t}}},$$

then $\rho^{P,\Delta P} = \dfrac{\rho^{P,P^{\Delta t}} \sqrt{\sigma^2_P \sigma^2_{P^{\Delta t}}} - \sigma^2_P}{\sqrt{\sigma^2_P(\sigma^2_P + \sigma^2_{P^{\Delta t}} - 2\rho^{P,P^{\Delta t}} \sqrt{\sigma^2_P \sigma^2_{P^{\Delta t}}})}}.$ Since $\sigma_P^2 \approx \sigma_{P^{\Delta t}}^2$, this expression can be further simplified. Then, square both expression and solve for the time lag correlation coefficient:

$$\rho^{P,P^{\Delta t}} = 1 - 2(\rho^{P,\Delta P})^2$$

Correlation Coefficients Between Two Regions

Assume that the two regions are squares of the same size, each side with N points, that is, a matrix with dimensions of $\sqrt{N}$ by $\sqrt{N}$ points, where $\sqrt{N}$ is an integer, but are separated by one or more regions. Thus:

$$\sum_{i=1}^{N}\sum_{j=1}^{N}\left(\frac{1}{N^2}\right)\rho^{i,j} = \left(\frac{1}{N^2}\right)\left[\sum_{i=0}^{\sqrt{N}-1}\sum_{j=1-\sqrt{N}}^{\sqrt{N}-1} k(\sqrt{N}-i)(\sqrt{N}-|j|)\rho^d\right] \qquad (73)$$

where $k = \begin{cases} 1 & \text{when } i = 0 \\ 2 & \text{when } i > 0 \end{cases}$, $$d = \left(\sqrt{i^2 + (j + M\sqrt{N})^2}\right)\left(\frac{\sqrt{\text{Area}}}{\sqrt{N}-1}\right),$$

and M equals the number of regions.

Figure 17:
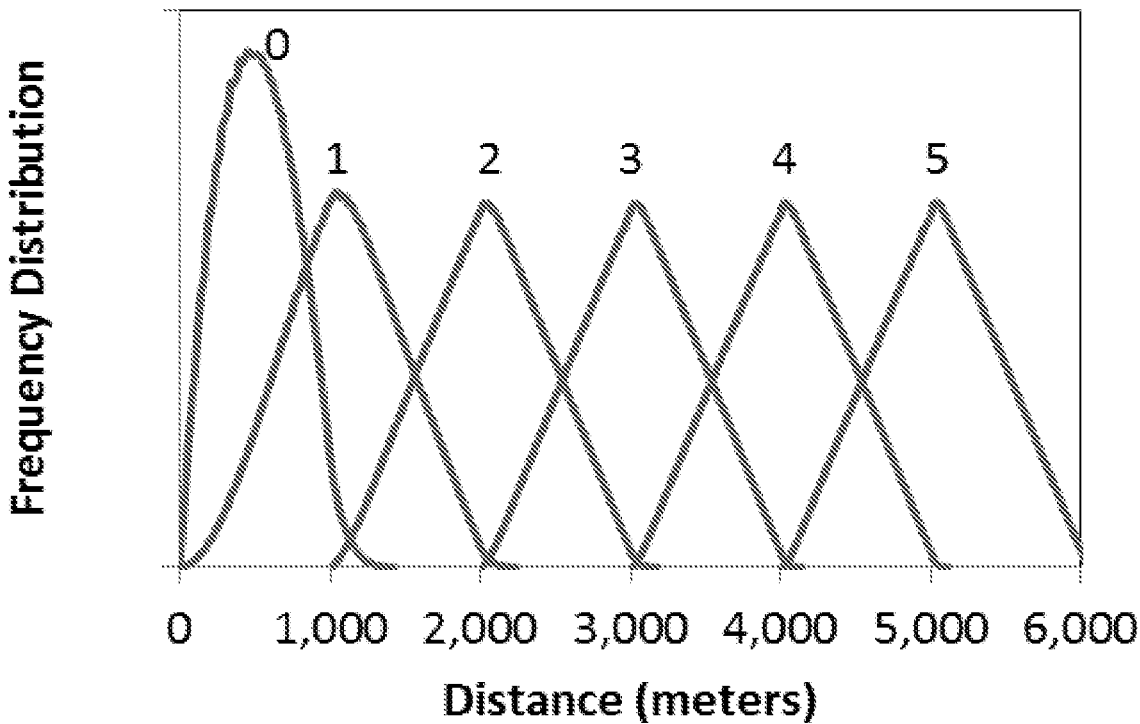
FIG. 17 is a graph depicting, by way of example, the probability density function when regions are spaced by zero to five regions.

FIG. 17 is a graph depicting, by way of example, the probability density function when regions are spaced by zero to five regions. FIG. 17 suggests that the probability density function can be estimated using the following distribution:

$$f = \begin{cases} 1 - \left(\dfrac{\text{Spacing} - D}{\sqrt{\text{Area}}}\right) & \text{for Spacing} - \sqrt{\text{Area}} \leq D \leq \text{Spacing} \\ 1 + \left(\dfrac{\text{Spacing} - D}{\sqrt{\text{Area}}}\right) & \text{for Spacing} \leq D \leq \text{Spacing} + \sqrt{\text{Area}} \\ 0 & \text{all else} \end{cases} \qquad (74)$$

Figure 18:
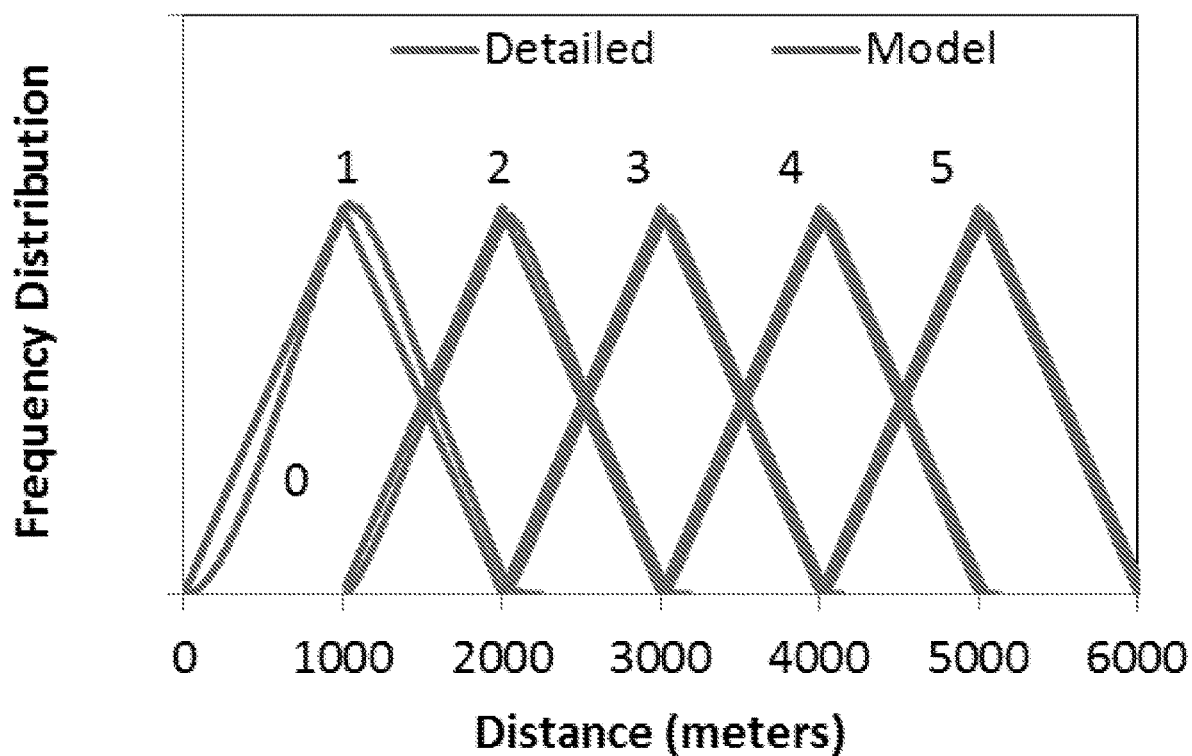
FIG. 18 is a graph depicting, by way of example, results by application of the model.

This function is a probability density function because the integration over all possible values equals zero. FIG. 18 is a graph depicting, by way of example, results by application of this model.

Inferring Photovoltaic System Configuration Specifications

Accurate power output forecasting through photovoltaic power prediction models, such as described supra, requires equally precise solar irradiance data and photovoltaic system configuration specifications. Solar irradiance data can be obtained from ground-based measurements, satellite imagery, numerical weather prediction models, as well as through various reliable third party sources, such as the Solar Anywhere service (http://www.SolarAnywhere.com), a Web-based service operated by Clean Power Research, L.L.C., Napa, Calif., that can provide satellite-derived solar irradiance data forecasted up to seven days ahead of time and archival solar irradiance data, dating back to Jan. 1, 1998, at time resolutions of as fast as one minute for historical data up to several hours forecasted and then transitioning to a one-hour time resolution up to seven days ahead of time.

On the other hand, obtaining accurate and reliable photovoltaic plant configuration specifications for individual photovoltaic systems can be a challenge, particularly when the photovoltaic systems are part of a geographically dispersed power generation fleet. Part of the concern arises due to an increasing number of grid-connected photovoltaic systems that are privately-owned residential and commercial systems, where they are neither controlled nor accessible by grid operators and power utilities, who require precise configuration specifications for planning and operations purposes or whether they are privately-owned utility-scale systems for which specifications are unavailable. Moreover, in some situations, the configuration specifications may be either incorrect, incomplete or simply not available.

Figure 19:
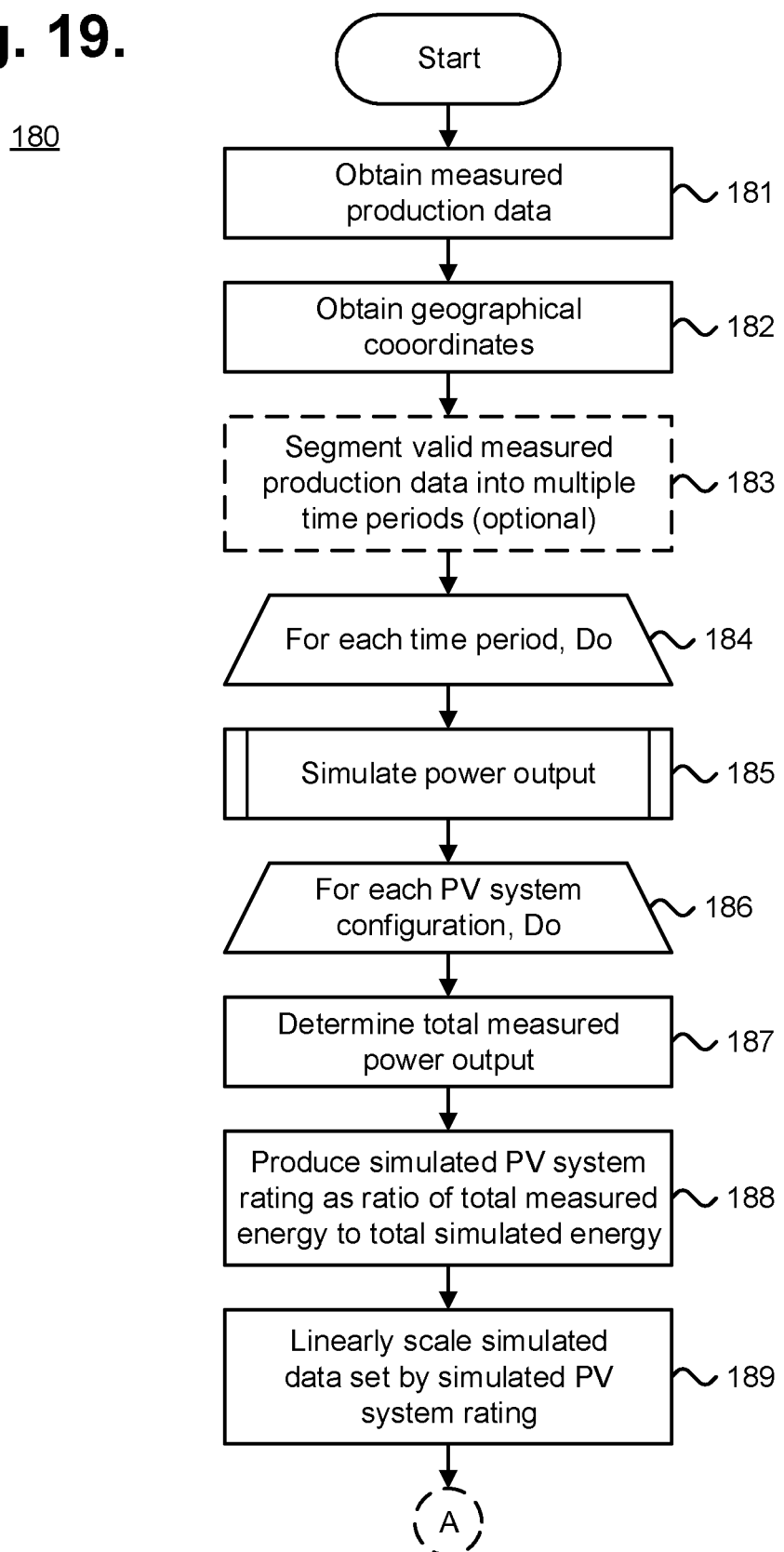
FIG. 19 is a flow diagram showing a computer-implemented method for inferring operational specifications of a photovoltaic power generation system in accordance with a further embodiment.

Photovoltaic plant configuration specifications can be accurately inferred through analysis of historical measurements of the photovoltaic plant's production data and measured historical irradiance data. FIG. 19 is a flow diagram showing a computer-implemented method 180 for inferring operational specifications of a photovoltaic power generation system 25 (shown in FIG. 2) in accordance with a further embodiment. Configuration data include the plant's power rating and electrical characteristics, including the effect of the efficiency of the modules, wiring, inverter, and other factors; and operational features, including tracking mode (fixed, single-axis tracking, dual-axis tracking), azimuth angle, tilt angle, row-to-row spacing, tracking rotation limit, and shading or other physical obstructions. The method 180 can be implemented in software and execution of the software can be performed on a computer system 21, such as described supra with reference to FIG. 2, as a series of process or method modules or steps.

Shading and Physical Obstructions

Physical obstructions can prevent irradiance from reaching a photovoltaic system. Moreover, quantifying the effect of physical obstructions can be challenging. First, the horizon is continuous and obstructions occur in a continuous format; however, conventional photovoltaic production simulation software typically requires obstructions to be modeled in a discrete format. Suppose, for example, that a user states that an obstruction "has a 30° obstruction elevation angle in the 'south' direction." This information is insufficient to model the effect of the obstruction with the software. Does "south" refer to an azimuth angle ranging from 179° to 181° or to an azimuth angle ranging from 165° to 195°? Does the obstruction block all direct irradiance, like a building, or does the obstruction only block a portion of direct irradiance, as would a tree with no leaves? Instead, the user must specify the azimuth range (or the azimuth bin) and the obstruction's opacity for the software to properly model the effect of the obstruction on photovoltaic production.

In one embodiment, shading and physical obstructions can be evaluated by specifying obstructions as part of a system's configuration specification. For instance, an obstruction could be initially defined at an azimuth angle between 265° and 275° with a 10° elevation (tilt) angle. Additional configuration specifications would vary the azimuth and elevation angles by fixed amounts, thereby exercising the range of possible obstruction scenarios.

In a further embodiment, a two-step approach can be used to quantify the effect of obstructions on diffuse and direct irradiance. Combining the effect of obstructions by performing the two steps, as discussed in detail infra, results in an equivalent shading and physical obstruction profile that can be used with the system's configuration specification when forecasting photovoltaic production.

Physical obstructions can block both direct and diffuse irradiance from reaching a photovoltaic system. Direct irradiance is the portion of the irradiance that reaches a photovoltaic array by traveling on a straight line from the sun to the array's surface, whereas diffuse irradiance is irradiance that has been scattered out of a direct beam by molecules, aerosols, and clouds. The impact of an obstruction in reducing direct irradiance at a given point in time requires the use of a single, specific obstruction elevation angle corresponding to the sun's azimuth position at that point in time. The impact on diffuse irradiance, on the other hand, requires the aggregation of all obstructions in all azimuth bins (or azimuth ranges) because diffuse irradiance is susceptible to obstructions over a full 360° horizon, independent of vantage point. Consequently, unlike the effect of obstructions on direct irradiance, the diffuse irradiance calculation is insensitive to specific obstruction location.

Empirically, simulation errors tend to be equally distributed around the true azimuth angle, even when other inputs, such as obstruction elevation angles and tilt angle, are incorrect. This observation seems to be true, in many cases, up to the actual azimuth+/−180° and, in difficult cases, up to the actual azimuth+/−90°. This observation also suggests that the algorithm should start with a search for an initial azimuth.

Figure 20A:
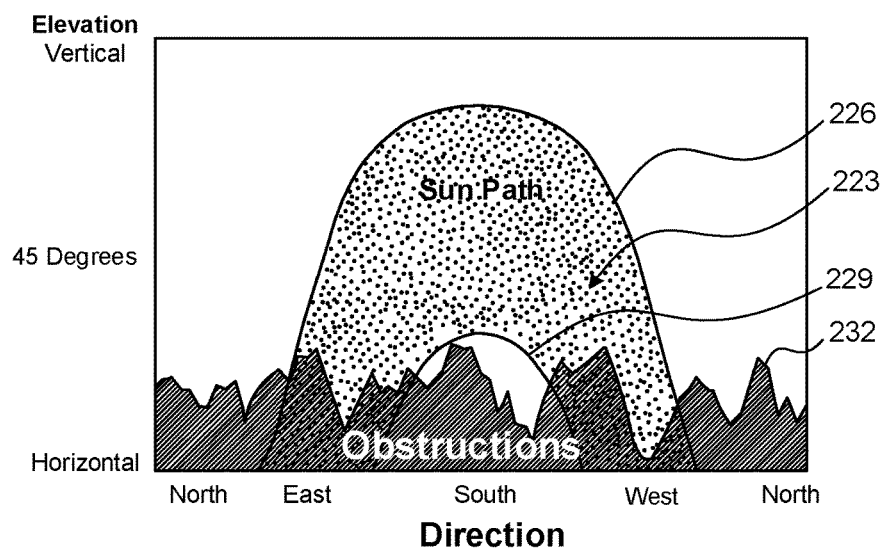
FIGS. 20A-20C are graphs depicting, by way of example, the conversion of an actual obstruction profile to an equivalent obstruction profile.
Figure 20B:
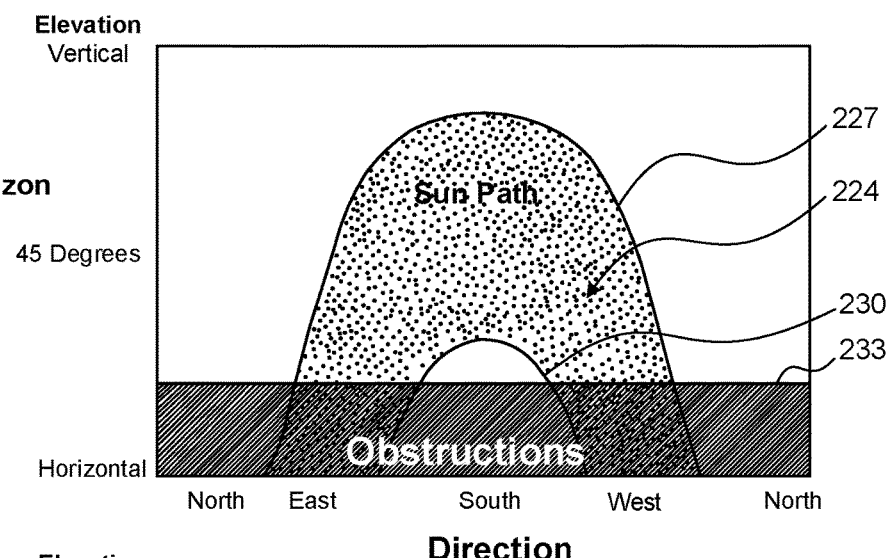
Figure 20C:
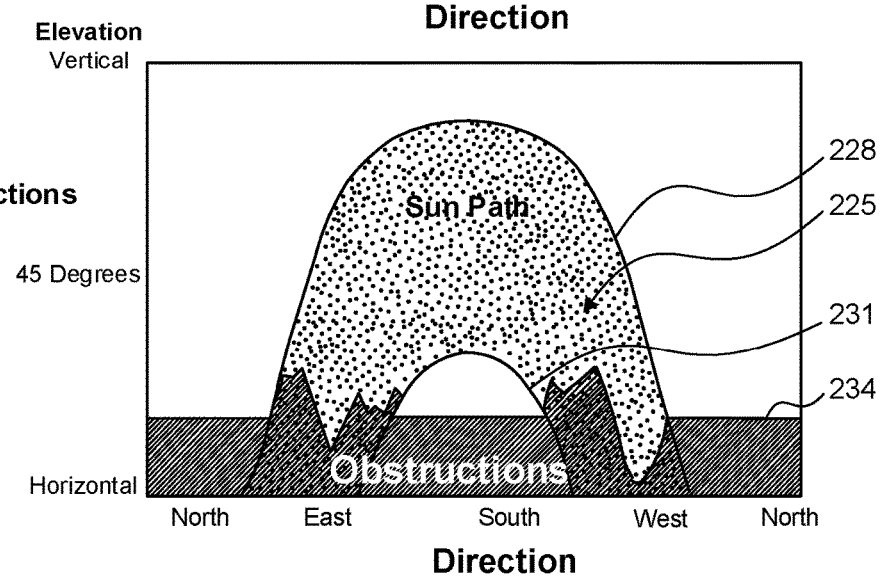

Here, the two-step approach converts the actual obstruction profile of a photovoltaic system into an equivalent obstruction profile. FIGS. 20A-20C are graphs depicting, by way of example, the conversion of an actual obstruction profile to an equivalent obstruction profile. Each graph 220, 221, 222 presents a panoramic view of the horizon with the x-axis spanning an azimuth direction ranging from north to north and the y-axis spanning an elevation from horizontal to vertical. The cross-hatched (gray) areas 232, 233, 234 represent the obstruction profile and the dotted (yellow) areas 223, 224, 225 correspond to the range of sun path values with the maximum arc 226, 227, 228 being the summer solstice and minimum arc 229, 230, 231 being the winter solstice.

FIG. 20A depicts actual obstructions. Note that the actual obstructions only block direct irradiance in the areas where the actual horizon and the range of sun path values overlap. FIG. 20B depicts a constant horizon created after performing the first step. The constant horizon adjusts the actual horizon to account for diffuse irradiance being insensitive to specific obstruction locations. Finally, FIG. 20C depicts a modification of the constant horizon for obstructions that block direct irradiance with the resulting equivalent profile only requiring adjustments for actual obstructions when they directly obstruct the sun; a constant horizon is used for other times. As a result, photovoltaic production can be simulated using the specifications for an equivalent obstruction profile that has the same value as using the specifications for the actual obstruction profile. The two-step process will now be discussed in detail.

Step 1: Obstruction Effect on Diffuse Irradiance

Diffuse irradiance that reaches a photovoltaic system at any point in time equals the total available diffuse irradiance times a number between 0 and 1. The number is based on an unobstructed portion of the sky called the SkyView Factor.

$$\frac{I_t^{Diffuse\ Reaching\ PV\ System}}{I_t^{Diffuse\ Available}} = \text{SkyView Factor}* \quad (75)$$

Sky View Factor Derivation

Figure 21:
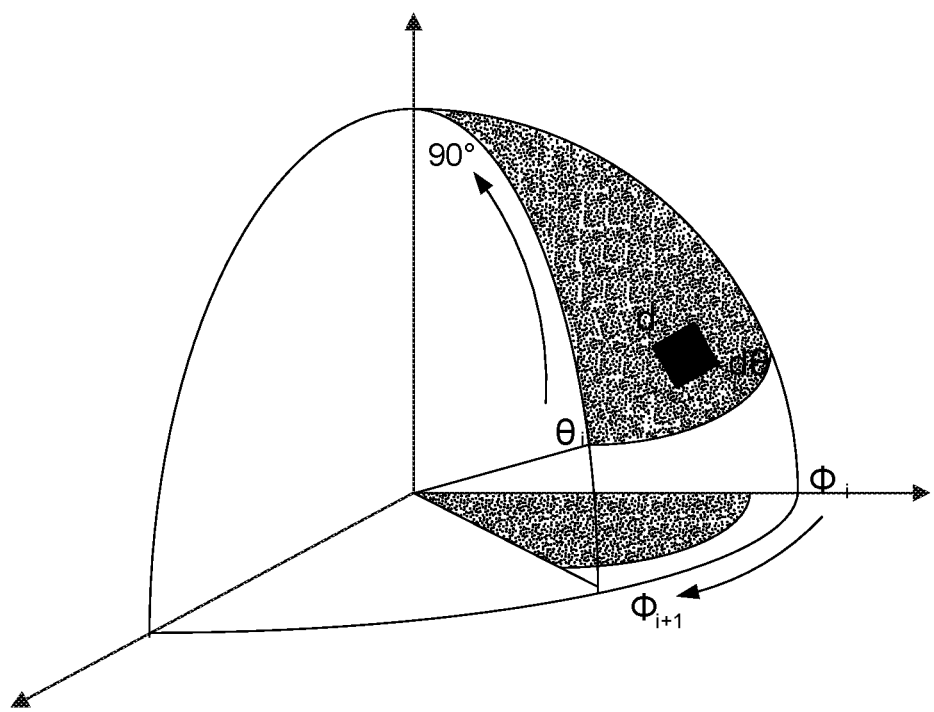
FIG. 21 is an illustration, by way of example, that contains obstruction elevation angles ($\theta$) and azimuth angles ($\phi$).

Consider how to calculate the Sky View Factor for a horizontal surface. FIG. 21 is an illustration, by way of example, that contains obstruction elevation angles (θ) and azimuth angles (φ). Assume that the sphere has a unit radius. The dotted (yellow) area on the sphere corresponds to the unobstructed diffuse irradiance available between the two azimuth angles ($\phi_i$ and $\phi_{i+1}$) where the elevation angle is greater than $\theta_i$. The dotted (yellow) area on the plane corresponds to the unobstructed diffuse irradiance projected to a horizontal surface. The solid (blue) area corresponds to a small part of this area on the surface.

Define azimuth angle bins such that that they divide equally into 360° by setting $$\psi_i = i\left(\frac{360°}{N}\right)$$

for IN bins. The azimuth angle bin size is 30° when there are 12 bins.

The unobstructed portion of sky element radiation on the sphere and projected to the horizontal surface equals cos θ sin θ dθ dφ. The total unobstructed area equals the sum across all N azimuth bins and all ranges for each bin.

$$\text{Unshaded Area} = \sum_{i=0}^{N-1} \int_{\theta_i}^{90°} \int_{\phi_i}^{\phi_{i+1}} \cos\theta_i \sin\theta_i d\theta d\phi \quad (76)$$

Equation (76) simplifies to:

$$\text{Unshaded Area} = \sum_{i=0}^{N-1} \left(\frac{1}{2}\sin^2\theta \bigg|_{\theta_i}^{90°}\right)(\phi_{i+1} - \phi_i) \quad (77)$$

Evaluate the equation, substitute $$\text{Unshaded Area} = \pi \left( \frac{\sum_{i=0}^{N-1} \cos^2 \theta_i}{N} \right) \quad (78)$$

and express the result in radians.

$$\phi_i = i\left(\frac{360°}{N}\right),$$

Unshaded Area with No Obstructions

Equation (78) equals π when there are no obstructions, which is expected because a circle with a radius of 1 has an area of π.

SkyView Factor

The SkyView Factor is the ratio of the unshaded area to the total area, which equals the ratio of Equation (78) using the actual obstruction elevation angles to Equation (78) using obstruction elevation angles of 0°. The result is that π cancels and the SkyView Factor is as follows.

$$\text{SkyView Factor} = \frac{\sum_{i=0}^{N-1} \cos^2 \theta_i}{N} \quad (79)$$

SkyView Factor for Constant Horizon

One can make the key observation about Equation (79) that multiple sets of obstruction elevation angles result in the same SkyView Factor, that is, many sets of obstruction elevation angles produce the same SkyView Factor, even though only one set of corresponds to the actual obstruction profile.

This critical observation allows one to construct a constant horizon. Substitute $\theta_i = \theta_{Constant\ Horizon}$ for all N azimuth bins into Equation (79) and simplify. The result is that the SkyView Factor, and thus the amount of diffuse irradiance, is proportional to the square of the cosine of the constant horizon.

$$\text{SkyView Factor} = \cos^2 \theta_{Constant\ Horizon} \quad (80)$$

Relationship Between Constant and Actual Horizon

Set Equation (79) equal to Equation (80) and solve for the constant horizon.

$$\theta_{Constant\ Horizon} = \cos^{-1}\left(\sqrt{\frac{\sum_{i=0}^{N-1} \cos^2 \theta_i}{N}}\right) \quad (81)$$

Equation (81) implies that one can fully model the effect of obstructions on diffuse irradiance using a single term, rather than an entire profile. This implication simplifies how much obstruction information is required to accurately model the effect of diffuse shading. The constant horizon is widely applicable in photovoltaic production simulation modeling, including in fleet and individual photovoltaic system forecasting.

Step 2: Obstruction Effect on Direct Irradiance

The second step is to adjust portions of the constant horizon to account for the effect on direct irradiance by evaluating the obstruction elevation angle for each azimuth bin and assessing how the obstruction elevation angle affects the relative mean absolute error (rMAE), as further discussed infra. Obstruction elevation angles that differ from the constant horizon angle and affect direct irradiance will reduce the rMAE. The rMAE will decrease by reducing the obstruction elevation angle if the actual angle is less than the constant horizon angle. The rMAE will decrease by increasing the obstruction elevation angle if the actual angle is greater than the constant horizon angle.

Perform this analysis for all angles to tune for the effects of obstructions within the sun's path. Evaluate the azimuth bins alternately from east to west progressively moving south and ending with bins that do not affect direct irradiance. This process will result in a profile that simultaneously modifies the obstruction angles that affect direct irradiance and adjust the angles to retain the correct overall diffuse obstructions.

Basic Configuration Specification Inference

Referring back to FIG. 19, configuration specifications can be inferred through evaluation of measured historical photovoltaic system production data and measured historical resource data. First, measured historical time-series photovoltaic system production data and geographical coordinates are respectively obtained for the photovoltaic power generation system 25 under evaluation (steps 181 and 182). Optionally, the production data can be segmented into multiple time periods for calculating the system's power rating during different times of the year (step 183). A set of photovoltaic plant configuration specifications is then inferred for each of the time periods, if applicable (steps 184-194), as follows. First, based on the measured historical production data, the output of a normalized 1 kW-AC photovoltaic system is simulated for the current time period for a wide range of hypothetical (or model) photovoltaic system configurations (step 186), as further described infra with reference to FIG. 34.

Following simulation, each of the hypothetical photovoltaic system configurations is evaluated (steps 186-191), as follows. The total measured energy produced over the selected time period (excluding any times with erroneous measured data, which are screened out during simulation, as explained infra) is determined (step 187). The ratio of the total measured energy over the total simulated energy is calculated (step 188), which produces a simulated photovoltaic system rating. However, system power ratings other than the ratio of measured-to-simulated energy could be used.

Assuming that a photovoltaic simulation model that scales linearly (or near-linearly, that is, approximately or substantially linear, such as described infra beginning with reference to Equation (12)) in photovoltaic system rating was used, each point in the simulated time series of power production data is then proportionately scaled up by the simulated photovoltaic system rating (step 189). Each of the points in the simulated and measured time series of power production data are matched up and the error between the measured and simulated power output is calculated (step 190) using standard statistical methodologies. For example, the relative mean absolute error (rMAE) can be used, such as described in Hoff et al., "Modeling PV Fleet Output Variability," Solar Energy 86, pp. 2177-2189 (2012) and Hoff et al, "Reporting of Irradiance Modeling Relative Prediction Errors," Progress in Photovoltaics: Res. Appl. doi: 10.1002/pip.2225 (2012) the disclosure of which is incorporated by reference. Other methodologies, including but not limited to root mean square error, to calculate the error between the measured and simulated data could also be used. Each hypothetical photovoltaic system configuration is similarly evaluated (step 191).

Once all of the configurations have been explored (steps 186-191), a variance threshold is established and the variance between the measured and simulated power outputs of all the configurations is taken (step 192) to ensure that invalid data has been excluded. The hypothetical photovoltaic system configuration, including, but not limited to, tracking mode (fixed, single-axis tracking, dual-axis tracking), azimuth angle, tilt angle, row-to-row spacing, tracking rotation limit, and shading configuration, that minimizes error is selected (step 193). The selected configuration represents the inferred photovoltaic system configuration specification for the photovoltaic power generation system 25 under evaluation for the current time period. Each time period is similarly evaluated (step 194). Once all of the time periods have been explored (steps 184-194), an inferred photovoltaic system configuration specification will have been selected for each time period. Ideally, the same configuration will have been selected across all of the time periods. However, in the event of different configurations having been selected, the configuration with the lowest overall error (step 193) can be picked. Alternatively, other tie-breaking configuration selection criteria could be applied, such as the system configuration corresponding to the most recent set of production data. In a further embodiment, mismatched configurations from each of the time periods may indicate a concern outside the scope of plant configuration evaluation. For instance, the capacity of a plant may have increased, thereby enabling the plant to generate more power that would be reflected by a simulation based on the hypothetical photovoltaic system configurations which were applied. (In this situation, the hypothetical photovoltaic system configurations would have to be modified beginning at the time period corresponding to the supposed capacity increase.) Still other tie-breaking configuration selection criteria are possible.

In addition, the range of hypothetical (or model) photovoltaic system configurations used in inferring the system's "optimal" configuration data, that is, a system configuration heuristically derived through evaluation of different permutations of configuration parameters, including power rating, electrical characteristics, and operational features, can be used to look at the effect of changing the configuration in view of historical measured performance. For instance, while the hypothetical configuration that minimizes error signifies the closest (statistical) fit between actual versus simulated power generation models, other hypothetical configurations may offer the potential to improve performance through changes to the plant's operational features, such as revising tracking mode (fixed, single-axis tracking, dual-axis tracking), azimuth, tilt, row-to-row spacing, tracking rotation limit, and shading configurations. Moreover, the accuracy or degree to which a system configuration is "optimal" can be improved further by increasing the degree by which each of the configuration parameters is varied. For instance, tilt angle can be permuted in one degree increments, rather than five degrees at a time. Still other ways of structuring or permuting the configuration parameters, as well as other uses of the hypothetical photovoltaic system configurations, are possible.

Figure 37:
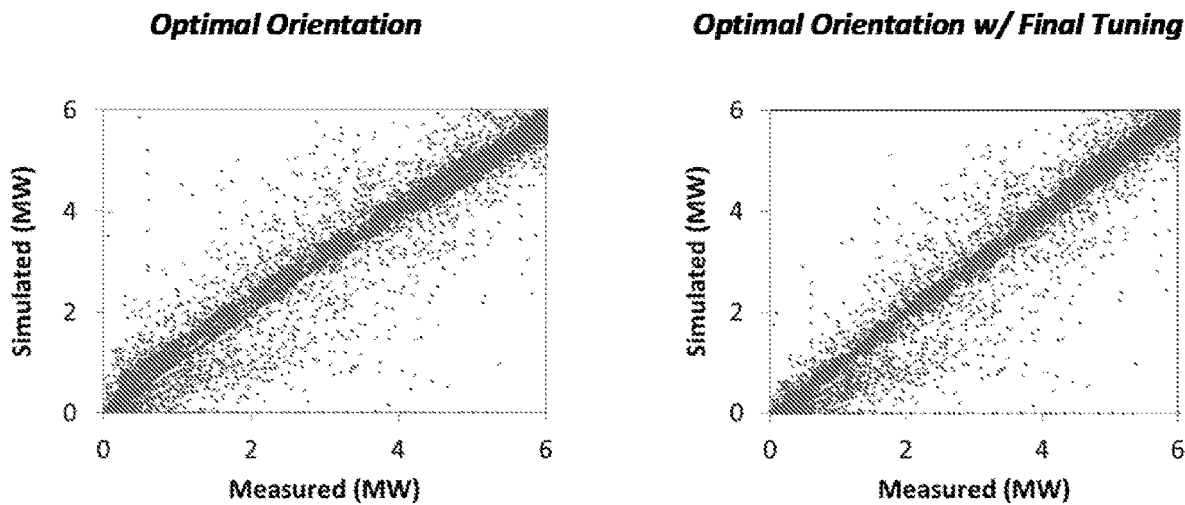
FIG. 37 are graphs depicting, by way of example, simulated versus measured power output for the optimal photovoltaic system configuration specifications as shown in FIG. 35.

Optionally, the selected photovoltaic system configuration can be tuned (step 195), as further described infra with reference to FIG. 37. The selected and, if applicable, tuned photovoltaic system configuration is then provided (step 196) as the inferred photovoltaic system configuration specifications, which can be used to correct, replace or, if configuration data is unavailable, stand-in for the system's specifications.

Configuration Specification Inference Using an Evaluation Metric

In a further embodiment, the accuracy of inferred photovoltaic plant configuration specifications can be improved by including an evaluation metric, rMAE, to assess how well photovoltaic production data simulated using an inferred photovoltaic plant configuration specification compares to actually measured production data.

Evaluation Metric

At a minimum, the approach to inferring photovoltaic plant configuration specifications should produce specifications that result in simulated production that matches measured production on a total energy basis, which can be accomplished by first performing the simulation and then multiplying each simulated value in the time series by a constant, so that total adjusted simulated production equals total measured production.

$$\Sigma_{t=1}^{N} \gamma * P_t^{Simulated} = \Sigma_{t=1}^{N} P_t^{Measured} \tag{82}$$

where $PV_t^{Simulated}$ the unadjusted simulated PV production at time t, and γ is a constant that adjusts for the difference between total measured and total simulated production. The constant multiplier γ equals 1 when total measured and total simulated production are equal.

Determine γ by factoring γ out of the left-hand side of Equation (82) and solving.

$$\gamma = \frac{\sum_{t=1}^{N} P_t^{Measured}}{\sum_{t=1}^{N} P_t^{Simulated}} \tag{83}$$

Relative Mean Absolute Error (rMAE)

Error is measured by comparing the sum of the absolute value of the error of each term in the time series relative to the total measured photovoltaic production. For example, assume that the measured data is hourly data. The hourly relative mean absolute error (rMAE) equals the sum of the absolute value of the difference between the hourly adjusted simulated and measured production divided by the sum of the hourly measured production.

$$rMAE = \frac{\sum_{t=1}^{N} |\gamma * P_t^{Simulated} - P_t^{Measured}|}{\sum_{t=1}^{N} P_t^{Measured}} \tag{84}$$

The search algorithm, discussed infra, will use this function for the optimization process.

Approach

Figure 22:
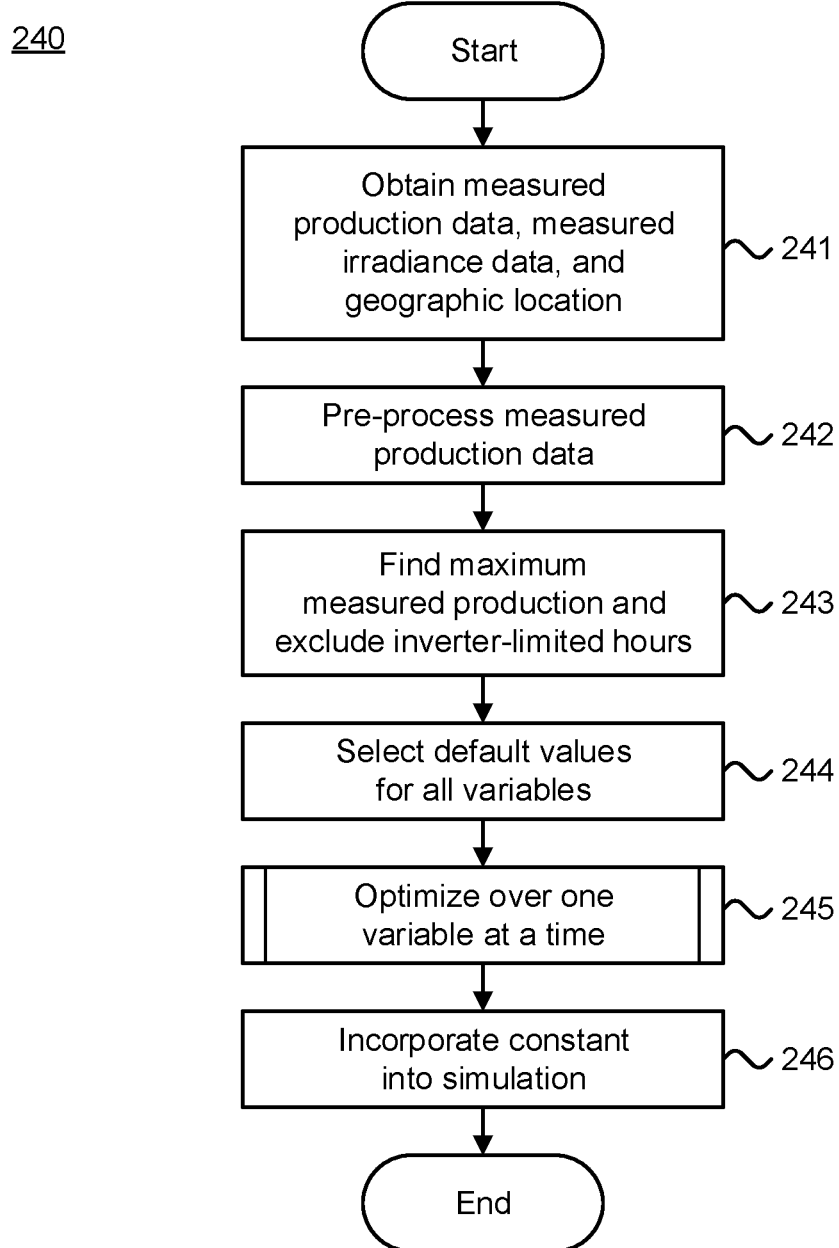
FIG. 22 is a flow diagram showing a method for inferring operational specifications of a photovoltaic power generation system with an evaluation metric in accordance with a still further embodiment.

Simulating photovoltaic production involves a complex algorithm that is computationally costly to evaluate, which makes performing as few simulations as possible desirable. Here, the approach is to select default values for each input variable and then optimize one term at a time. FIG. 22 is a flow diagram showing a method 240 for inferring operational specifications of a photovoltaic power generation system with an evaluation metric in accordance with a still further embodiment. The method 240 can be implemented in software and execution of the software can be performed on a computer system 21, such as described supra with reference to FIG. 2, as a series of process or method modules or steps. Application of this approach reduced hourly rMAE by more than 50 percent when compared to using a rough approximation of photovoltaic system configuration specifications with no obstructions.

Photovoltaic production is a function of photovoltaic system configuration specifications including tracking mode (fixed, one-axis tracking, or two-axis tracking), azimuth angle, tilt angle, obstruction elevation angle at various azimuth angle bins, photovoltaic module temperature response, and inverter power model. The system specifications are inferred from measured time series photovoltaic production data that is obtained for a known time period, for instance, hourly photovoltaic data over a one-year time period, plus the geographical location of the photovoltaic plant (step 241). If necessary, the measured production data is pre-processed (step 242) by converting time units for the measured production data to match time units for simulation results. Conversion will often involve converting from data that is in daylight savings time to data that is standard time, and may require an adjustment for measured data time convention, whether beginning of interval or end of interval. The simulation results may also require correctly converting from power production to energy production using the correct weighting factors for normalized irradiation, such as described in commonly-assigned U.S. Pat. No. 9,645,180, issued May 9, 2017, the disclosure of which is incorporated by reference.

Next, maximum measured production (kWh per hour) is found and possible inverter-limited hours (for both measured and simulated data) are excluded from the analysis (step 243). This step is performed by excluding hours when measured production exceeds a threshold, such as 98 percent of maximum measured production or other value or percentile as desired. Default values are selected for all variables (step 244), such as set forth in Table 3.

TABLE 3

| Variable | Default Value | Start | End |
|---|---|---|---|
| Tracking Mode | Fixed | | |
| Azimuth Angle | N/A | 0° | 360° |
| Tilt Angle | 45° | 0° | 90° |
| Obstruction Elevation Angle (All Azimuths) | 0° | 0° | 50° |
| photovoltaic Temperature Response | 0.4%/° C. | 0%/° C. | 1.0%/° C. |
| Inverter Rating (or Power Curve) | ~1.2 * Max Power | | |

Figure 33:
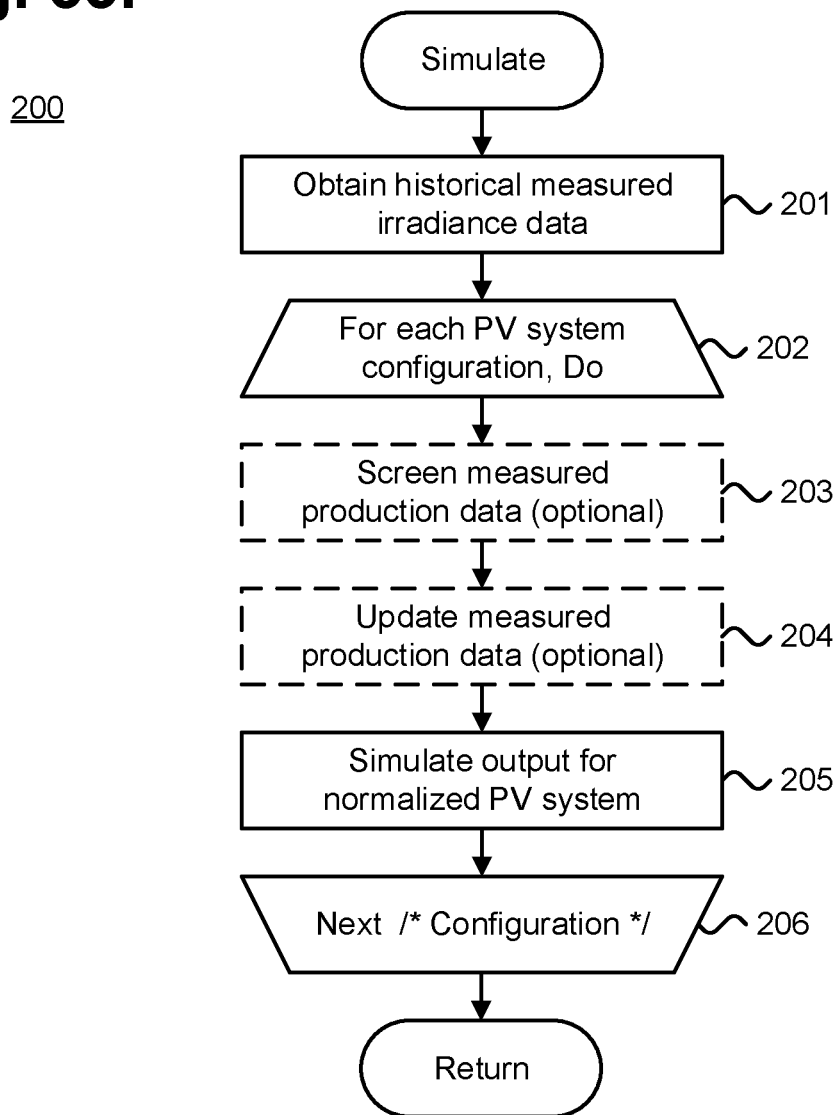
FIG. 33 is a flow diagram showing a routine for simulating power output of a photovoltaic power generation system for use in the method of FIG. 19.

The variables are optimized one at a time with the other remaining variables held constant (step 245) in an ordering that successively narrows the search without missing the optimum value of each variable, as further discussed infra with reference to FIG. 33. For each variable, the optimal value is the value that minimizes relative Mean Absolute Error (rMAE). Finally, the constant γ is incorporated into the simulation (step 246). The constant γ (see Equation (83)) is applied to both the General Derate Percentage and Inverter Rating. Note that the constant γ is incorporating into the simulation, rather than being applied after the simulation has been performed.

Figure 23:
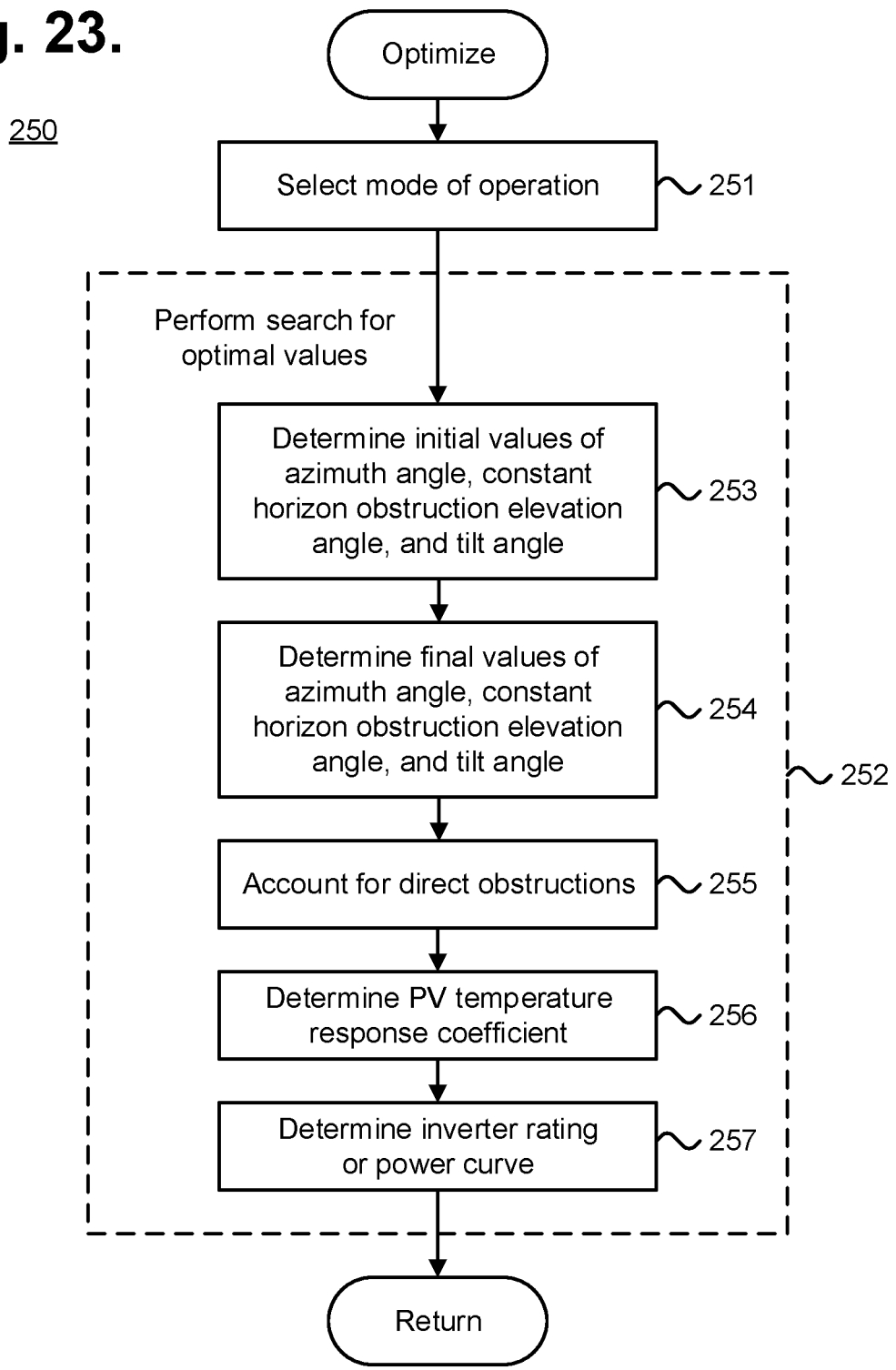
FIG. 23 is a flow diagram showing a routine for optimizing photovoltaic system configuration specification variables for use in the method of FIG. 22.

Only one variable is optimized at a time with the other remaining variables held constant. The variables are assessed in a specific ordering with default values for all other variables. Optimized variables are then used in succeeding steps of the evaluation. FIG. 23 is a flow diagram showing a routine 250 for optimizing photovoltaic system configuration specification variables for use in the method 240 of FIG. 22. Where a 30° azimuth bin size are used for determining exact obstruction elevation angle, fifteen variables will need to be determined in the following ordering, except as noted. Optimal values for each variable are found using a search strategy that, from a computational load perspective, helps to limit the number of possible combinations of system specification parameters that need to be explored. Note that other variables, either in addition to or in lieu of the variables specifically mentioned, are possible.

A mode of operation (fixed or tracking) is first selected (step 251). A search is then performed to optimize each variable, one variable at a time (step 252). For each iteration of the search, photovoltaic production is simulated for a variety of scenarios for the variable being optimized, such as described in U.S. Pat. Nos. 8,165,811, 8,165,812, 8,165,813, 8,326,535, 8,326,536, and 8,335,649, cited supra, or through the PhotovoltaicSimulator simulation engine available through the SolarAnywhere service, offered by Clean Power Research, Napa, Calif. The total simulated energy is required to equal the total measured energy, as described supra. The optimized value for each variable as found in the search is used in succeeding scenarios until that value is replaced by a new optimized value. In one embodiment, a Golden-section search, as further discussed infra, is used find the optimal value that minimizes rMAE, although other searching methodologies that preferably optimize over a unimodal function could be used.

During the searching (step 252), initial values for the first three variables, azimuth angle, constant horizon obstruction elevation angle, and tilt angle, are determined (step 253) through simulation for a variety of scenarios, after which final values for the same three variables, azimuth angle, constant horizon obstruction elevation angle, and tilt angle, are determined (step 254). The constant horizon obstruction elevation angle is determined per the first step of the two-step approach to quantify the effect of obstructions on diffuse irradiance, as discussed supra. Note that the ordering as between the determinations of the initial values for the first three variables, azimuth angle, constant horizon obstruction elevation angle, and tilt angle, is not important; the three values can be determined in any ordering, so long as all three initial values are determined before proceeding to determining the final values. Similarly, the ordering as between the determinations of the final values for the same three variables, azimuth angle, constant horizon obstruction elevation angle, and tilt angle, also is not important, so long as all three final values are determined before proceeding to the next step.

Figure 24:
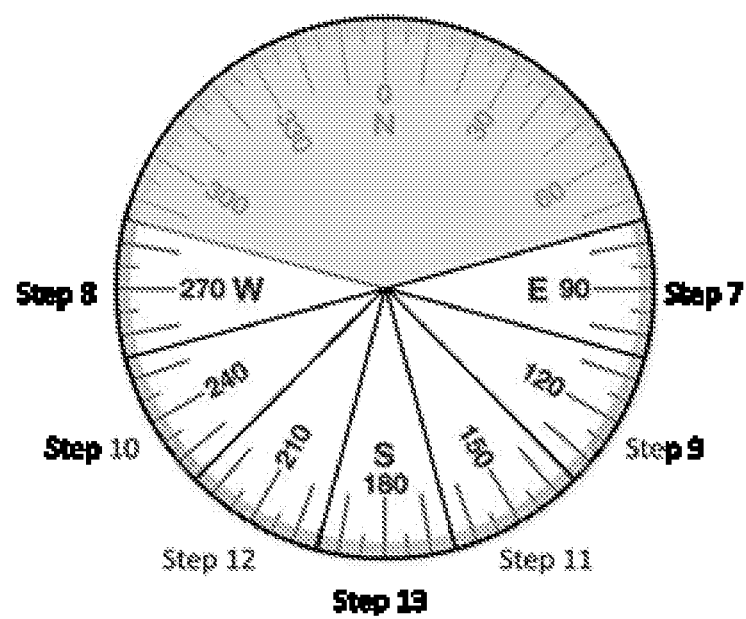
FIG. 24 is a diagram showing, by way of example, a search ordering for exact obstruction elevation angle in the case of 30° azimuth bin sizes.

After the initial and final values of azimuth angle, constant horizon obstruction elevation angle, and tilt angle are determined, the exact obstruction elevation angle is determined (step 255) to account for direct obstructions. The search for the optimal value for the exact obstruction elevation angle is performed over a range of azimuth orientations. FIG. 24 is a diagram showing, by way of example, a search ordering for exact obstruction elevation angle in the case of 30° azimuth bin sizes. Here, the search is performed in seven steps going from east to west, where due south is 180°, to find azimuth from 75° to 105°, from 255° to 285°, from 105° to 135°, from 225° to 255°, from 135° to 165°, from 195° to 225°, and from 165° to 195°.

The exact obstruction elevation angle is determined per the second step of the two-step approach to quantify the effect of obstructions on direct irradiance, as discussed supra. The number of exact obstruction elevation angle analyses depends upon the azimuth bin size. Here, there are 12 obstruction elevation angles if the azimuth bin is 30°. Only seven of the azimuth bins, however, can have direct obstructions in the current version of SolarAnywhere's PhotovoltaicSimulator simulation engine. A different number of search steps would be required for other groupings of azimuth bins or for different azimuth bin sizes, which will also affect the number of variables for which optimal values must be found, that is, optimal values for either less than or more than the fifteen variables described infra may need to be determined. The search could also be performed without azimuth bins using degrees or other units of measure. Last, a different ordering of the search, for instance, proceeding west to east, or different starting or ending points, such as starting from due south, could be used.

Next, the photovoltaic temperature response coefficient is determined (step 256). Finally, the inverter rating or power curve is determined (step 257). This step includes all measured data to allow the simulation model to correctly reflect inverter limited systems. Recall that maximum measured production (kWh per hour) was found and possible inverter-limited hours (for both measured and simulated data) were previously excluded from the analysis.

Golden-Section Search

The previous section described the steps to determine the optimal combination of input values by optimizing one input variable at a time. The searching strategy relied upon the assumption that the error function used to find rMAE was unimodal between two selected values. A unimodal function over the range between two specified values is a function that has only one minimum or maximum value over the specified range.

The Golden-section search finds the extremum (minimum or maximum) of a strictly unimodal function by successively narrowing the range of values inside which the extremum is known to exist. Moreover, the Golden-section search guarantees convergence in a fixed number of steps to satisfy a specific condition, here, the number of possible combinations of system specification parameters that need to be explored. The optimal input value is the one that results in the minimum rMAE and the unimodal function is the rMAE.

In geometry, the Golden Ratio was discovered by Euclid, who stated that "A straight line is said to have been cut in extreme and mean ratio when, as the whole line is to the greater segment, so is the greater to the lesser." Mathematically, let Y correspond to the length of the whole line, X to the greater segment, and Y minus X to the lesser. Euclid's statement means that $$\frac{Y}{X} = \frac{X}{Y-X}$$

which rearranges to $$\frac{X}{Y} = \frac{Y}{X} - 1.$$

Let $\varphi$ represent the ratio of Y to X, which will be referred to as the Golden Ratio:

$$\varphi^{-1} = \varphi - 1 \tag{85}$$

Multiply both sides of Equation (85) by $\varphi$ and subtract 1 to result in $\varphi^2 - \varphi - 1 = 0$. Apply the quadratic equation and select the positive solution to result in a numerical value for the Golden Ratio:

$$\varphi = \frac{1+\sqrt{5}}{2} \tag{86}$$

Weighting Factors

A set of weighting factors that sum to 1 can be constructed by multiplying Equation (85) by $\varphi^{-1}$ and rearranging the equation:

$$1 = \varphi^{-1} + \varphi^{-2} \tag{87}$$

The terms in the right-hand side become the weighting factors in a two-element array:

$$W = [\varphi^{-1} \, \varphi^{-2}] \tag{88}$$

This weighting factor array can be used to select a point that lies between two other points.

Search Procedure

The search begins by selecting two points (candidates for the optimal value of the variable under consideration) of a strictly unimodal function. Select the points to correspond to a broad range and yet still have a unimodal function. Label the two points as $x_1^1$ and $x_3^1$. The '1' superscript refers to the first iteration of the search. Order the two points such that the rMAE evaluated at $x_3^1$ is greater than or equal to the function evaluated at $x_1^1$, that is, $f(x_3^1) \geq f(x_1^1)$, when the unimodal function has a unique minimum value.

The first iteration of the search requires a point between $x_1^1$ and $x_3^1$, which will be called $x_4^n$. This point equals the weighted sum of the first and third points. Only perform the calculation for the first iteration:

$$x_2^1 = W \begin{bmatrix} x_1^1 \\ x_3^1 \end{bmatrix} = [\varphi^{-1} \, \varphi^{-2}] \begin{bmatrix} x_1^1 \\ x_3^1 \end{bmatrix} \tag{89}$$

This first iteration and each subsequent iteration requires a fourth value, which will be called $x_4^n$. These iterations use the same weighting factors, but applies the weighting factors to the second and third points, rather than the first and third points. Notice that the equation references the iteration number n, rather than 1; hence, an n' superscript because the calculation will be the same for all iterations.

$$x_4^n = W \begin{bmatrix} x_2^n \\ x_3^n \end{bmatrix} \tag{90}$$

Complete the first iteration by evaluating the function, that is, performing a photovoltaic production simulation and calculating the rMAE, for each of the four points.

Transfer Input Values to Next Iteration

The inputs for the next iteration of the search are based on the relationship between the function evaluated at $x_2^n$ and $x_4^n$, specifically:

$$\begin{bmatrix} x_1^{n+1} \\ x_2^{n+1} \\ x_3^{n+1} \end{bmatrix} = \left\{ \alpha \begin{bmatrix} 0 & 0 & 0 & 1 \\ 0 & 1 & 0 & 0 \\ 1 & 0 & 0 & 0 \end{bmatrix} + (1-\alpha) \begin{bmatrix} 0 & 1 & 0 & 0 \\ 0 & 0 & 0 & 1 \\ 0 & 0 & 1 & 0 \end{bmatrix} \right\} \begin{bmatrix} x_1^n \\ x_2^n \\ x_3^n \\ x_4^n \end{bmatrix} \tag{91}$$

-continued $$\text{where } \alpha = \left\{ \begin{array}{c} 1 \text{ for } f(x_4^n) > f(x_2^n) \\ \text{else } 0 \end{array} \right\}.$$

Applying Equation (91) has the benefit that the first three points of the succeeding iteration are based on the four points from the preceding iteration. Select the fourth point of the succeeding iteration as before using Equation (90).

Transfer Function Evaluation Results to Next Iteration

Simulating photovoltaic production involves a complex function that can be computationally costly to evaluate. Thus, evaluating the function as few times as possible during the searching process is desirable.

The function evaluated at three of the values of the succeeding iteration is based on the preceding iteration in the same way that three of the values of the succeeding iteration are based on the preceding iteration. Apply a slightly modified version of Equation (91) to transfer function evaluation results to the next iteration. $\alpha$ is as defined in Equation (91):

$$\begin{bmatrix} f(x_1^{n+1}) \\ f(x_2^{n+1}) \\ f(x_3^{n+1}) \end{bmatrix} = \left\{ \alpha \begin{bmatrix} 0 & 0 & 0 & 1 \\ 0 & 1 & 0 & 0 \\ 1 & 0 & 0 & 0 \end{bmatrix} + (1-\alpha) \begin{bmatrix} 0 & 1 & 0 & 0 \\ 0 & 0 & 0 & 1 \\ 0 & 0 & 1 & 0 \end{bmatrix} \right\} \begin{bmatrix} f(x_1^n) \\ f(x_2^n) \\ f(x_3^n) \\ f(x_4^n) \end{bmatrix} \quad (92)$$

Example

Table 4 illustrates how to perform the first two iterations of the search for the azimuth angle. This example assumes default values for the other required inputs. Note that the default values are not shown.

Each iteration of the search requires four azimuth angle values. The four values for the first iteration are determined as follows:

The user supplies the first and third azimuth angles, which are selected to represent a wide range of possible azimuth angles. The first and third azimuth angles equal 0° and 360° in Table 4.

The second azimuth angle equals the weighted average of the first and third azimuth angles, which is calculated using Equation (89). Here, the second azimuth angle equals 137° (i.e., 0.618×0°+0.382×360°).

The fourth azimuth angle equals the weighted average of the second and third azimuth angle values, which is calculated using Equation (90). Here, the fourth azimuth angle equals 222° (i.e., 0.618×137°+0.382×360°).

Complete the first search iteration by evaluating the function for each azimuth angle to calculate the rMAE. The rMAE corresponding to azimuth angles of 0°, 137°, 360°, and 222° respectively equals 50%, 28%, 50% and 40%.

The second iteration begins by eliminating one azimuth angle and reordering the values from the first iteration. The value to eliminate depends upon the relationship between f ($x_4^1$) and f ($x_2^1$). Since 40% (f ($x_4^1$)) is greater than 28% (f ($x_2^1$)), $\alpha=1$. According to Equation (91), the input values for the second iteration are as follows:

The first value in the second iteration equals the fourth value (222°) in the first iteration ($x_1^2=x_4^1$). The single border in Table 4 denotes the first value in the second iteration.

The second value in the second iteration equals the second value (137°) in the first iteration ($x_2^2=x_2^1$). The double border in Table 4 denotes the second value in the second iteration.

The third value in the second iteration equals the first value (0°) in the first iteration ($x_3^2=x_1^1$). The triple border in Table 4 denotes the third value in the second iteration.

Drop the third value from the first iteration (360°).

Calculate the fourth value in the second iteration using Equation (90), which equals 84° (i.e., 0.618×137°+0.382×0°).

The required number of function evaluations can be reduced by applying Equation (92) to transfer function evaluation results, as shown in Table 4. The approach used to transfer the search values is applied in an identical manner to the function evaluation results. For example, the rMAE for the first value in the first iteration transfers to the third value in the second iteration, and so on.

TABLE 4

| Search Iteration | Search Value | | | | Function Evaluation (Hourly rMAE) | | | |
|---|---|---|---|---|---|---|---|---|
| | $x_1$ | $x_2$ | $x_3$ | $x_4$ | $x_1$ | $x_2$ | $x_3$ | $x_4$ |
| 1 | 0° | 137° | 360° | 222° | 50% | 28% | 50% | 40% |
| 2 | 222° | 137° | 0° | 84° | 40% | 28% | 50% | 48% |

Separate Search from Function Evaluation

The fourth value may not always require a function evaluation. A typical approach would be to select $x_4^n$ and then perform a photovoltaic production simulation to evaluate the function at this value. Table 4 illustrates this approach. For example, a function evaluation results in 40% rMAE when x=222° and 48% rMAE when x=84°. A weakness of this approach is that the number of times that the function must be evaluate is not limited. An alternative approach is to only evaluate the function, that is, perform a photovoltaic production simulation, for unique input data sets and not re-evaluate the function for non-unique input parameter sets.

Performing a photovoltaic production simulation for only unique input data sets can be accomplished by separating function evaluation from the search process, which can be implemented through the addition of a simulation results table. Table 5 and Table 6 illustrate this approach. A value of 222° for x in Table 5 corresponds to Simulation ID 4, which corresponds to an hourly rMAE of 40% in Table 6, that is, the function equals 40% whenever x equals 222°. The benefit is that the function (simulating photovoltaic production) need only be performed once for each unique set of inputs, which is beneficial if the search algorithm encounters scenarios with identical inputs later in the search process. Note that the table does not show this situation.

TABLE 5

| Search | Search Value | | | | Simulation ID | | | | Function Evaluation (Hourly rMAE) | | | |
|---|---|---|---|---|---|---|---|---|---|---|---|---|
| Iteration | $x_1$ | $x_2$ | $x_3$ | $x_4$ | $x_1$ | $x_2$ | $x_3$ | $x_4$ | $x_1$ | $x_2$ | $x_3$ | $x_4$ |
| 1 | 0° | 137° | 360° | 222° | 1 | 3 | 2 | 4 | 50% | 28% | 50% | 40% |
| 2 | 222° | 137° | 0° | 84° | 4 | 3 | 1 | 5 | 40% | 28% | 50% | 48% |

TABLE 6

| Sim ID | Azim | Tilt | Obstruction Elevation at Azimuth Angle Midpoint | | | | | | | Temp | Inverter | Hourly rMAE |
|---|---|---|---|---|---|---|---|---|---|---|---|---|
| | | | 90° | 120° | 150° | 180° | 210° | 240° | 270° | | | |
| 1 | 0° | 45° | 0° | 0° | 0° | 0° | 0° | 0° | 0° | 0.4 | 6 kW | 50% |
| 2 | 360° | 45° | 0° | 0° | 0° | 0° | 0° | 0° | 0° | 0.4 | 6 kW | 50% |
| 3 | 137° | 45° | 0° | 0° | 0° | 0° | 0° | 0° | 0° | 0.4 | 6 kW | 28% |
| 4 | 222° | 45° | 0° | 0° | 0° | 0° | 0° | 0° | 0° | 0.4 | 6 kW | 40% |
| 5 | 84° | 45° | 0° | 0° | 0° | 0° | 0° | 0° | 0° | 0.4 | 6 kW | 48% |

Convergence

The Golden-section search converges at a predictable rate. The difference in value between the second and third values reduces by a constant ratio after each search iteration, which means that the rate of convergence can be determined after n search iterations. The following formula predicts the absolute value of the difference between two points at the $n^{th}$ iteration. The first iteration is n=1:

$$|x_3^n - x_2^n| = (x_3^1 - x_2^1)(\varphi - 1)^{n-1} \quad (93)$$

Solve for n to determine the number of iterations to achieve some specified convergence condition:

$$n = 1 + \left[\frac{1}{\ln(\varphi - 1)}\right] \ln\left(\frac{|x_3^n - x_2^n|}{x_3^1 - x_2^1}\right) \quad (94)$$

The goal of this approach is to perform the search until there is one degree (1°) of difference between the second and third values. Other minimal thresholds of error could be used instead of one degree, including as would be applicable to other units of measure. Table 7 presents the number of iterations required for the listed variables. Note that the "+3" in the Steps column reflects that three seed values are required before the search begins.

TABLE 7

| Search | Max | Min | Difference | Steps |
|---|---|---|---|---|
| Azimuth | 360° | 0° | 180° | 13 + 3 |
| Horizon | 50° | 0° | 50° | 10 + 3 |
| Tilt | 90° | 0° | 90° | 11 + 3 |
| Obstruction Elevation | 50° | 0° | 50° | 10 + 3 |

Total Simulations Required

The approach requires a maximum of 43 unique simulations for the searches for the initial values of the first three variables, azimuth angle, constant horizon obstruction elevation angle, and tilt angle. This value can be doubled since 43 additional unique simulations are required for the searches for the final values for a maximum of 86 simulations. This value represents an upper limit on identifying the optimal values for azimuth angle, constant horizon obstruction elevation angle, and tilt angle because some of the searches may reuse results for prior simulations. In addition, the approach requires up to 91 additional simulations to account for direct obstructions and remaining variables. Thus, a maximum of 177 simulations are needed to perform the searches for optimal values to within a 1° rMAE tolerance.

Results

The foregoing approach was used to infer photovoltaic system configuration specifications for a residential photovoltaic system in Napa, Calif. This example used one year of hourly data from Oct. 5, 2015 to Oct. 4, 2016 and assumed that only system location was known.

Intermediate Search Results

Figure 25:
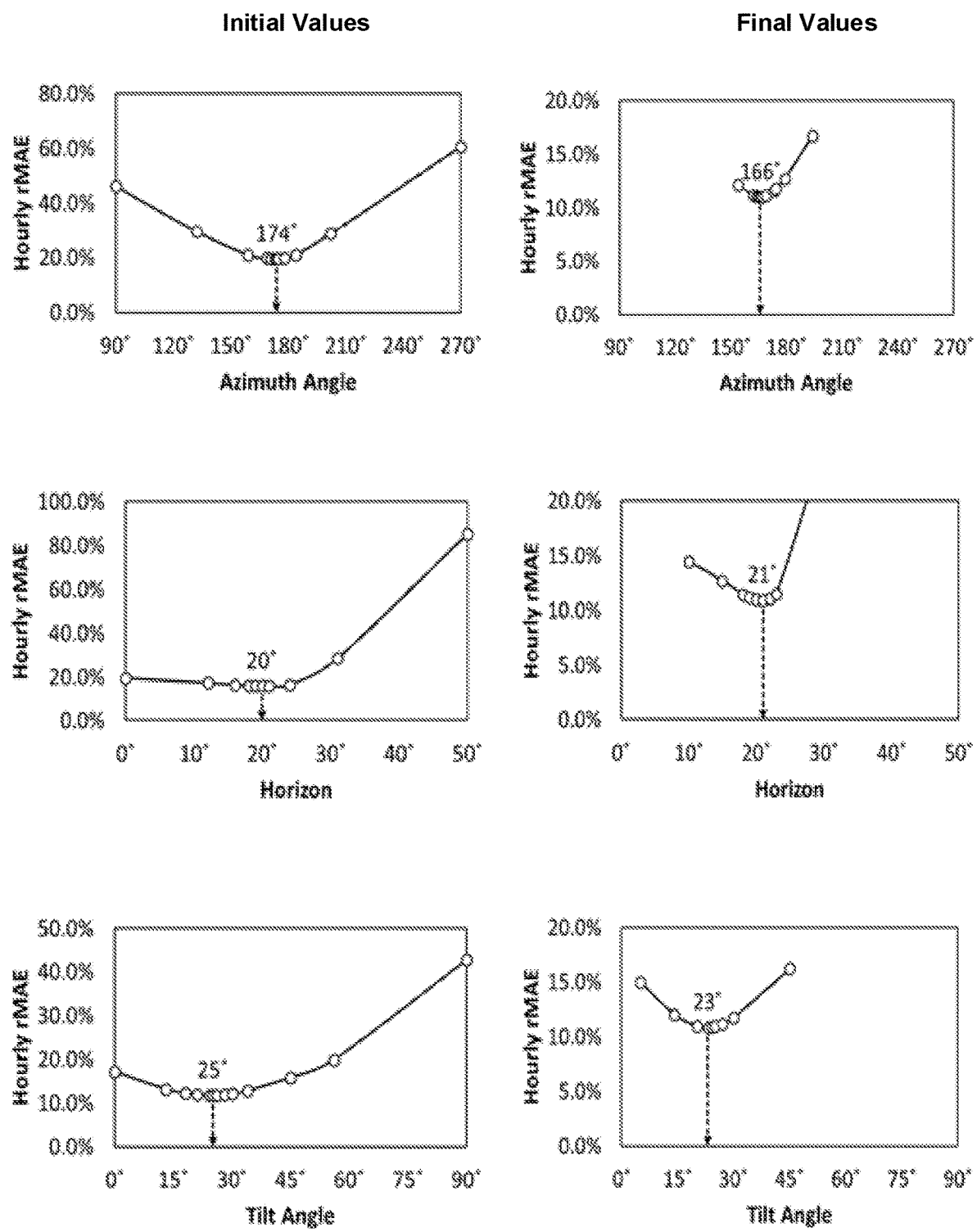
FIGS. 25 and 26 are sets of graphs respectively showing, by way of examples, optimal values for the first six variables (initial and final azimuth, horizon, and tilt angles) and for the seven obstruction elevation angles as determined through the method of FIG. 22.
Figure 26:
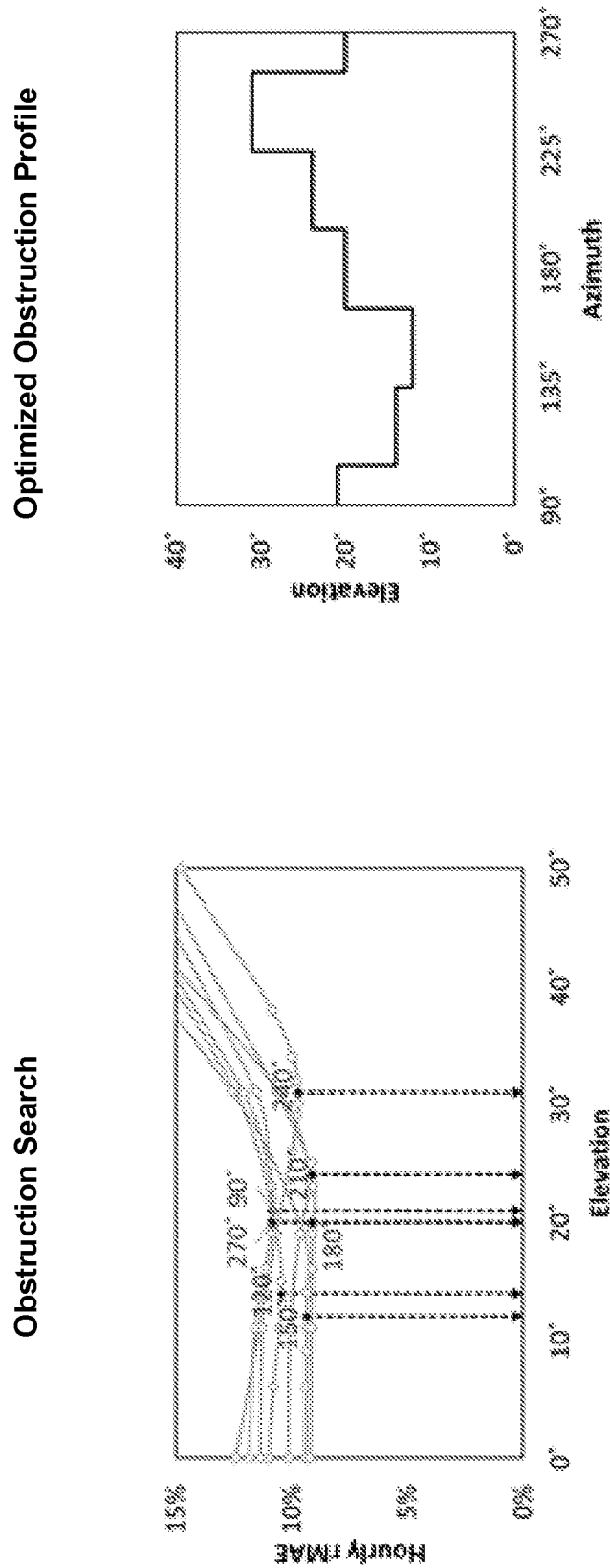

FIGS. 25 and 26 are a set of graphs respectively showing, by way of examples, optimal values for the first six variables (initial and final azimuth, horizon, and tilt angles) and for the seven obstruction elevation angles as determined through the method of FIG. 22. The x-axes represent degrees and the y-axes represent percentage of hourly rMAE. Results for the last two variables (temperature response and inverter) are not presented.

Referring first to FIG. 25, the three graphs on the left respectively present results from the search to obtain initial values for azimuth angle, horizon (average obstruction elevation angle), and tilt angle and the three graphs on the right respectively present results from the search to obtain refined final values for azimuth angle, horizon (average obstruction elevation angle), and tilt angle. The graph in the upper left corner corresponds to the search results for the initial azimuth angle value. The graph in the middle left corresponds to the search results for the initial horizon value. The graph in the lower left corner corresponds to the search results for the initial tilt angle value. Similarly, the graph in the upper right corner corresponds to the search results for the final azimuth angle value. The graph in the middle right corresponds to the search results for the final horizon value. The graph in the lower right corner corresponds to the search results for the final tilt angle value.

Referring next to FIG. 26, the graph on the left presents results from the search to obtain the values for the seven azimuth bins for the obstruction elevation angle. Note that the azimuth direction alternates from east to west and moving toward south. The decreasing error occurs as expected. The graph on the right presents an optimized obstruction profile. The y-axis of this graph represents degrees of elevation, rather than percentage of hourly rMAE.

Detailed Results

Figure 27:
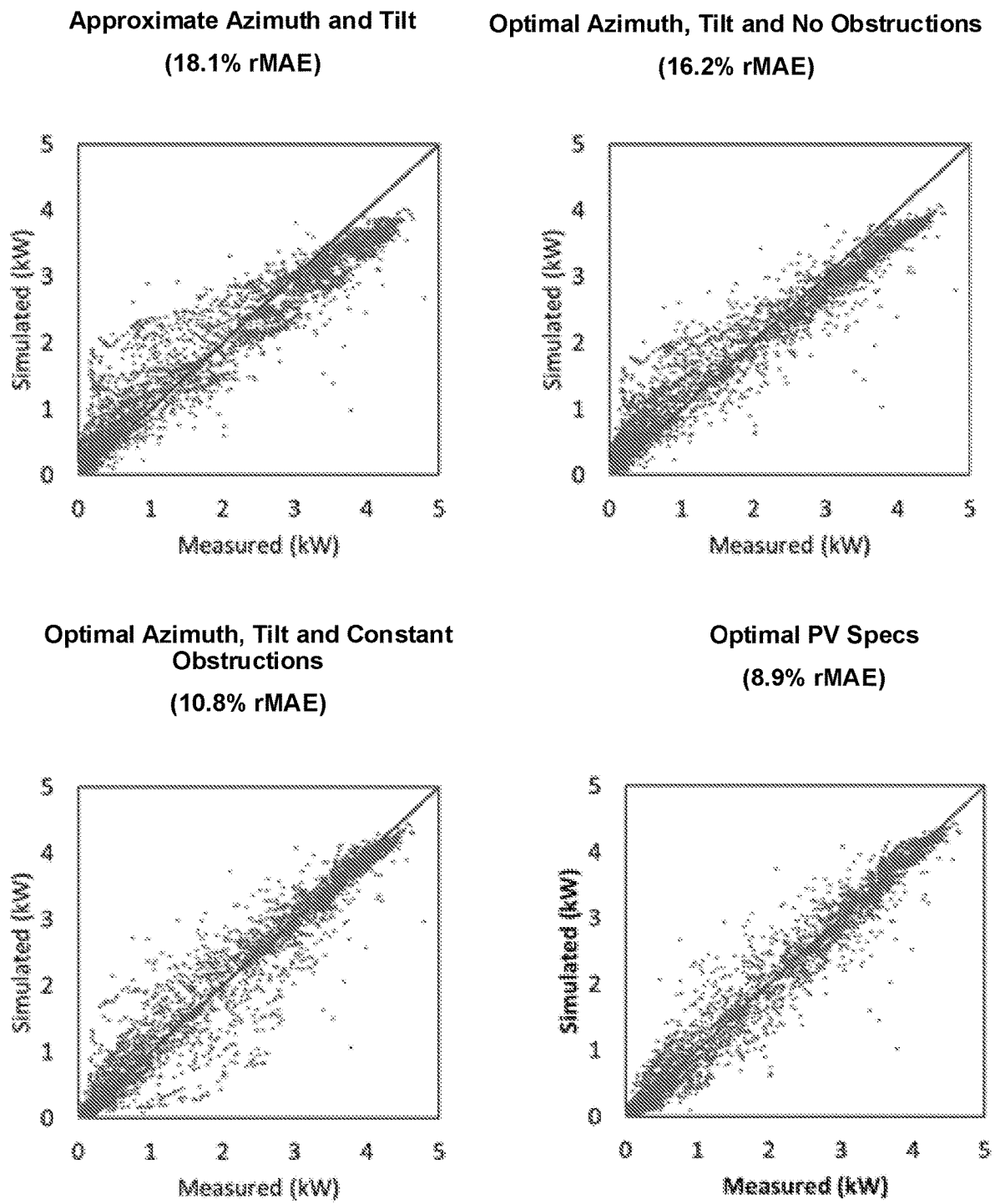
FIG. 27 is a set of graphs showing, by way of examples, hourly photovoltaic simulation production versus measured photovoltaic production for the entire year.
Figure 28:
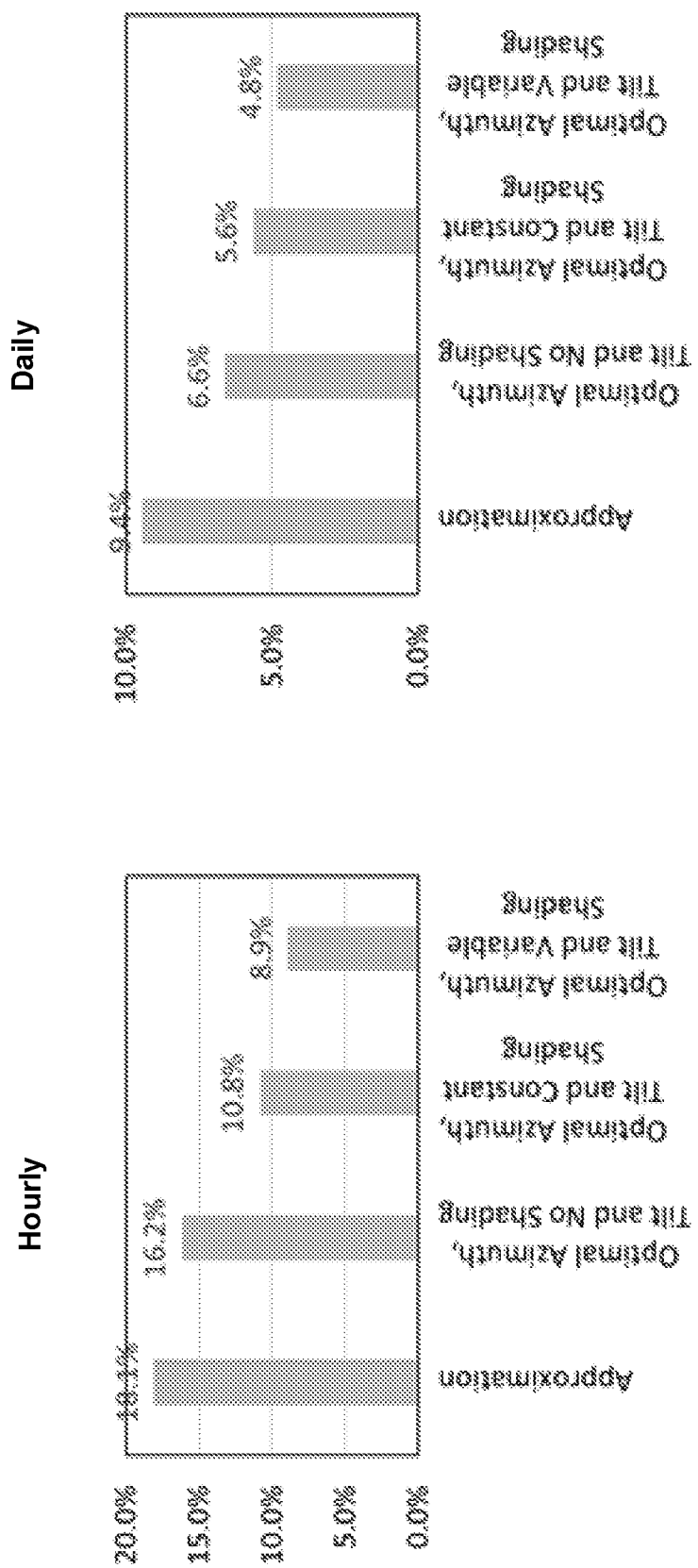
FIG. 28 is a pair of graphs respectively showing, by way of examples, summaries of the hourly and daily rMAEs.

A total of 122 unique simulations were required. The results for four scenarios will be compared, which are defined in Table 8. FIG. 27 is a set of graphs showing, by way of examples, hourly photovoltaic simulation production versus measured photovoltaic production for the entire year for the four scenarios. The x-axes represent measured production (in kilowatts) and the y-axes represent simulated production (in kilowatts). In each graph, all of the points would lie on the diagonal line if the simulated and measured values were identical. FIG. 28 is a pair of graphs respectively showing, by way of examples, summaries of the hourly and daily rMAEs for the four scenarios. The x-axes indicate the applicable scenario and the y-axes represent percentage of rMAE.

FIG. 29 is a set of graphs showing, by way of examples, hourly photovoltaic simulation production versus measured photovoltaic production for the entire year for a sample day, Oct. 9, 2015, for the four scenarios. The x-axes represent time of day and the y-axes represent photovoltaic production (in kilowatts). Note that a lower hourly rMAE may have been obtained by relaxing the constraint that annual energy is constant. The tradeoff, however, would have been that daily rMAE would have increased. FIG. 30 is a graph showing, by way of example, daily results for the scenario based on optimal photovoltaic system configuration specifications, that is, optimal azimuth, tilt, and detailed obstructions. The x-axis represents day of year and the y-axis represents photovoltaic production (in kilowatts).

These figures demonstrate that seemingly minor details matter, including any obstruction information (even constant horizon obstructions), can substantially improve results. Including detailed obstructions cuts the error in half versus an obstruction approximation-based approach and holds true on both hourly and daily bases.

TABLE 8

|  | Azimuth | Tilt | Obstruction Elevation |
|---|---|---|---|
| Approximation | 180° | 30° | None |
| Optimal Azimuth, Tilt and No Obstructions | 166° | 23° | None |
| Optimal Azimuth, Tilt and Constant Obstructions | 166° | 23° | Average 21° |
| Optimal Azimuth, Tilt and Detailed Obstructions | 166° | 23° | See FIG. 26. |
| Measured (See Next Section) | 167° | 22° |  |

Constant Horizon

FIG. 31 is a graph showing, by way of example, the effect of changing the constant horizon on annual energy production (relative to a system with no obstructions) for a horizontal system. The x-axis represents day of year and the y-axis represents photovoltaic production (in kilowatt hours per day). The change was applied to a residential photovoltaic system in Napa, Calif., and used one year of hourly data from Oct. 5, 2015 to Oct. 4, 2016. The plot shows that there is a linear relationship between the annual energy production and the square of the cosine of the constant horizon up to about 23°, that is, 0.85 on the x-axis. This finding tends to confirm the relationship specified in Equation (80). Constant horizons greater than 23° affect both direct and diffuse shading as expected. FIG. 31 suggests that about 40 percent of the energy comes from diffuse irradiance. The figure also shows a linear relationship for the square of the cosine of the constant horizon greater 23°. A constant horizon greater than 23° will impact both direct and diffuse irradiance.

Validation

Azimuth and tilt angles of the residential photovoltaic system in Napa, Calif. were validated using measured data, physical measurements, and data retrieved from the Google Compass service offered by the Barcelona Field Studies Centre S.L., Barcelona, Spain. Google Compass automatically adjust for differences between magnetic and true north and the data verified that the azimuth angle was 167°. Physical measurements verified that the roof had a 68" rise over 172" run, which translates to a tilt angle of 22° since the tilt angle equals the inverse tangent of the rise over the run. The simulated results differ by only one degree compared to the measured results as presented in Table 8.

In a further embodiment, the search strategy can be expanded to consider irradiation data obtained from adjacent geographic data "tiles." The SolarAnywhere service, cited supra, returns irradiation data for a bounded geographic region within which the location of the photovoltaic system for which production is being simulated lies. The irradiation data is selected from the geographic data tile within which the photovoltaic system's location lies; the SolarAnywhere service returns geographic data tiles that cover a ten square kilometer area. However, the irradiation data can also be retrieved from adjacent geographic data tiles to optimize simulation results, such as by reducing error. Simulations can be run using the irradiation data retrieved from adjacent geographic data tiles, for instance, the four tiles adjacent to the north, west, east, and south faces of the tile within which the geographic location of the photovoltaic system lies, and then selecting the best value (lowest rMAE) of photovoltaic system configuration specifications from the five results. FIG. 32 is a pair of graphs respectively showing, by way of examples, optimal photovoltaic system configuration specifications based on simulations using data for different geographic tiles. The x-axes represent measured production (in kilowatts) and the y-axes represent simulated production (in kilowatts). The graph on the left is based on irradiation data corresponding to the photovoltaic plant's geographic location. The graph on the right is based on irradiation data using a best neighbor out of the four adjacent geographic tiles selection criteria. The neighboring tile that was considered the "best" was the tile from which the simulation production results matched the measured production results with the lowest error using the optimal photovoltaic system configuration specifications. Other selection criteria, either in addition to or in lieu of best neighbor (resulting in lowest error) could be used, including applying temporal conditions, such as which tile to select based upon temporal, time of year, or irradiation-related conditions.

Power Output Simulation

Photovoltaic power prediction models are typically used in forecasting power generation, but prediction models can also be used to simulate power output for hypothetical photovoltaic system configurations. The simulation results can then be evaluated against actual historical measured photovoltaic production data and statistically analyzed to identify the inferred (and most probable) photovoltaic system configuration specification. FIG. 33 is a flow diagram showing a routine 200 for simulating power output of a photovoltaic power generation system 25 for use in the method 180 of FIG. 19. Power output is simulated for a wide range of hypothetical photovoltaic system configurations, which are defined to exercise the different types of photovoltaic system configurations possible. Each of the hypothetical configurations may vary based on power rating and electrical characteristics, including the effect of the efficiency of the solar modules, wiring, inverter, and related factors, and by their operational features, such as size and number of photovoltaic arrays, the use of fixed or tracking arrays, whether the arrays are tilted at different angles of elevation or are oriented along differing azimuthal angles, and the degree to which each system is covered by shade on a row-to-row basis or due to cloud cover or other physical obstructions. Still other configuration details are possible.

Initially, historical measured irradiance data for the current time period is obtained (step 201), such as described supra beginning with reference to FIG. 3. Preferably, the irradiance data includes is obtained from a solar resource data set that contains both historical and forecasted data, which allows further comparative analysis. Each of the hypothetical photovoltaic system configurations are evaluated (steps 202-206), as follows. Optionally, the measured irradiance data is screened (step 203) to eliminate data where observations are invalid either due to data recording issues or photovoltaic system performance issues power output. The production data, that is, measured power output, is correspondingly updated (step 204). Finally, power output is simulated based on the current system configuration and the measured irradiance data for the current time period (step 205), such as described supra beginning with reference to Equation (12). In one embodiment, a normalized 1 kW-AC photovoltaic system is simulated, which facilitates proportionately scaling the simulated power output based on the ratio (or function) of measured-to-simulated energy. A different approach may be required for photovoltaic simulation models that do not scale linearly (or near-linearly) with system rating. For instance, a non-linear (or non-near-linear) simulation model may need to be run multiple times until the system rating for the particular system configuration results in the same annual energy production as the measured data over the same time period. Still other approaches to scaling non-linear (or non-near-linear) simulation model results to actual measured energy output are possible. Each system configuration is similarly evaluated (step 206), after which power production simulation for the current time period is complete.

Example of Inferred Photovoltaic Plant Configuration Specifications

The derivation of a simulated photovoltaic system configuration can be illustrated with a simple example. FIG. 34 is a table showing, by way of example, simulated half-hour photovoltaic energy production for a 1 kW-AC photovoltaic system. Each column represents a different hypothetical photovoltaic system configuration. For instance, the first column represents a horizontal photovoltaic plant with a fixed array of solar panels set at a 180 degree azimuth with zero tilt. Each row represents the power produced at each half-hour period for a 1 kW-AC photovoltaic system, beginning on Jan. 1, 2012 (night time half-hour periods, when solar power production is zero, are omitted for clarity). The simulated energy production data covers the time period from Jan. 1, 2012 through Dec. 31, 2012, although only the first few hours of Jan. 1, 2012 are presented in FIG. 34. The latitude and longitude of the photovoltaic system were obtained and the Solar Anywhere service, cited supra, was used to obtain both historical and forecasted solar data and to simulate photovoltaic power output generation.

The simulated energy production can be compared to actual historical data. Here, in 2012, the photovoltaic plant produced 12,901,000 kWh in total measured energy, while the hypothetical photovoltaic system configuration represented in the first column had a simulated output of 1,960 kWh over the same time period (for a 1 kW-AC photovoltaic system). Assuming that a linearly-scalable (or near-linearly scalable) photovoltaic simulation model was used, the simulated output of 1,960 kWh implies that this particular system configuration would need a rating of 6,582 kW-AC to produce the same amount of energy, that is, 12,901,000 kWh, as the actual system. Thus, each half hour value can be multiplied by 6,582 to match simulated to actual power output.

The results can be visually presented. FIG. 35 are graphs depicting, by way of example, simulated versus measured power output for hypothetical photovoltaic system configuration specifications evaluated using the method 180 of FIG. 19. Each of the graphs corresponds to photovoltaic power as produced under a different hypothetical photovoltaic system configuration, as shown in the columns of the table of FIG. 34. The x-axis of each graph represents measured power output in megawatts (MW). The y-axis of each graph represents simulated power output in megawatts (MW). Within each graph, the points present the half-hour simulated versus measured photovoltaic power data. Visually, the simulated versus measured power output data for the fixed system configuration with a 180 degree azimuth angle and 15 degree tilt shows the closest correlation.

Figure 36:
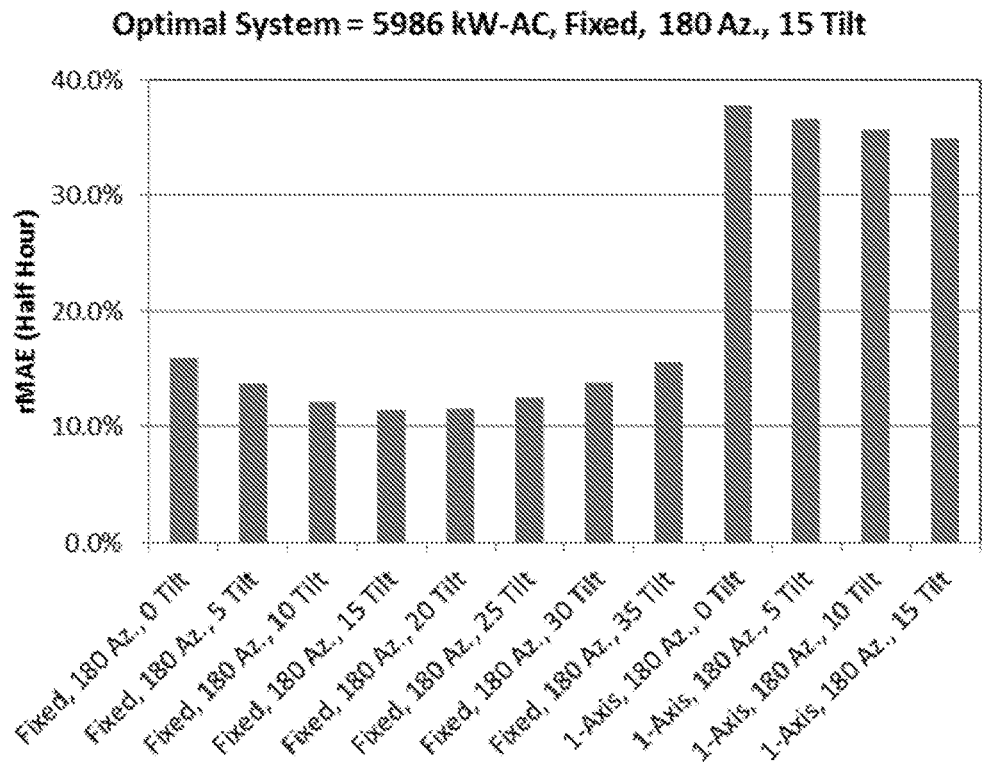
FIG. 36 is a graph depicting, by way of example, the relative mean absolute error between the measured and simulated power output for all system configurations as shown in FIG. 35.

Similarly, FIG. 36 is a graph depicting, by way of example, the rMAE between the measured and simulated power output for all system configurations as shown in FIG. 35. The x-axis represents the percentage of rMAE for half-hour intervals. The y-axis represents the different hypothetical photovoltaic system configurations. Again, the fixed system configuration with a 180 degree azimuth angle and 15 degree tilt reflects the lowest rMAE and accordingly provides an optimal system configuration.

Optimizing Photovoltaic System Configuration Specifications

Truly perfect weather data does not exist, as there will always be inaccuracies in weather data, whether the result of calibration or other errors or incorrect model translation. In addition, photovoltaic plant performance is ultimately unpredictable due to unforeseeable events and customer maintenance needs. For example, a power inverter outage is an unpredictable photovoltaic performance event, while photovoltaic panel washing after a long period of soiling is an example of an unpredictable customer maintenance event.

In a further embodiment, the power calibration model can be tuned to improve forecasts of power output of the photovoltaic plant based on the inferred (and optimal) photovoltaic plant configuration specification, such as described in commonly-assigned U.S. Pat. No. 10,409,925, issued Sep. 10, 2019, cited supra. Tuning helps to account for subtleties not incorporated into the selected photovoltaic simulation model, including any non-linear (or non-near-linear) issues in the power model. FIG. 37 are graphs depicting, by way of example, simulated versus measured power output for the optimal photovoltaic system configuration specifications as shown in FIG. 35. The graphs corresponds to photovoltaic power as produced under the optimal photovoltaic system configuration, that is, a fixed system configuration with a 180 degree azimuth angle and 15 degree tilt before (left graph) and after (right graph) tuning. The x-axis of each graph represents measured power output in megawatts (MW). The y-axis of each graph represents simulated power output in megawatts (MW).

Referring first to the "before" graph, the simulated power production data over-predicts power output during lower measured power conditions and under-predicts power output during high measured power conditions. Referring next to the "after" graph, tuning removes the uncertainty primarily due to irradiance data error and power conversion inaccuracies. As a result, the rMAE (not shown) is reduced from 11.4 percent to 9.1 percent while also eliminating much of the remaining bias.

While the invention has been particularly shown and described as referenced to the embodiments thereof, those skilled in the art will understand that the foregoing and other changes in form and detail may be made therein without departing from the spirit and scope.

What is claimed is:

1. A system for photovoltaic system configuration specification inference with the aid of a digital computer, comprising the steps of:
   a computer comprising a processor and configured to:
     obtain measured photovoltaic production for a photovoltaic system operating at a known geographic location over a set time period;
     obtain a preexisting configuration for the photovoltaic system;
     search for optimal values for a plurality of variables in a configuration specification for the photovoltaic system, comprising:
       determine the optimal values comprising initial optimal values for the variables comprising an azimuth angle, constant horizon obstruction elevation angle, and tilt angle based on the measured photovoltaic production;
       determine the optimal values comprising final optimal values for the azimuth angle, constant horizon obstruction elevation angle, and tilt angle by using the initial optimal values for the azimuth angle, constant horizon obstruction elevation angle, and tilt angle;
     modify the preexisting configuration used by a production output controller for the photovoltaic system with at least some of the optimal values for the variables in the configuration specification; and
   the production output controller configured to operate the photovoltaic system based on the modified preexisting configuration.

2. A system according to claim 1, the computer further configured to:
   determine one of the optimal values for the variable in the configuration specification that comprises an exact obstruction elevation angle.

3. A system according to claim 2, wherein the exact obstruction angle is determined over a range of azimuth bins, each of the bins comprising an azimuth range.

4. A system according to claim 3, wherein a number of steps used to determine the exact obstruction angle is dependent on sizes of the azimuth bins.

5. A system according to claim 1, the computer further configured to:
   perform a plurality of simulations of photovoltaic production by the system during the determination of at least some of the optimal values;
   analyze results of each of the simulations based on at least a portion of the measured photovoltaic production, wherein the optimal values for the at least some variables are selected based on the analysis.

6. A system according to claim 5, the computer further configured to:
   convert time units associated with the measured photovoltaic production to match time units associated with the simulations; and
   convert the results of the simulations from power production to energy production.

7. A system according to claim 5, the computer further configured to:
   identify a maximum measured production within the measured photovoltaic data, wherein the maximum measured production is excluded from the analysis.

8. A system according to claim 5, the computer further configured to:
   identify data associated with possible inverter-limited hours in the results of the simulations and the measured photovoltaic production, wherein the data associated with possible inverter-limited hours is excluded from the analysis.

9. A system according to claim 5, wherein the simulated photovoltaic production in each of the simulations matches the measured photovoltaic production on a total energy basis.

10. A system according to claim 9, wherein the simulated photovoltaic production in each of the simulations is represented as a time series and each value in the time series is multiplied by a constant to make the simulated photovoltaic production match the measured photovoltaic production on the total energy basis.

11. A method for photovoltaic system configuration specification inference with the aid of a digital computer, comprising the steps of:
   obtaining by a computer comprising a processor measured photovoltaic production for a photovoltaic system operating at a known geographic location over a set time period;
   obtaining by the computer a preexisting configuration for the photovoltaic system;
   searching by the computer for optimal values for a plurality of variables in a configuration specification for the photovoltaic system, comprising:
     determining the optimal values comprising initial optimal values for the variables comprising an azimuth angle, constant horizon obstruction elevation angle, and tilt angle based on the measured photovoltaic production;
     determining the optimal values comprising final optimal values for the azimuth angle, constant horizon obstruction elevation angle, and tilt angle by using the initial optimal values for the azimuth angle, constant horizon obstruction elevation angle, and tilt angle;
   modifying by the computer the preexisting configuration used by a production output controller for the photovoltaic system with at least some of the optimal values for the variables in the configuration specification; and
   operating via the production output controller the photovoltaic system based on the modified preexisting configuration.

12. A method according to claim 11, further comprising:
   determining one of the optimal values for the variable in the configuration specification that comprises an exact obstruction elevation angle.

13. A method according to claim 12, wherein the exact obstruction angle is determined over a range of azimuth bins, each of the bins comprising an azimuth range.

14. A method according to claim 13, wherein a number of steps used to determine the exact obstruction angle is dependent on sizes of the azimuth bins.

15. A method according to claim 11, further comprising:
performing a plurality of simulations of photovoltaic production by the system during the determination of at least some of the optimal values;
analyzing results of each of the simulations based on at least a portion of the measured photovoltaic production,
wherein the optimal values for the at least some variables are selected based on the analysis.

16. A method according to claim 15, further comprising:
converting time units associated with the measured photovoltaic production to match time units associated with the simulations; and
converting the results of the simulations from power production to energy production.

17. A method according to claim 15, further comprising:
identifying a maximum measured production within the measured photovoltaic data, wherein the maximum measured production is excluded from the analysis.

18. A method according to claim 15, further comprising:
identifying data associated with possible inverter-limited hours in the results of the simulations and the measured photovoltaic production, wherein the data associated with possible inverter-limited hours is excluded from the analysis.

19. A method according to claim 15, wherein the simulated photovoltaic production in each of the simulations matches the measured photovoltaic production on a total energy basis.

20. A method according to claim 19, wherein the simulated photovoltaic production in each of the simulations is represented as a time series and each value in the time series is multiplied by a constant to make the simulated photovoltaic production match the measured photovoltaic production on the total energy basis.

* * * * *